US012720897B2

(12) United States Patent
Ho et al.

(10) Patent No.: US 12,720,897 B2
(45) Date of Patent: Aug. 25, 2026

(54) GUARD RING WITH DEEP TRENCH ISOLATION STRUCTURE

(71) Applicant: Taiwan Semiconductor Manufacturing Company, Ltd., Hsinchu (TW)

(72) Inventors: Cheng Ying Ho, Minxiong Township (TW); Wen-De Wang, Minsyong Township (TW); Kai-Chun Hsu, Yonghe City (TW); Yuh Ruey Huang, Hsinchu County (TW); Chih-Lung Cheng, Tainan City (TW); Jen-Cheng Liu, Hsin-Chu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 440 days.

(21) Appl. No.: 18/341,225

(22) Filed: Jun. 26, 2023

(65) Prior Publication Data

US 2024/0429258 A1 Dec. 26, 2024

(51) Int. Cl.
*H10F 39/00* (2025.01)

(52) U.S. Cl.
CPC ......... *H10F 39/807* (2025.01); *H10F 39/011* (2025.01)

(58) Field of Classification Search
CPC .... H10F 39/807; H10F 39/011; H10F 39/811; H10F 39/809
See application file for complete search history.

(56) References Cited

U.S. PATENT DOCUMENTS

| | | | | |
|---|---|---|---|---|
| 7,505,206 | B2 | 3/2009 | Deng et al. | |
| 9,437,645 | B1 | 9/2016 | Chou et al. | |
| 2020/0135789 | A1* | 4/2020 | Cheng | H10F 39/809 |
| 2021/0035926 | A1 | 2/2021 | Liu et al. | |
| 2021/0098392 | A1* | 4/2021 | Wu | H10F 39/024 |
| 2021/0305440 | A1* | 9/2021 | Zang | H10F 39/8067 |
| 2022/0173140 | A1 | 6/2022 | Chou et al. | |
| 2022/0208808 | A1* | 6/2022 | Kwag | H10F 39/807 |
| 2022/0415960 | A1* | 12/2022 | Furesawa | H10F 39/1935 |
| 2022/0416109 | A1* | 12/2022 | Jung | H10F 77/959 |
| 2023/0215964 | A1* | 7/2023 | Lee | H10F 39/103 257/431 |
| 2024/0096921 | A1* | 3/2024 | Park | H10F 39/811 |
| 2024/0313030 | A1* | 9/2024 | Kawamura | H10F 39/12 |
| 2024/0387567 | A1* | 11/2024 | Ai | H10F 39/807 |

* cited by examiner

*Primary Examiner* — Fernando L Toledo
*Assistant Examiner* — Marshall Mu-Nuo Hatfield
(74) *Attorney, Agent, or Firm* — Eschweiler & Potashnik, LLC

(57) ABSTRACT

A process used to form a first deep trench isolation (DTI) structure in a pixel region of a semiconductor substrate is also used to form a second DTI structure in a guard ring area that isolates the pixel region from a peripheral region. The guard ring area may have a PNP guard ring structure. The second DTI structure may include trenches in each of an inner ring, a middle, and an outer ring of the PNP guard ring structure. The first and second DTI structures may have conductive cores. The conductive cores of the inner and outer ring may be biased to a first voltage while the conductive cores of the middle ring may be biased to an opposite polarity second voltage. When the second DTI structure have conductive cores with these biases, the second DTI structure may be used as the guard ring without the PNP structure.

20 Claims, 48 Drawing Sheets

100C
102
106
183
185
187
189
191
193
105
125
123
121
112
119
120
118
110
116
131
133
111
114
104
178
108
114A
114B
114C
102b
102a
175

100G
102
106
183
185
187
189
191
193
105
125
123
121
111
104
133
131
116
110
118
120
112
119
135
137
178
175
102a
102b 2400
2403
110
131
133
114
104
178
2401
112
105
2405
2303
135
133
108
112
137
131
135
133
193
102b
102a
175
191
102
106
183
185
187
189

2500
116
110
131
133
114
104
178
105
112
119
141
135
133
108
114A
112
114A
137
114B
131
135
133
193
102b
102a
175
191
102
106
183
185
187
189

GUARD RING WITH DEEP TRENCH ISOLATION STRUCTURE

BACKGROUND

Integrated circuits (ICs) comprising image sensors are used in a wide range of modern-day electronic devices such as cameras and cell phones. In recent years, complementary metal-oxide semiconductor (CMOS) image sensors have begun to see widespread use, largely replacing charge-coupled device (CCD) image sensors. Compared to CCD image sensors, CMOS image sensors are increasingly favored due to low power consumption, small size, fast data processing, direct output of data, and low manufacturing cost. Types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
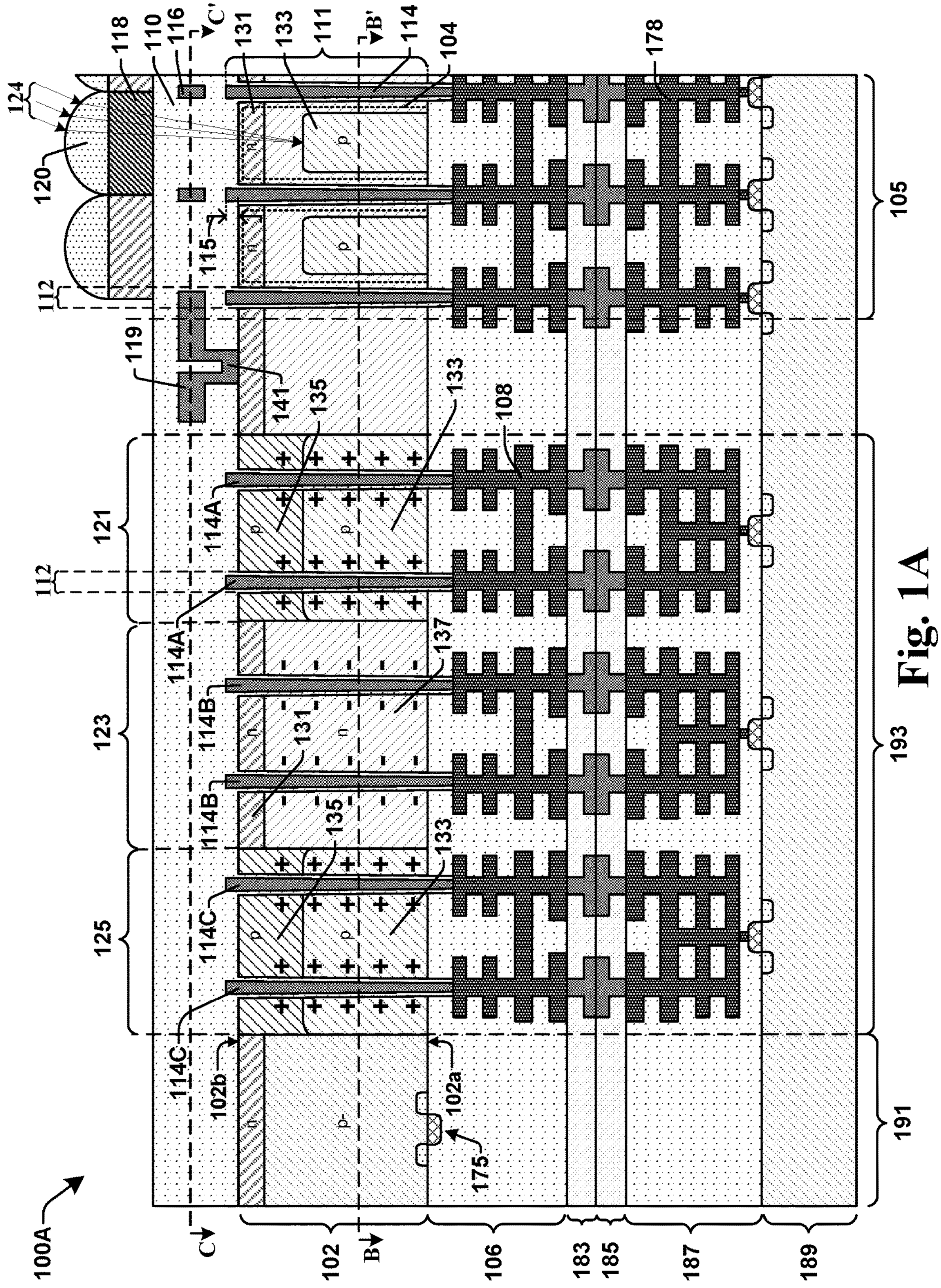
FIG. 1A illustrates a cross-sectional side view of an image sensing integrated circuit (IC) device according to some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many electronic devices (e.g., cameras, cellular telephones, computers, etc.) include image sensing IC devices having arrays of light sensing elements configured to capture images. The light sensing elements produce electron-hole pairs when exposed to light. An electric field produced by a diode or the like separates the charges so that the charges may be accumulated and detected. Isolation structures, such as deep trench isolation structures, laterally surround the light sensing elements so as to separate signals from distinct light sensing elements. The isolation structures comprise an insulating material disposed within a trench that is defined by sidewalls of the semiconductor substrate.

During fabrication of the isolation structures, the semiconductor substrate may be etched to form the trench. The trench is subsequently lined or filled with one or more dielectric materials. The etching processes used to form the trench can damage the semiconductor substrate, resulting in defects (e.g., dangling bonds, etc.) along interior surfaces (sidewalls) of the semiconductor substrate that define the trench. The defects may trap charge carriers (e.g., electrons) and cause an unwanted leakage current to flow between adjacent pixel regions, leading to dark current and/or white pixel issues within the image sensing IC.

Such defects may be passivated by forming a high-k dielectric material along the sidewalls of the semiconductor substrate that define the trench. For example, the high-k dielectric material may form an electric field that accumulates holes along the sidewalls and thereby passivates the charge carriers (e.g., electrons). In some cases, the electric field provided by such high-k dielectric materials may not be strong enough to achieve a sufficient hole density to effectively passivate the charge carriers trapped in the defects. For these cases, the deep trench isolation structures may be provided with a conductive core that is separated from the semiconductor substrate by the dielectric material that lines the trenches. The conductive core may be electrically coupled to a biasing source configured to apply a bias voltage to the conductive core. By applying a bias voltage to the conductive core, the conductive core is able to generate an electric field that accumulates holes along sidewalls of the substrate defining the trench. The holes passivate defects within the sidewalls of the substrate, thereby improving performance of the image sensing IC.

Forming the light sensing elements may comprises a plurality of dopant implantations that form PN diodes within the semiconductor substrate. These dopant implantations may include an implantation process that forms a deep N-well. The deep N-well may extend into the substrate to a depth of about three μm, a depth of about five μm, or an even greater depth. The depth may be such that the deep N-well extends to a back side of the semiconductor substrate after the semiconductor substrate has been thinned. Forming this deep N-well with a sufficient dopant concentration at a sufficient depth may involve exposing the substrate to a high dosage of high energy ions. The energy and dosage of the implant may be such that masking of the implant is impractical. Therefore, in some cases the deep N-well is formed by a blanket implant so that the deep N-well extends across the entire semiconductor substrate.

It has been found that the deep N-well that is formed by the blanket implant can cause leakage in a PNP guard ring structure of the same device. A PNP guard ring structure is a type of guard ring that may be used to maintain electrical isolation between different regions of the semiconductor substrate. For example, a guard ring structure may be formed in a guard ring area disposed between a pixel region and a peripheral region to provide isolation between devices in these respective areas. The pixel region may contain an array of light sensing elements. The peripheral region may contain other components such as transistors, capacitors, diodes, the like, or other semiconductor devices that provide I/O, logic, power regulation, or other such functions. The guard ring structure may comprise an inner ring with P-type doping, a middle ring with N-type doping, and an outer ring with P-type doping. The deep N-well may interfere with the P-type doping of the inner and outer rings and provide a leakage path.

In accordance with some aspects of the present disclosure, a process used to form a first deep trench isolation (DTI) structure that provides isolation between adjacent light sensing elements in a pixel region of a semiconductor substrate is also applied in a guard ring area so that a second DTI structure is formed in the guard ring area. In some embodiments, the trenches of the second DTI structure loop around the pixel region. In some embodiments, the trenches of the second DTI structure include one or more trenches in an inner ring, one or more trenches in a middle ring, and one or more trenches in an outer ring. In some embodiments, the first and second DTI structures are of the type that provide partial isolation. In some embodiments, the first and second DTI structures are of the type that provide full isolation. In either case, the second DTI structure may enhance the guard ring functionality and prevent leakage currents and is especially useful when the light sensing elements include a deep N-well of the type formed with a high energy blanket implant. The present disclosure provides examples with back side deep trench isolation (BDTI) structures, but it will be appreciated that front side deep trench isolation (FDTI) structures may be used in the alternative so as to provide additional embodiments.

In some embodiments, the first and second DTI structures contain conductive cores. In some embodiments, the conductive cores of the second DTI structures are coupled to metal interconnects on the front side. In some embodiments, the conductive cores of the inner and outer ring are coupled to a distinct voltage source from the conductive cores in the middle ring. In some embodiments, the conductive cores in the middle ring are held at a voltage having a first polarity while the conductive cores in the inner and outer ring are held at a voltage of an opposite polarity. When the second DTI structure has conductive cores that are biased in this way, the second BDTI structures may provide sufficient isolation so as to make other guard ring structures such as a PNP structure redundant.

FIG. 1A illustrates a cross-sectional view of an image sensing integrated circuit device (image sensing IC) 100A according to some embodiments. The image sensing IC 100A includes a semiconductor substrate 102 having a front side 102*a* and a back side 102*b* opposing the front side 102*a*, a pixel region 105, a peripheral region 191, and a guard ring area 193 that is between the peripheral region 191 and the pixel region 105. Light sensing elements 104 are disposed within the pixel region 105. The light sensing elements 104 are configured to generate electric signals in response to incident radiation 124.

The semiconductor substrate 102 comprises sidewalls that form trenches 112 extending from the back side 102*b* of the semiconductor substrate 102 to within the semiconductor substrate 102. In some embodiments, the trenches 112 extend from the back side 102*b* of the semiconductor substrate 102 to the front side 102*a* of the semiconductor substrate 102. Some of the trenches 112 are in the pixel region 105 and provide isolation between adjacent light sensing elements 104. Some of the trenches 112 are in the guard ring area 193 and contribute to providing electrical isolation between the pixel region 105 and the peripheral region 191. In some embodiments, the trenches 112 in the guard ring area 193 extend around the pixel region 105. In some embodiments, the trenches 112 in the guard ring area 193 divide the semiconductor substrate 102 between the pixel region 105 and the peripheral region 191.

An inter-level dielectric (ILD) structure 106 is arranged on the front side 102*a* of the semiconductor substrate 102. In some embodiments, the ILD structure 106 comprises one or more layers of inter-level dielectric (ILD). The ILD structure 106 surrounds interconnects 108. The interconnects 108 may comprise conductive contacts, middle-end-of-the-line (MEOL) interconnects, interconnect wires, and/or interconnect vias. The interconnect wires may be arranged in metallization layers.

A dielectric structure 110 is arranged on the back side 102*b* of the semiconductor substrate 102 and along the sidewalls of the semiconductor substrate 102 that define the trenches 112. In some embodiments, the dielectric structure 110 extends continuously from the back side 102*b* of the semiconductor substrate 102 to along the sidewalls of the semiconductor substrate 102 that define the trenches 112. In accordance with some embodiments, conductive cores 114 are arranged within the trenches 112 and are laterally separated from the semiconductor substrate 102 by the dielectric structure 110. The conductive cores 114 are electrically coupled to the interconnects 108. The conductive cores 114 may extend vertically past a top of the light sensing elements 104 that faces away from the ILD structure 106. In some embodiments, the conductive cores 114 extend vertically through a bottom of the dielectric structure 110 that is within the trenches 112. The dielectric structure 110 and the conductive cores 114 within the pixel region 105 form a first back side deep trench isolation (BDTI) structure 111 within the semiconductor substrate 102. The dielectric structure 110 and the conductive cores 114A, 114B, and 114C within the guard ring area 193 form a second BDTI structure.

A back side metal grid 116 may be disposed over the conductive core 114. The dielectric structure 110 laterally surrounds the back side metal grid 116. In some embodiments, the conductive core 114 vertically protrudes outward to a non-zero distance 115 past the back side 102*b* of the semiconductor substrate 102 and towards the back side metal grid 116. Having the conductive core 114 extend outward past the back side 102*b* of the semiconductor substrate 102 improves resolution between adjacent light sensing elements 104 by blocking incident radiation from moving laterally between the domains of adjacent light sensing elements 104 within a vertical span that is between the back side 102*b* of the semiconductor substrate 102 and the back side metal grid 116. In some embodiments, the non-zero distance 115 is in a range from about 500 Angstroms (Å) to about 5000 Å. In some embodiments, color filters 118 are disposed over the back side 102*b* of the semiconductor substrate 102. In some embodiments, micro-lenses 120 are arranged over the color filter 118. The micro-lenses 120 are configured to focus incident radiation 124 on the light sensing elements 104.

A first biasing source (not shown) is coupled to the conductive cores 114 in the pixel region 105 through the interconnects 108. The first biasing source may be in the second substrate 189, in the peripheral region 191, or elsewhere. The first biasing source may apply a bias voltage to the conductive cores 114. By applying a bias voltage to the conductive cores 114, the conductive cores 114 are able to generate an electric field that attracts holes towards the sidewalls of the semiconductor substrate 102 defining the trenches 112 within the pixel region 105. The holes accumulate along the sidewalls and passivate defects (e.g., traps) along the sidewalls of the semiconductor substrate 102 within the pixel region 105. Passivating the defects may improve isolation between adjacent light sensing elements 104, improve a modulation transfer function (MTF) for the light sensing elements 104, and/or improve a quantum efficiency of the light sensing elements 104.

The guard ring area 193 includes an inner ring 121, a middle ring 123, and an outer ring 125. The semiconductor substrate 102 has N-type doping within the middle ring 123. As a consequence, sidewalls of the semiconductor substrate 102 that define the trenches 112 in the middle ring 123 have N-type doping. In some embodiments, the N-type doping extends from the front side 102*a* to the back side 102*b*. The N-type doping may include a shallow N-well 137 and a deep N-well 131. The semiconductor substrate 102 has P-type doping within the inner ring 121 and within the outer ring 125. As a consequence, sidewalls of the semiconductor substrate 102 that define the trenches 112 in the inner ring 121 and the outer ring 125 have P-type doping. In some embodiments, the P-type doping extends from the front side 102*a* to the back side 102*b*. The P-type doping may include a shallow P-well 133 and a deep P-well 135.

One or more trenches 112 are disposed in each of the inner ring 121, the middle ring 123, and the outer ring 125. Conductive cores 114A are disposed in the trenches 112 of the inner ring 121. Conductive cores 114B are disposed in the trenches 112 of the middle ring 123. Conductive cores 114C are disposed in the trenches 112 of the outer ring 125. The conductive cores 114A and 114C of the inner ring 121 and the outer ring 125 extend past the front side 102*a* and into the ILD structure 106 where they contact interconnects 108 that couple the conductive cores 114A and 114C to a second biasing source (not shown). The conductive cores 114B of the middle ring 123 contact interconnects 108 that couple the conductive cores 114B to a third biasing source (not shown). The third biasing source provides a negative voltage. These positive and negative voltage biases enhance the isolation that the guard ring area 193 provides between the pixel region 105 and the peripheral region 191. The second and third biasing sources may be in the second substrate 189, in the peripheral region 191, or elsewhere. The second biasing source provides a positive voltage.

The light sensing elements 104 may comprise PN diodes formed in the semiconductor substrate 102. The PN diodes may include a shallow P-well 133 and a deep N-well 131. The shallow P-well 133 may be present in the inner ring 121 and the outer ring 125 in addition to being present in the pixel region 105. The deep N-well 131 may extend to the back side 102*b* and may be present in the peripheral region 191 and the middle ring 123 in addition to being present in the pixel region 105. The peripheral region 191 may include one or more transistors 175 or like semiconductor devices. These devices may be unaffected by the deep N-well 131.

The semiconductor substrate 102 maybe attached to a second substrate 189. A second ILD structure 187 containing second interconnects 178 may be formed above the second substrate 189. The semiconductor substrate 102 may be attached to the second substrate 189 through a first bonding layer 183 and a second bonding layer 185. The first bonding layer 183 and the second bonding layer 185 may form electrical connections between the interconnects 108 and the second interconnects 178.

The illustrations show interconnects 108 coupled to second interconnects 178, however, these are only examples. Not all interconnects 108 are shown and the interconnects 108 do not need to be coupled to the second interconnects 178. In some embodiments, the interconnects 108 that are coupled to conductive cores 114, 114A, 114B, and 114C connect with voltage sources in the peripheral region 191 and are not coupled to the second interconnects 178. In some embodiments, some of the interconnects 108 and the second interconnects 178 form connections between the image sensing elements 104 and associated transistors on the second substrate 105. In some embodiments, the second substrate 189 is a carrier substrate that does not include the second ILD structure 187.

Figure 1B:
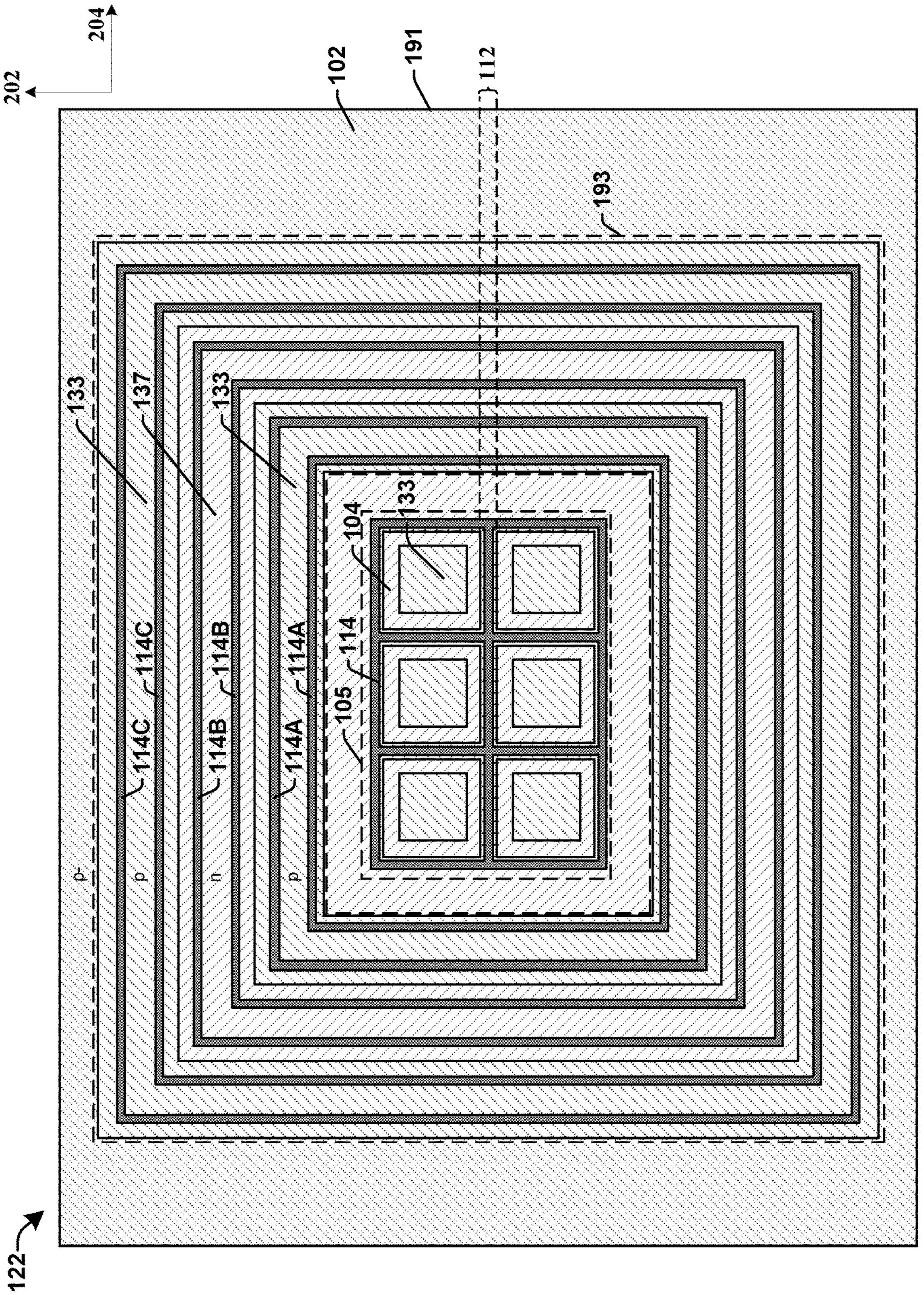
FIG. 1B illustrates a cut-away top view of an image sensing IC device according to some embodiments.

FIG. 1B illustrates a top view 122 of some embodiments of the image sensing IC 100A of FIG. 1A taken, e.g., along the cross-sectional line B-B' of FIG. 1A. As shown in the top view 122, the light sensing elements 104 may have rectangular shapes (e.g., square shapes, rounded square shapes, or the like). The trenches 112 in the pixel region 105 laterally surround the light sensing elements 104 in closed and unbroken paths (i.e., loops). The trenches 112 may be formed by sidewalls of the semiconductor substrate 102 that extend in a first direction 202 and in a second direction 204, which is perpendicular to the first direction 202. The dielectric structure 110 is arranged along opposing sidewalls of the trenches 112. The dielectric structure 110 separates the semiconductor substrate 102 from the conductive cores 114 within the trenches 112. In the pixel region 105, the dielectric structure 110 and the conductive cores 114 continuously wrap around the light sensing elements 104 in closed and unbroken paths (i.e., loops).

The trenches 112 in the guard ring area 193 wrap continuously around the pixel region 105 in closed and unbroken paths (i.e., loops). The conductive cores 114 in the pixel region 105 are united into a single grid structure. The conductive cores 114A, the conductive cores 114B, and the conductive cores 114C in the guard ring area 193 are each separate from the grid structure in the pixel region 105 and from each other.

Figure 1C:
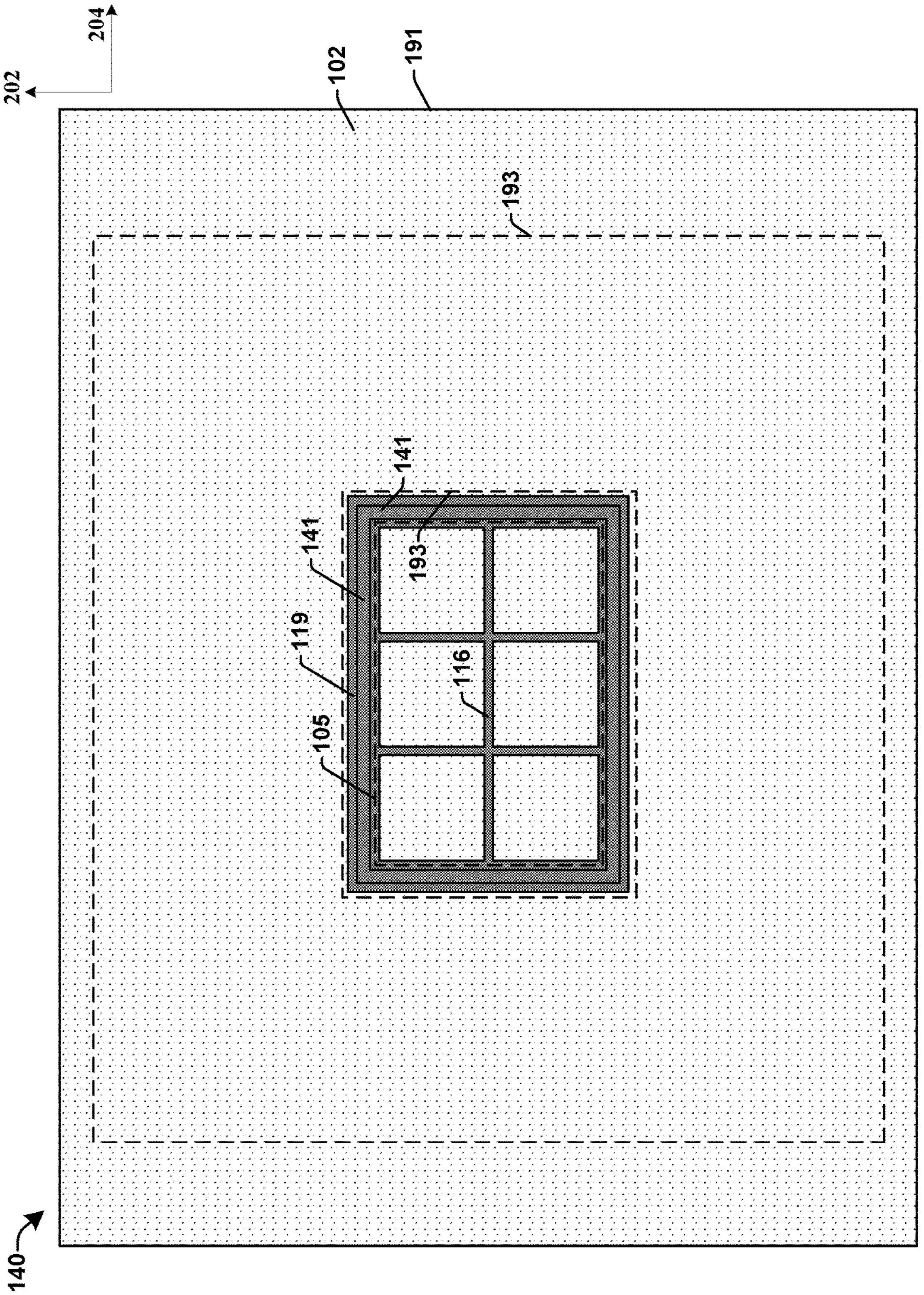
FIG. 1C illustrates a cut-away top view of an image sensing IC device according to some embodiments.

FIG. 1C illustrates a top view 140 of some embodiments of the image sensing IC 100A of FIG. 1A taken, e.g., along the cross-sectional line C-C' of FIG. 1A. As shown in the top view 140, the back side metal grid 116 includes a second grid structure. The second grid structure is directly over the first gird structure formed by the conductive cores 114 (see FIG. 1B). In addition, the back side metal grid 116 extends outside the pixel region 105. In some embodiments, a portion of the back side metal grid 116 forms a conductive shield 119 around the pixel region 105 (see FIG. 1A). The conductive shield 119 blocks incident radiation so as to prevent dark current due to the generation of unwanted charge carriers within the semiconductor substrate 102. A portion 141 of the back side metal grid 116, which may be part of the conductive shield 119, contacts the semiconductor substrate 102 so as to ground the back side metal grid 116.

Figure 2:
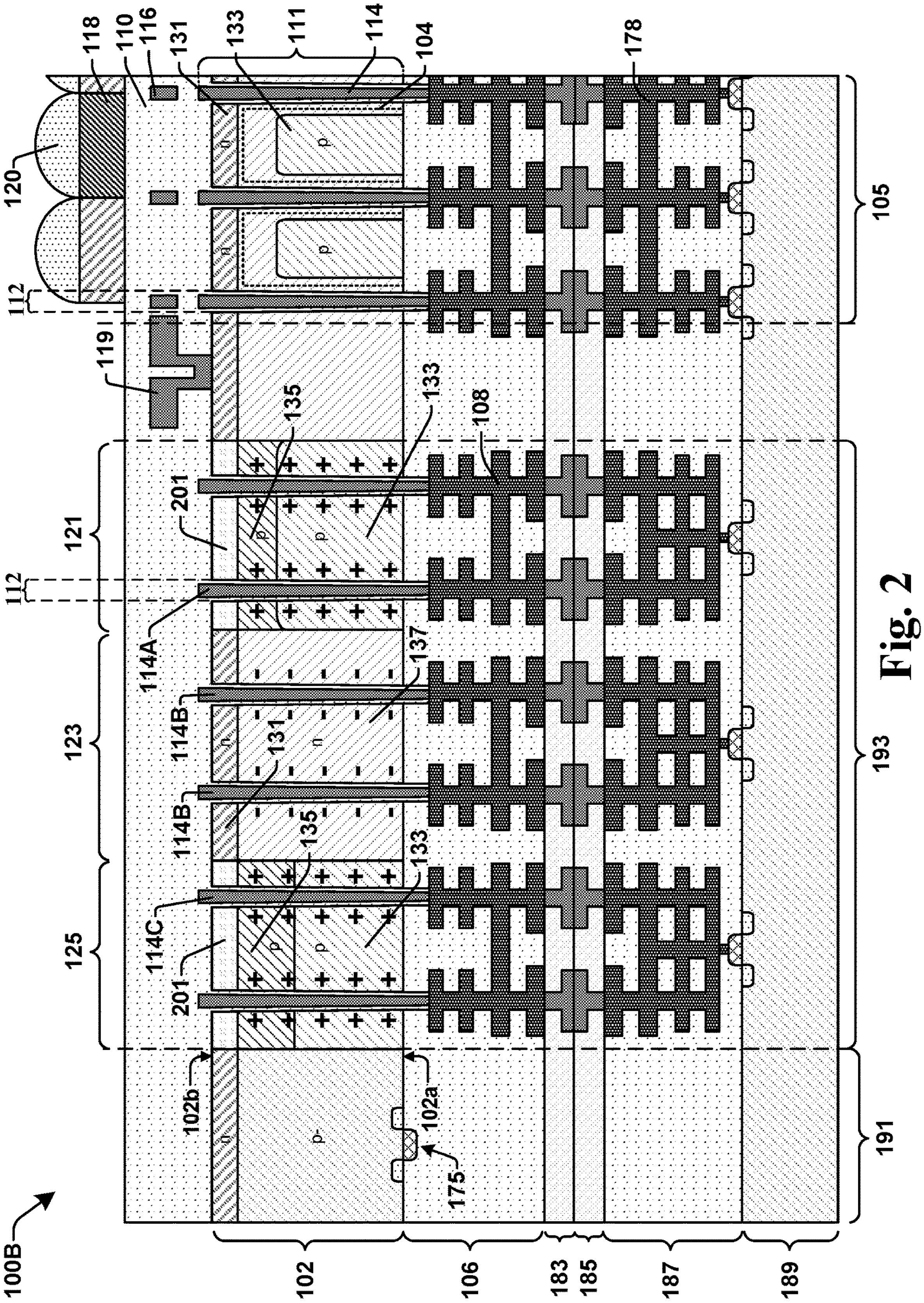
FIGS. 2-8 illustrate cross-sectional side views of image sensing IC devices according to various embodiments.

FIG. 2 illustrates a cross-sectional view of an image sensing IC 100B according to some other embodiments. The image sensing IC 100B is like the image sensing IC 100A except that the image sensing IC 100B has areas 201 in the semiconductor substrate 102 within the inner ring 121 and within the outer ring 125. The areas 201 may correspond in depth to the deep N-wells 131. In some embodiments, the areas 201 have light P-type doping. In some embodiments, the areas 201 have N-type doping. Accordingly, in some embodiments the P-type of the inner ring 121 and the outer ring 125 does not extend all the way to the back side 102*b*. The areas 201 could provide leakage paths through the guard ring area 193 where it not for the isolation provided by the second BDTI structure that includes the trenches 112, the dielectric structure 110 and the conductive cores 114A, 114B, and 114C within the guard ring area 193.

Figure 3:
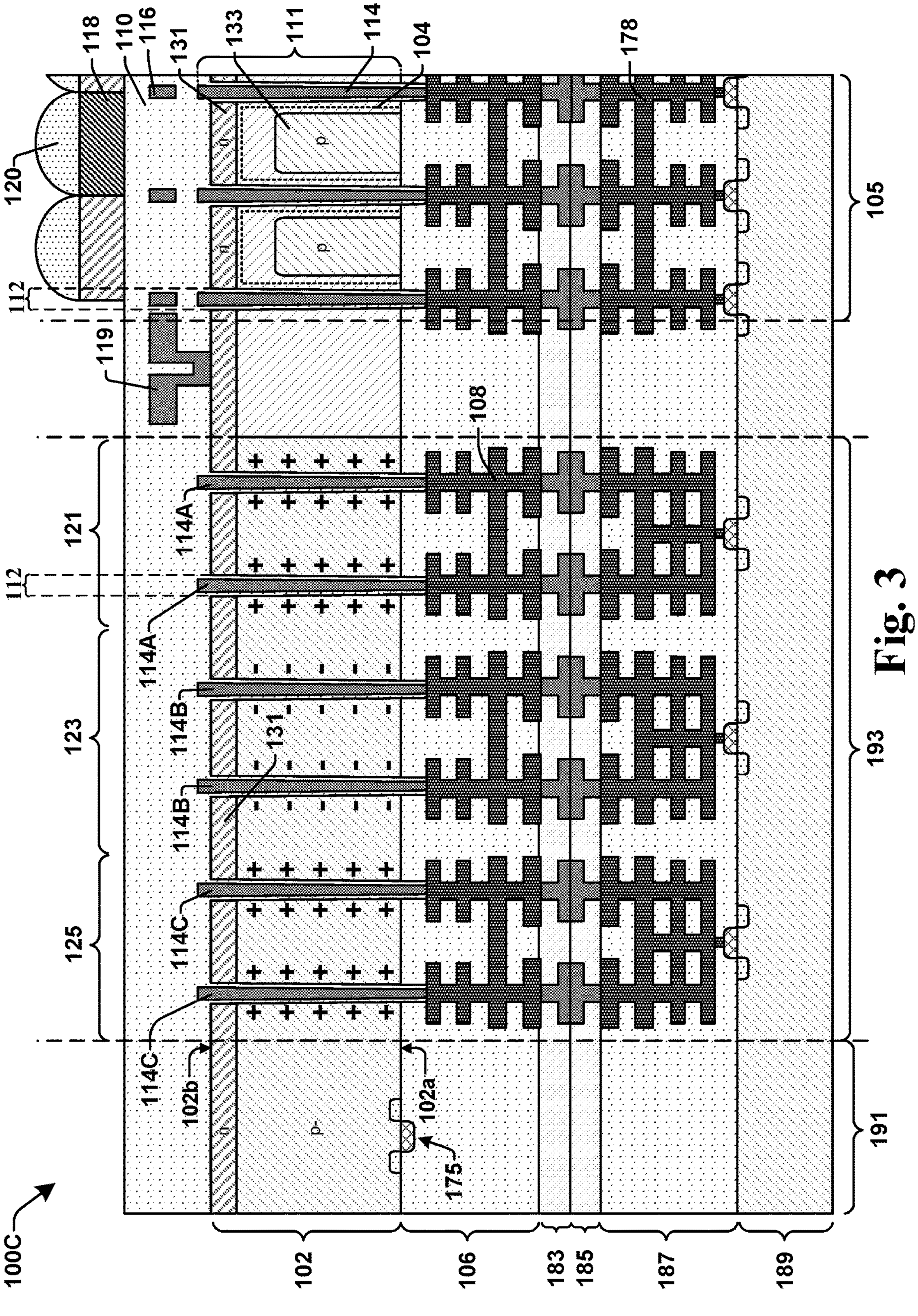

FIG. 3 illustrates a cross-sectional view of an image sensing IC 100C according to some other embodiments. The image sensing IC 100C is like the image sensing IC 100A except that the image sensing IC 100C does not have a PNP guard ring structure (compare FIG. 1A). In particular, the shallow P-wells 133 and the deep P-wells 135 may be absent from the inner ring 121 and the outer ring 125 while the shallow N-well 137 is absent from the middle ring 123. The second BDTI structure that includes the trenches 112, the dielectric structure 110 and the conductive cores 114A, 114B, and 114C within the guard ring area 193 is sufficient to provide guard ring functionality, particularly when the conductive cores 114A and 114C are biased to a first polarity and the conductive cores 114B are biased to an opposite polarity.

Figure 4:
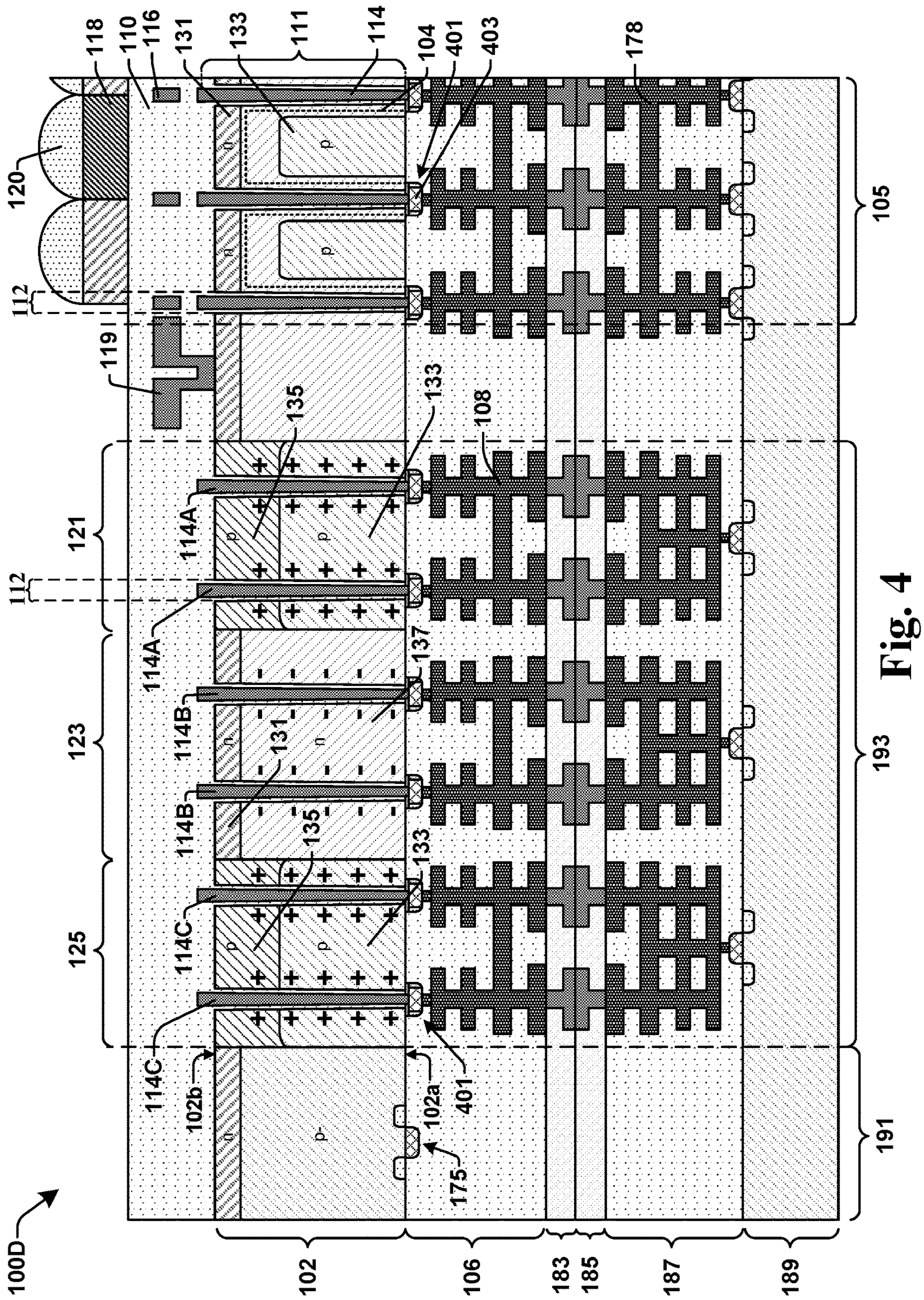

FIG. 4 illustrates a cross-sectional view of an image sensing IC 100D according to some other embodiments. The image sensing IC 100D is like the image sensing IC 100A except that in the image sensing IC 100D the conductive cores 114 (and the conductive cores 114A, the conductive cores 114B, and the conductive cores 114C) do not directly contact the interconnects 108. Instead, the conductive cores 114 land on gate electrodes 403 of gate structures 401 disposed on the front side 102*a*. The conductive cores 114 are coupled to the interconnects 108 through the gate electrodes 403. Having the conductive cores 114 land on the gate electrodes 403 reduces the aspect ratio of the trenches 112. Lowering the aspect ratio makes the trenches 112 easier to form and reduces phenomena such as pinch off of the dielectric structure 110 near the back side 102*b* that can interfere with formation of the conductive cores 114. In some embodiments, the gate structures 401 have the same composition as gate structures in transistors (not shown) in the pixel region 105. In some embodiments, those transistors include transfer gates associated with the light sensing elements 104.

Figure 5:
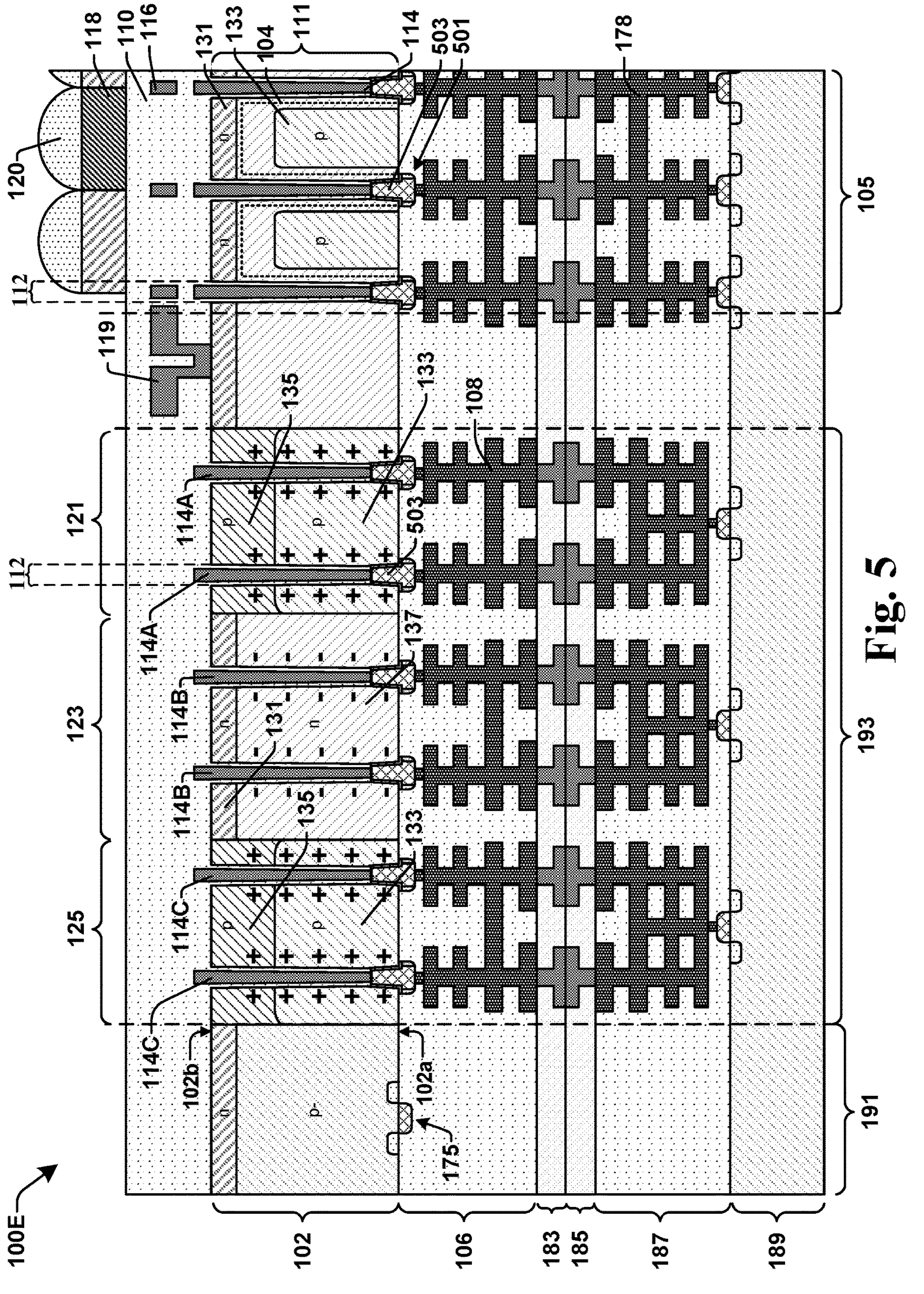

FIG. 5 illustrates a cross-sectional view of an image sensing IC 100E according to some other embodiments. The image sensing IC 100E is like the image sensing IC 100D of FIG. 4 except that in the image sensing IC 100E the conductive cores 114 (and the conductive cores 114A, the conductive cores 114B, and the conductive cores 114C) land on gate electrodes 503 of gate structures 501. The gate electrodes 503 extend into the semiconductor substrate 102 through the front side 102*a* so as to meet the conductive cores 114 within the semiconductor substrate 102. Having the conductive cores 114 land on the gate electrodes 503 within the semiconductor substrate 102 further reduces the aspect ratio of the trenches 112 in comparison to image sensing IC 100D of FIG. 4. In some embodiments, the gate structures 501 have the same composition as gate structures in transistors (not shown) in the pixel region 105. In some embodiments, those transistors include transfer gates associated with the light sensing elements 104.

Figure 6:
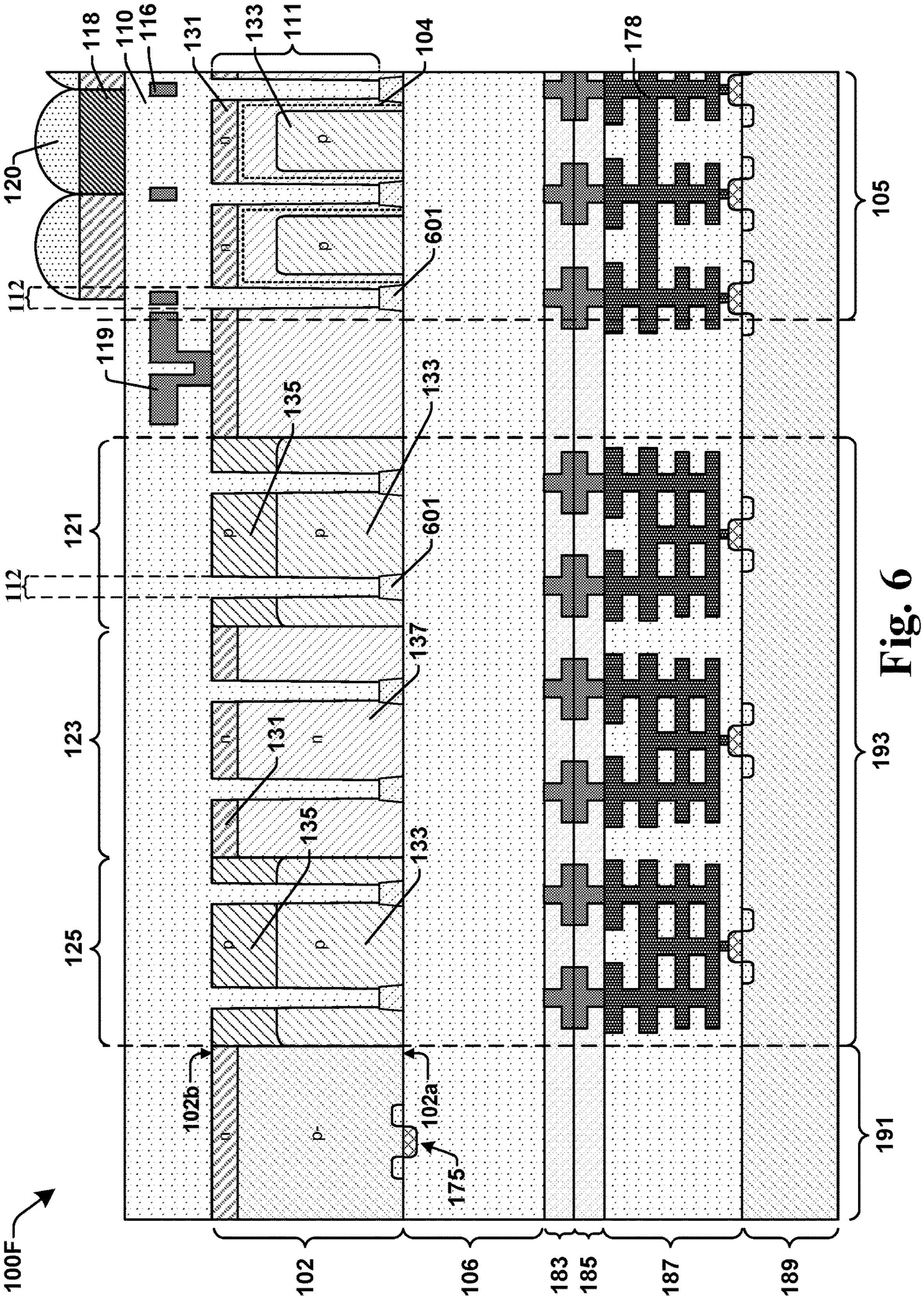

FIG. 6 illustrates a cross-sectional view of an image sensing IC 100F according to some other embodiments. The image sensing IC 100F is like the image sensing IC 100A of FIG. 1 except that in the image sensing IC 100F the conductive cores 114, 114A, 114B, and 114C are all absent and the trenches 112 meet shallow trench isolation (STI) structures 601 that are formed in the front side 102*a*. The trenches 112 and the dielectric structure 110 that fills the trenches 112 provide the first BDTI structure 111 for the image sensing IC 100F. The BDTI structure 111 together with the STI structures 601 extend from the back side 102*b* to the front side 102*a* so as to provide full isolation for the light sensing elements 104. Although the electrical isolation may not be as good, the trenches 112 may be made narrower if they need only contain the dielectric structure 110. Narrowing the trenches 112 increases the full well capacity of the light sensing elements 104. The trenches 112 in the guard ring area 193 improve isolation between the pixel regions 105 and the peripheral region 191 even if they are filled by only the dielectric structure 110.

Figure 7:
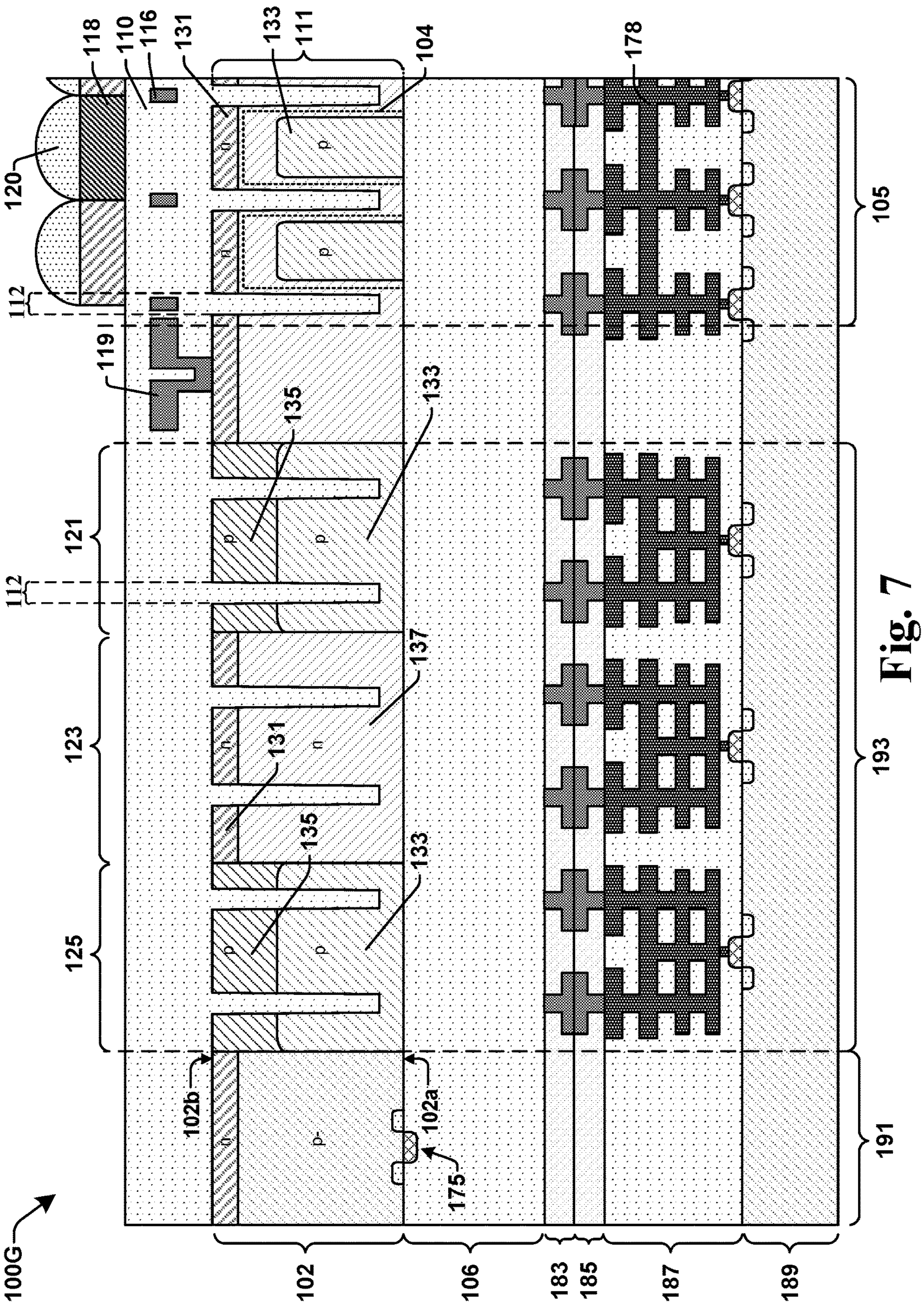

FIG. 7 illustrates a cross-sectional view of an image sensing IC 100G according to some other embodiments. The image sensing IC 100G is like the image sensing IC 100F of FIG. 6 except that the shallow trench isolation (STI) structures 601 are absent. The trenches 112 filled by the dielectric structure 110 provide the first BDTI structure 111 in the image sensing IC 100G without extending all the way to the front side 102*a*. This configuration leaves room for transistors on the front side 102*a* directly opposite the first BDTI structure 111. The shallower trenches 112 provide partial isolation in the pixel region 105, which is sufficient in some applications. Within the guard ring area 193, the shallower trenches 112 are sufficiently deep to cut through the deep N-well 131 and block leakage currents through that layer.

Figure 8:
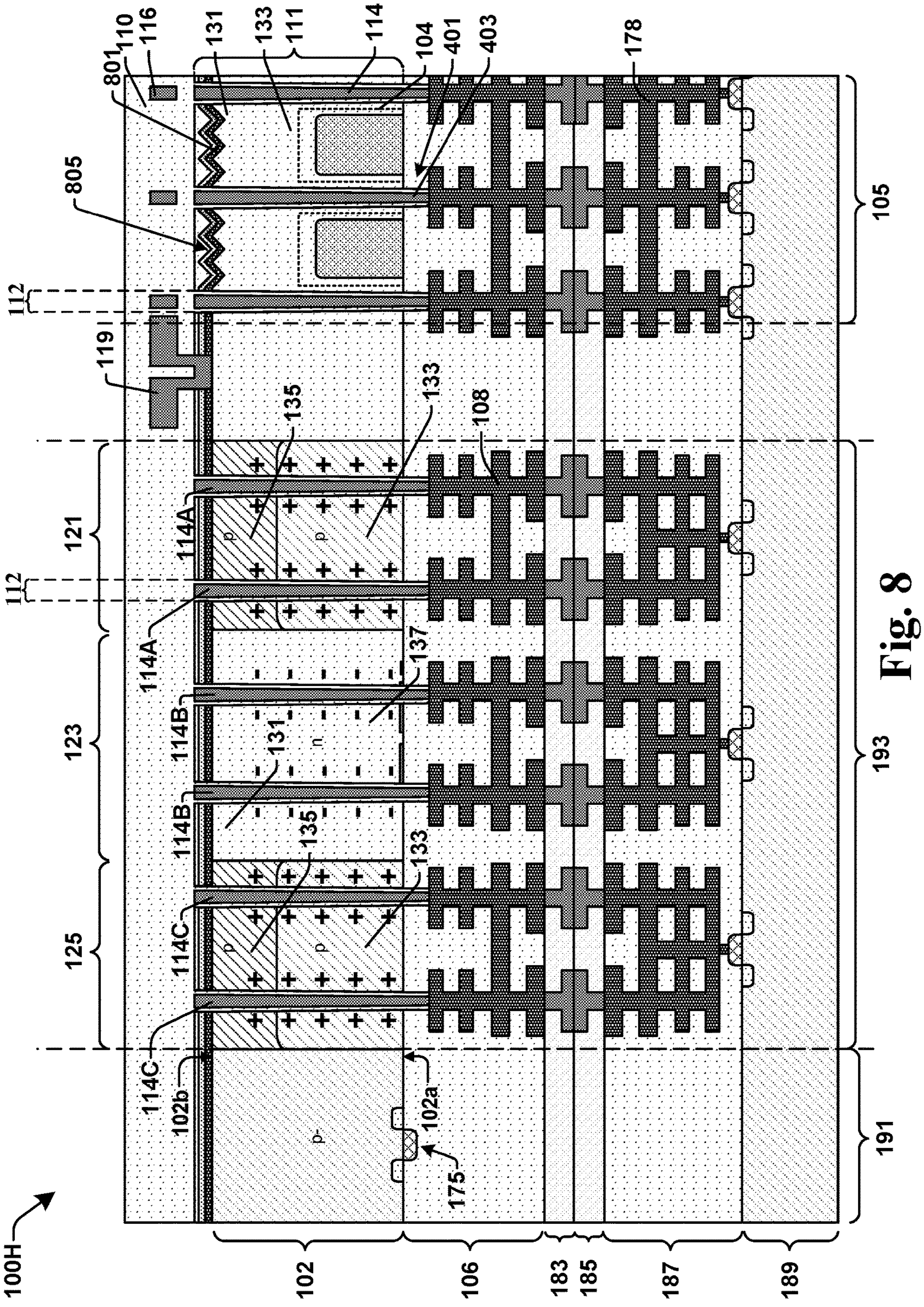

FIG. 8 illustrates a cross-sectional view of an image sensing IC 100H according to some other embodiments. The image sensing IC 100H is like the image sensing IC 100A of FIG. 1 except that in the image sensing IC 100H the back side 102*b* of the semiconductor substrate 102 comprises a non-planar surface defining recesses 805 arranged in a periodic pattern above each of the light sensing elements 104. The recesses 805 are laterally separated from one another by angled sidewalls of the semiconductor substrate 102. In some embodiments, the angled sidewalls of the semiconductor substrate 102 form triangular shaped regions of the semiconductor substrate 102, as viewed in the cross-sectional view of FIG. 8. In some embodiments, the recesses 805 comprise a plurality of triangular shaped cavities that are directly over corresponding light sensing elements 104 and between sidewalls of the semiconductor substrate 102 that define trenches 112. In some embodiments, a first absorption enhancement layer 801 is arranged over the back side 102*b* of the semiconductor substrate 102 and within the plurality of recesses 805. In some embodiments, the first absorption enhancement layer 801 contacts the semiconductor substrate 102 along the non-planar surface. The recesses 805 and the first absorption enhancement layer 801 provide an optional absorption enhancement structure with a topography that increases absorption of incident radiation by the semiconductor substrate 102 (e.g., by reducing reflection). Increasing absorption of incident radiation by the semiconductor substrate 102 increases a quantum efficiency (QE) of the light sensing elements 104, and thereby improves performance of the image sensing IC 100H.

FIGS. 9 through 26 illustrate cross-sectional views exemplifying a method according to the present disclosure of forming an image sensing IC having a guard ring area with BDTI structures in accordance with the present disclosure. While FIGS. 9 through 26 are described with reference to various embodiments of a method, it will be appreciated that the structures shown in FIGS. 9 through 26 are not limited to the method but rather may stand alone separate from the method. FIGS. 9 through 26 are described as a series of acts. The order of these acts may be altered in other embodiments. While FIGS. 9 through 26 illustrate and describe a specific set of acts, some may be omitted in other embodiments. Further, acts that are not illustrated and/or described may be included in other embodiments. While the method of FIGS. 9 through 26 is described in terms of forming the image sensing IC 100A of FIG. 1, the method may be used to form other image sensing ICs.

Figure 9:
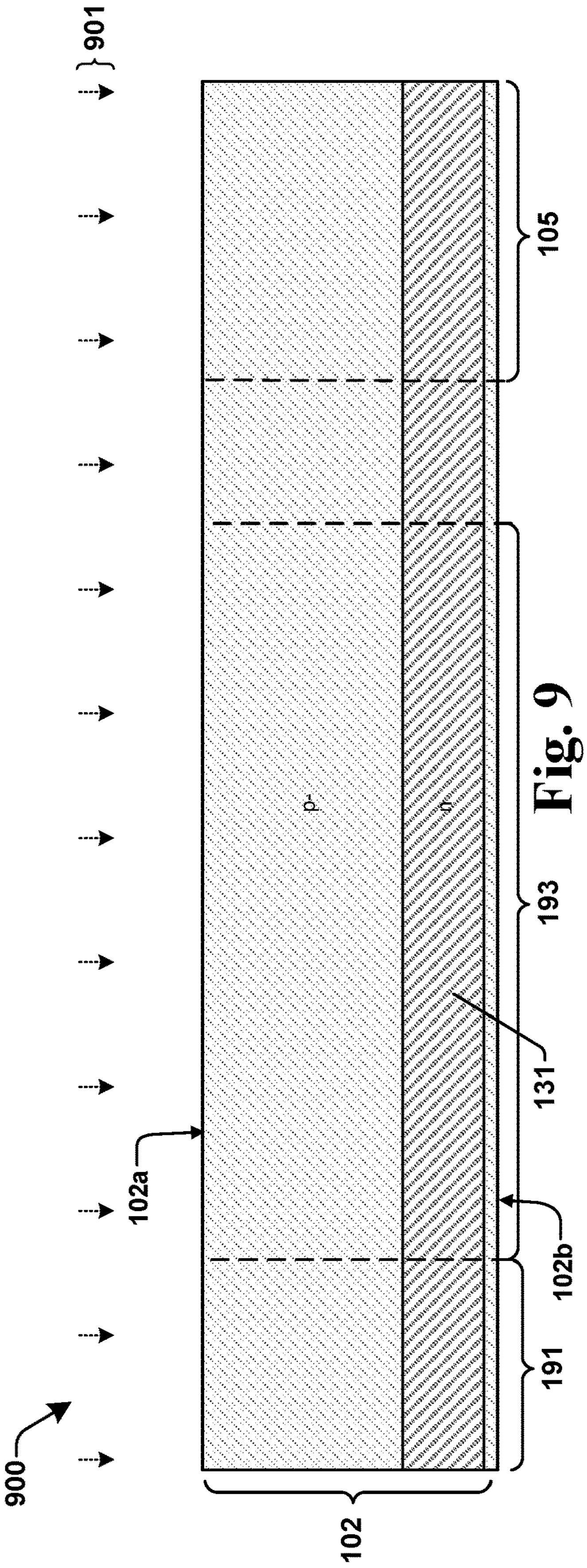
FIGS. 9-26 are a series of cross-sectional views illustrating some embodiments of a method that can be used to form an image sensing IC device such as the image sensing IC device of FIG. 1A.

As shown by the cross-sectional view 900 of FIG. 9, a semiconductor substrate 102 is provided and implanted with N-type dopants 901 to form a deep N-well 131. In various embodiments, the semiconductor substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the implantation process is a blanket implant that is performed without a mask so that the deep N-well 131 is formed across the semiconductor substrate 102 including what will become the pixel region 105, the guard ring area 193, and the peripheral region 191. In some embodiments, the N-type dopants 901 are implanted with an energy in the range from about 2000 keV to about 10,000 keV. In some embodiments, the N-type dopants 901 are implanted with an energy in the range from about 3000 keV to about 6000 keV. In some embodiments, the N-type dopants 901 are implanted with a dosage in the range from about $1\times10^{10}$ to about $1\times10^{13}$ atoms/cm$^2$. In some embodiments, the N-type dopants 901 are implanted with a dosage in the range from about $1\times10^{11}$ to about $1\times10^{12}$ atoms/cm$^2$. In some embodiments, the deep N-well 131 has a peak dopant concentration at about 2 μm to about 5 μm below the front side 102*a*. In some embodiments, the deep N-well 131 has a peak dopant concentration at about 3 μm below the front side 102*a*.

Figure 10:
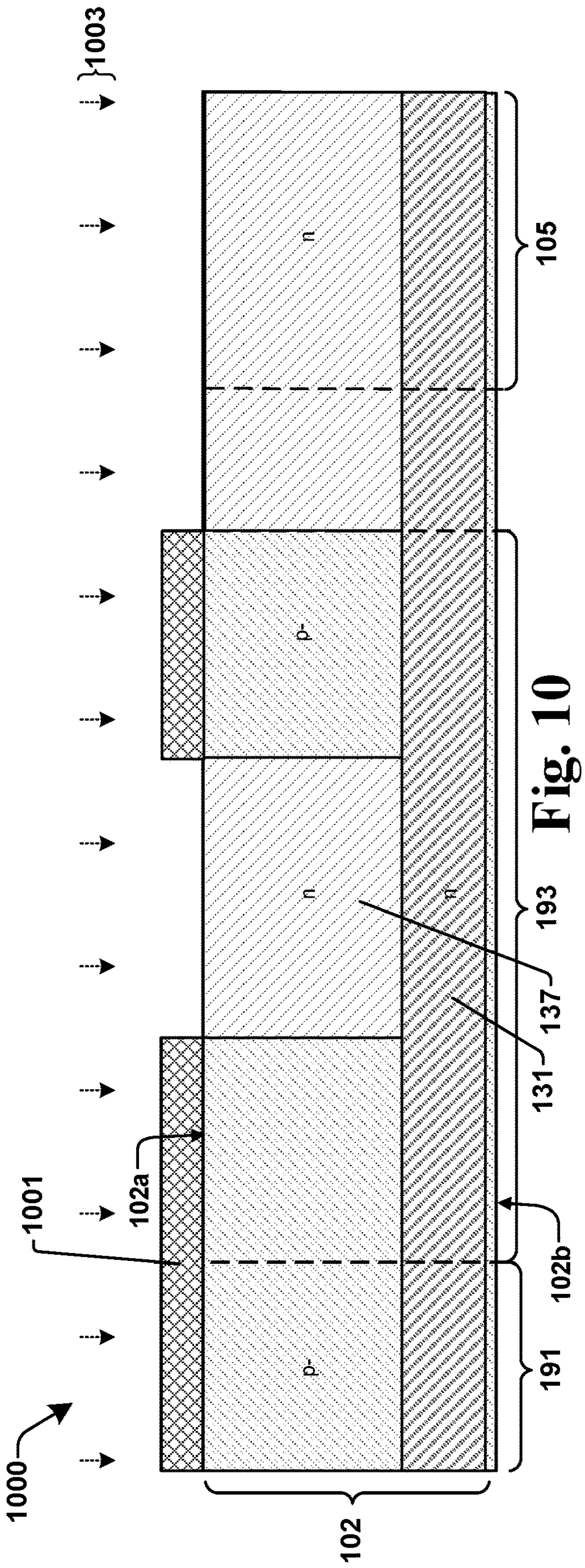

As shown by the cross-sectional view 1000 of FIG. 10, a mask 1001 may be formed and N-type dopants 1003 implanted to form the shallow N-well 137 within the guard ring area 193. In some embodiments, the shallow N-well 137 is also be formed in the pixel region 105. Additional implantations of N-type dopants may take place in the pixel region 105 to provide a desired N-type dopant concentration profile.

Figure 11:
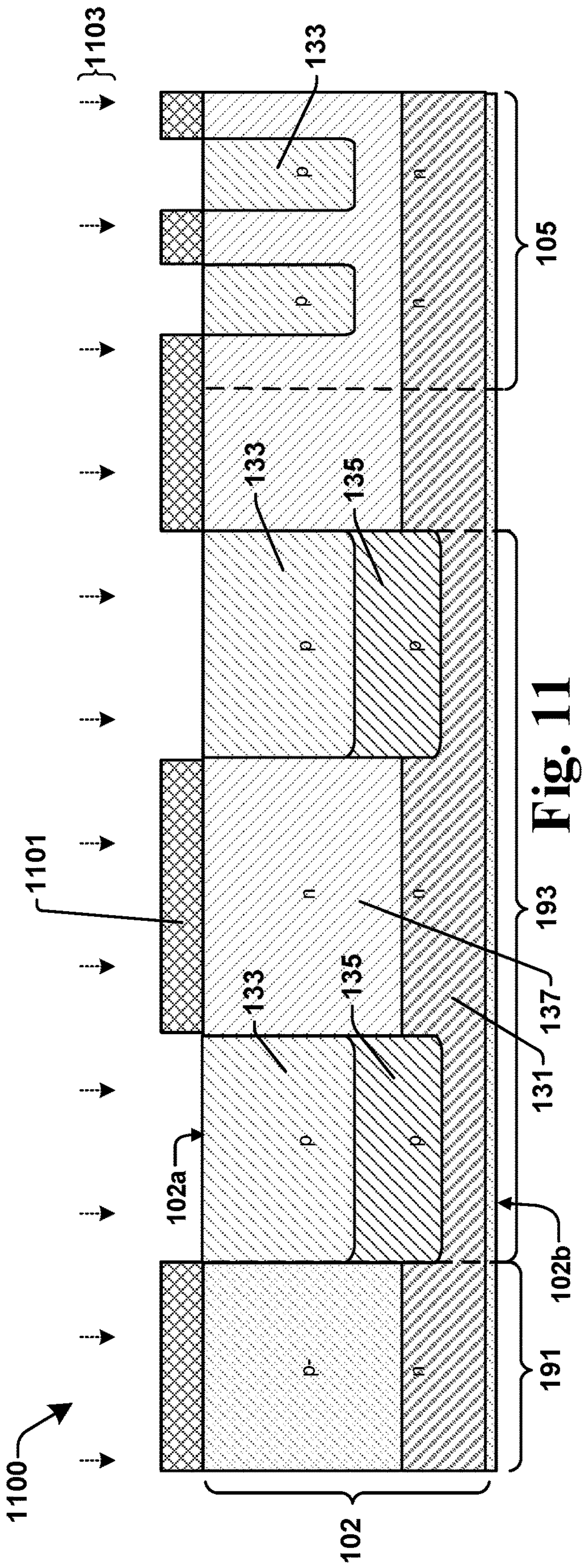

As shown by the cross-sectional view 1100 of FIG. 11, one or more masks 1101 may be formed and P-type dopants 1103 implanted to form the deep P-well 135 and the shallow P-well 133 within the guard ring area 193. In some embodiments, the implant that forms the shallow P-well 133 also forms the shallow P-well 133 in the pixel region 105. Additional implantations of P-type dopants may take place in the pixel region 105 to provide a desired P-type dopant concentration profile.

Figure 12:
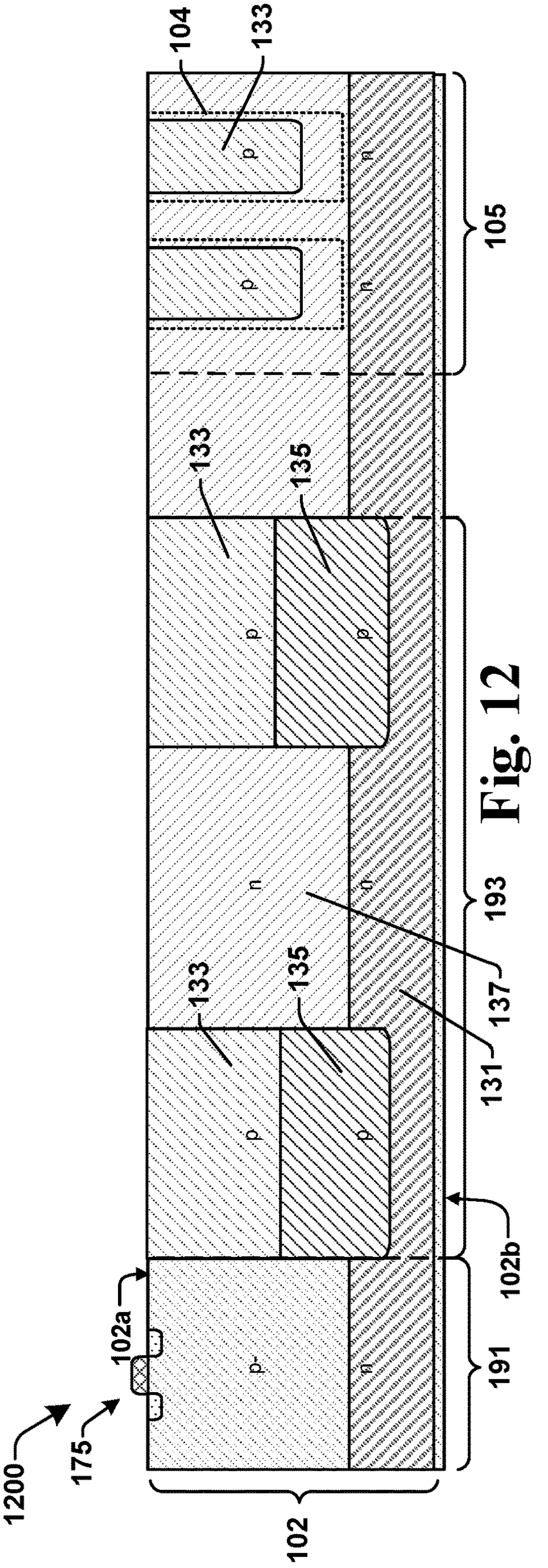

As shown by the cross-sectional view 1200 of FIG. 12, additional processing takes place to form a transistor 175 in the peripheral region 191 and any floating diffusion regions, transfer gates, the like, or other structures in or on the semiconductor substrate 102 that complete the formation of the light sensing elements 104. The transistor 175 may comprise a planar field effect transistor (FET), a FinFET, a gate-all-around (GAA) device, the like, or some other semiconductor device. The light sensing elements 104 are illustrated as being of the type for which the semiconductor substrate 102 provides the light absorbing structure and for which a PN diode in the semiconductor substrate 102 provides an electric field for charge carrier separation, but the light sensing elements 104 may be of any type, e.g., the type formed with an epitaxial germanium (Ge) implant in the front side 102*a*.

Figure 13:
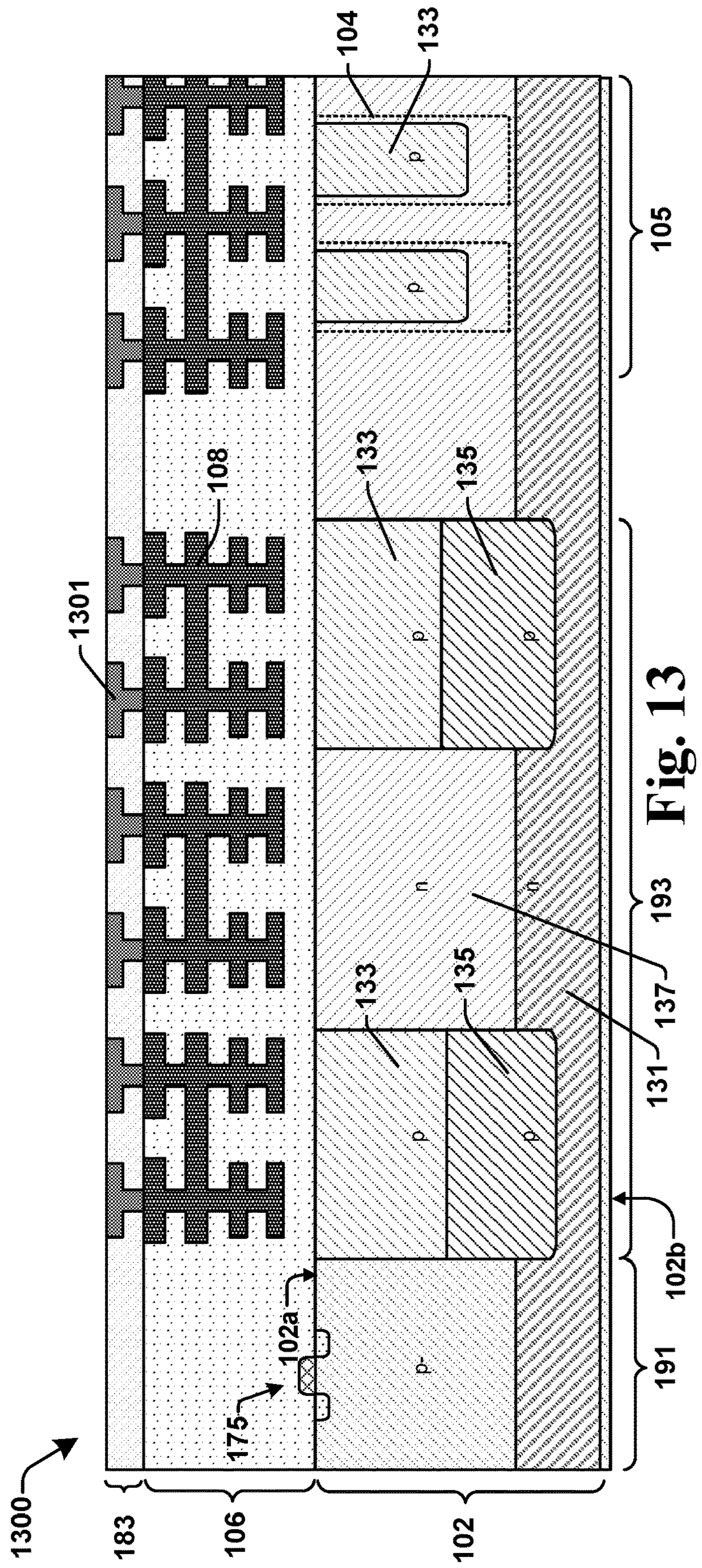

As shown by the cross-sectional view 1300 of FIG. 13, one or more interconnects 108 are formed within an ILD structure 106 formed along the front side 102*a* of the semiconductor substrate 102. The ILD structure 106 comprises a plurality of stacked ILD layers, while the one or more interconnects 108 comprise alternating layers of conductive wires and vias. In some embodiments, one or more of the one or more interconnects 108 are formed using a damascene process (e.g., a single damascene process or a dual damascene process). The damascene process includes forming an ILD layer over the front side 102*a* of the semiconductor substrate 102, etching the ILD layer to form a via hole and/or a trench, and filling the via hole and/or trench with a conductive material. In some embodiments, the ILD layer may be deposited by a vapor deposition process such as physical vapor deposition (PVD), chemical vapor deposition (CVD), plasma enhanced vapor deposition (PE-CVD), atomic layer deposition (ALD), or the like and the conductive material is deposited using a vapor deposition process and/or a plating process (e.g., electroplating, electro-less plating, etc.). The ILD material may be silicon dioxide ($SiO_2$), a low k dielectric, or the like. The conductive material may be or comprise tungsten, copper, aluminum, or the like. As further shown by the cross-sectional view 1300 of FIG. 13, the first bonding layer 183, which may include bond pads 1301 or the like, may be formed above the ILD structure 106 by similar or different processes.

Figure 14:
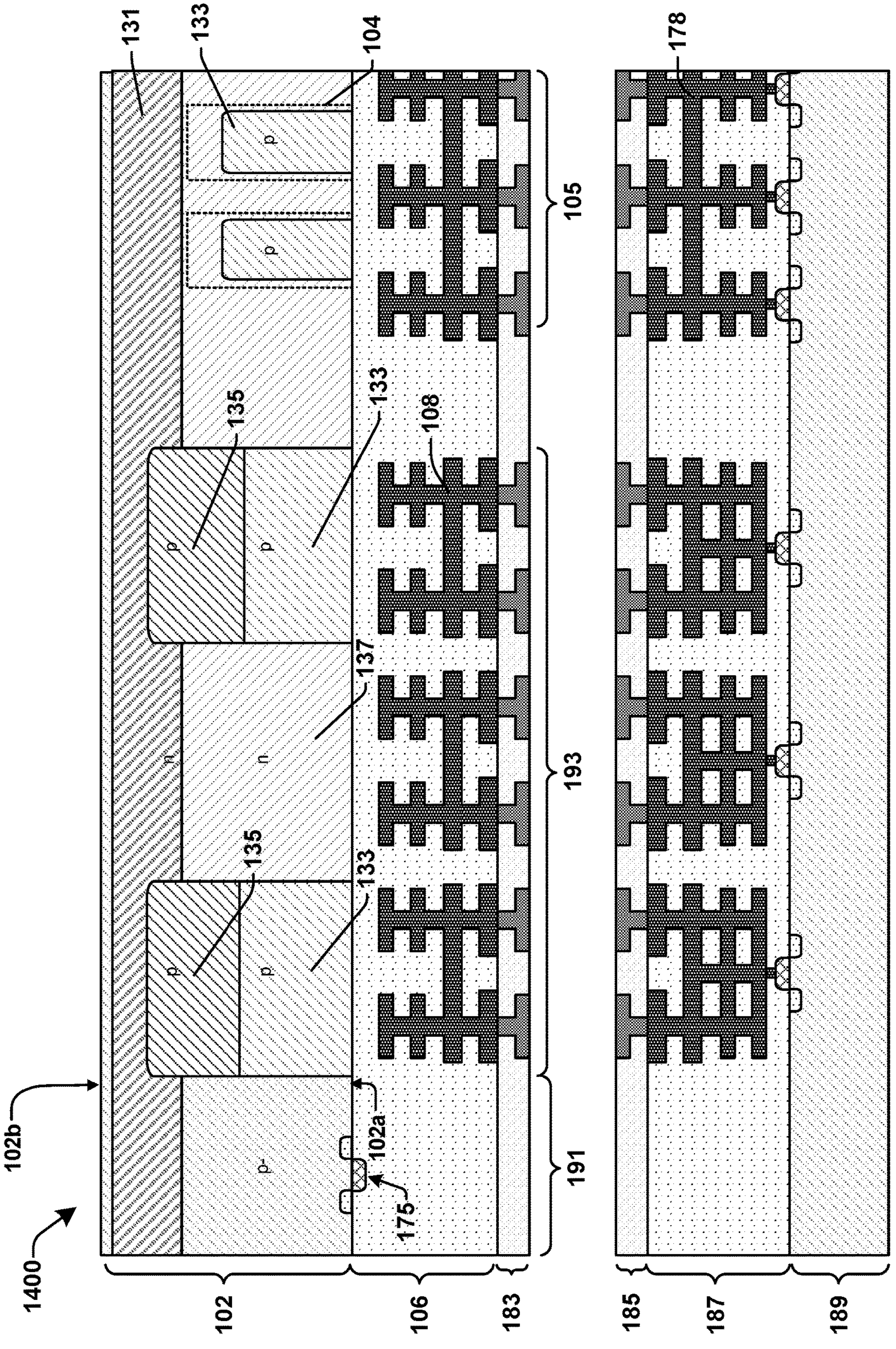

As shown by the cross-sectional view 1400 of FIG. 14, the semiconductor substrate 102 may be flipped over and aligned to a second substrate 189. A second ILD structure 187 and a second bonding layer 185 may be disposed over the second substrate 189. In some embodiments, the second substrate 189 is a support substrate or a handle substrate. In some embodiments, the second substrate 189 comprises a semiconductor material, such as silicon, and semiconductor devices such as transistors or the like are formed on the second substrate 189.

Figure 15:
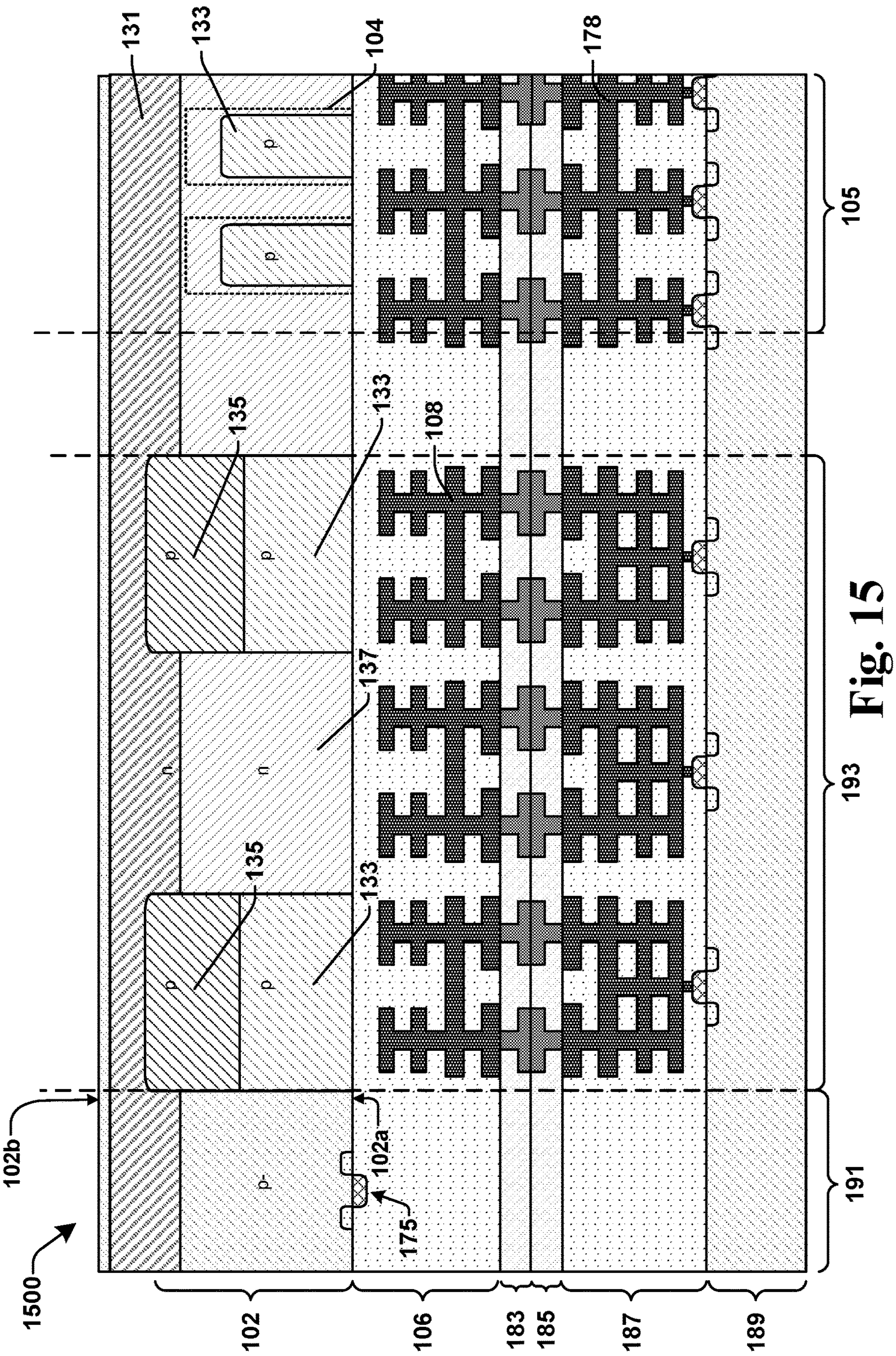

As shown by the cross-sectional view 1500 of FIG. 15, the semiconductor substrate 102 may be bound to the second substrate 189 via the first bonding layer 183 and the second bonding layer 185. The bonding process may be oxide-to-oxide bonding, metal-to-metal bonding, a combination thereof, the like, or any other suitable bonding process. In some embodiments, the first bonding layer 183 and the second bonding layer 185 form electrical connections between the semiconductor substrate 102 and the second substrate 189.

Figure 16:
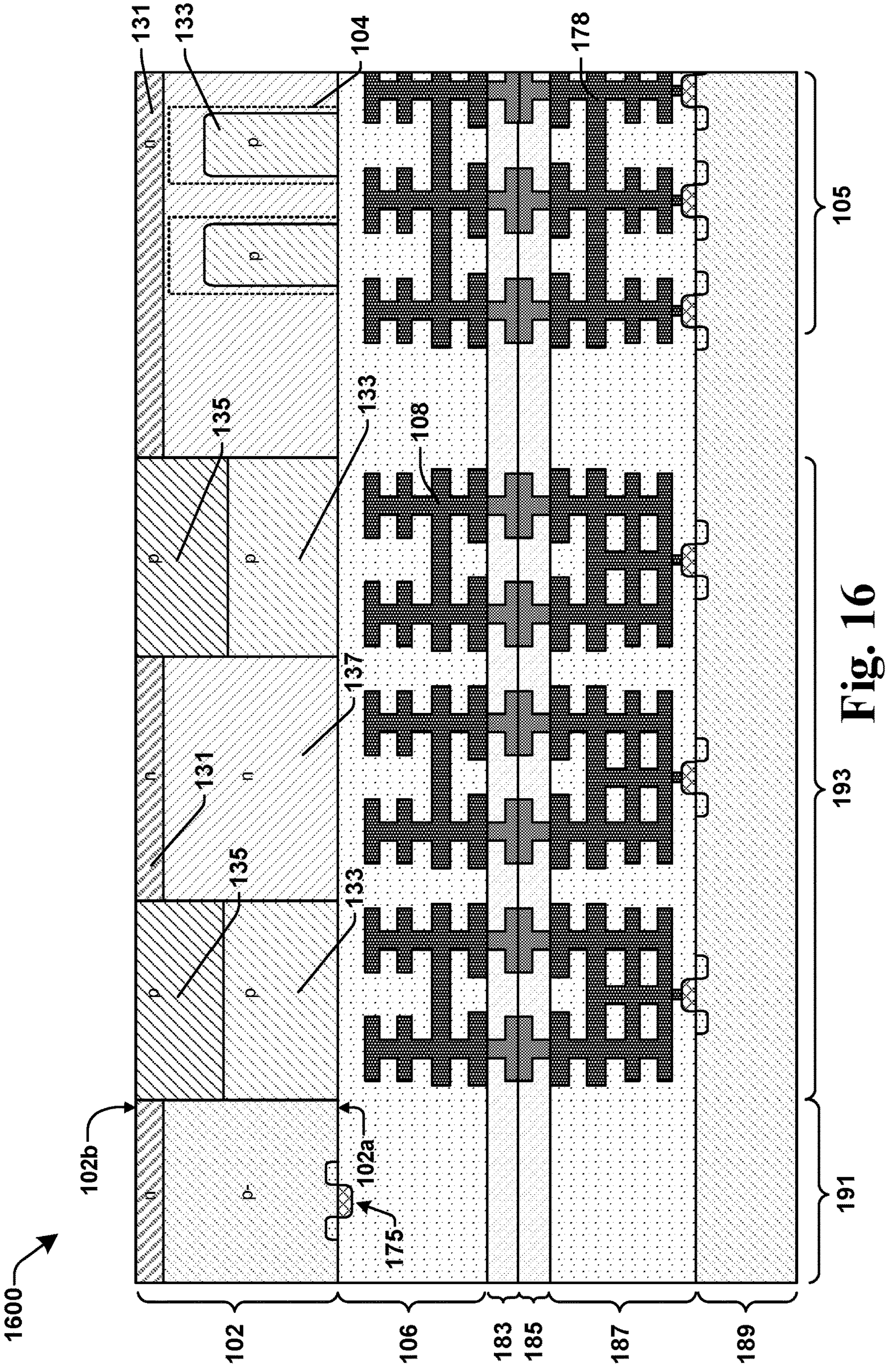

As shown by the cross-sectional view 1600 of FIG. 16, after bonding the semiconductor substrate 102 may be thinned from the back side 102*b*. Thinning the semiconductor substrate 102 allows light to pass more easily to the light sensing elements 104. The semiconductor substrate 102 may be thinned by etching, mechanical grinding, chemical mechanical polishing (CMP), the like, or any other suitable process. In some embodiments, the semiconductor substrate 102 is thinned to less than about 10 μm. In some embodiments, the semiconductor substrate 102 is thinned to about 5 μm or less.

Figure 17:
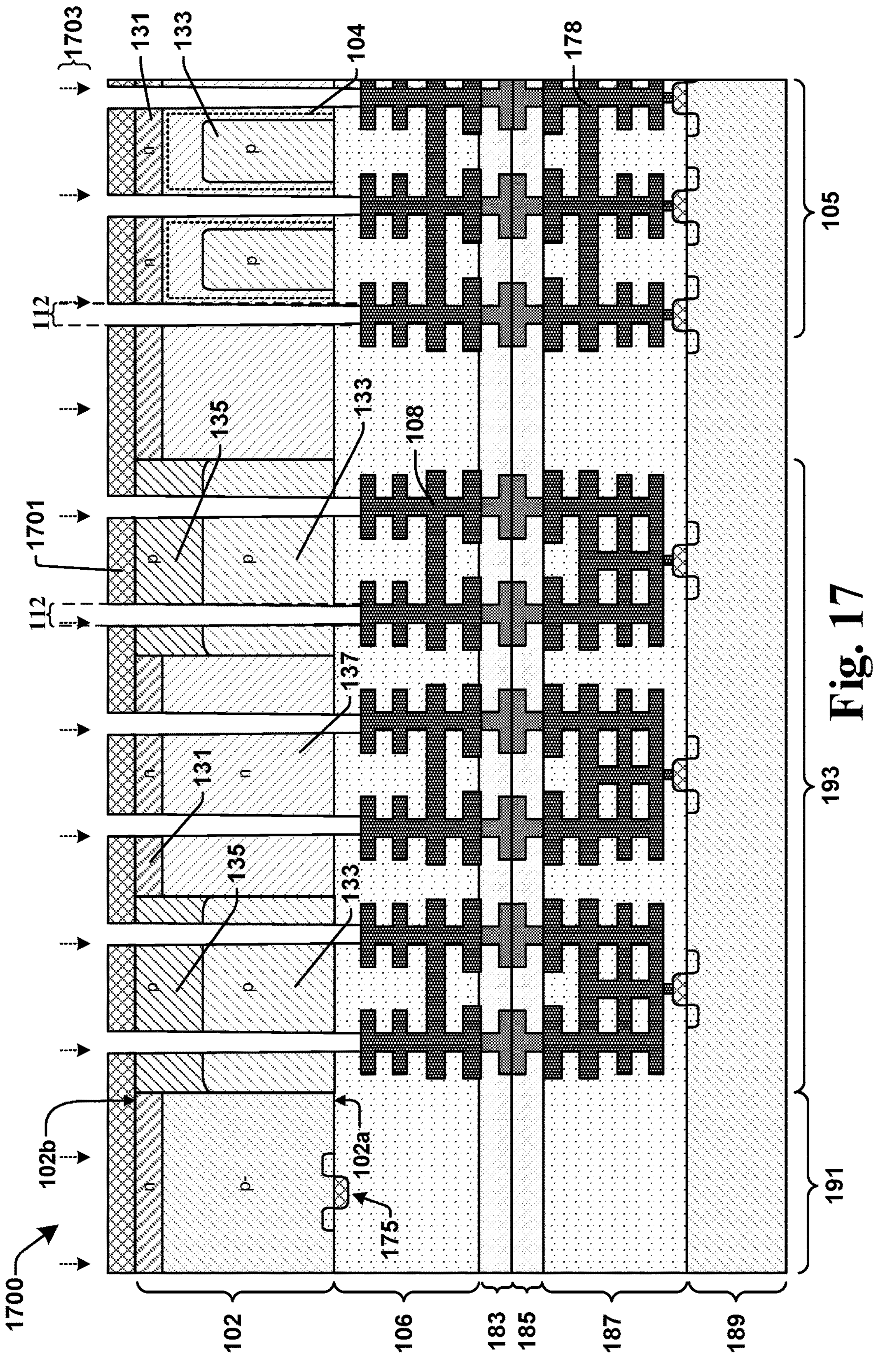

As shown by the cross-sectional view 1700 of FIG. 17, a mask 1701 may be formed and an etchant 1703 applied to form trenches 112. The trenches 112 may extend vertically from the back side 102*b* to the front side 102*a*. The trenches 112 may further extend into the ILD structure 106. In some embodiments, the etch process exposes some of the interconnects 108. In some embodiments, the trenches 112 have widths in the range from about 50 nm to about 400 nm. In some embodiments, the trenches 112 have widths in the range from about 80 nm to about 200 nm. Some of the trenches 112 are formed in the pixel region 105 and laterally surround light sensing elements 104. Some of the trenches 112 are formed in the guard ring area 193 and divide the semiconductor substrate 102 in the guard ring area 193. The mask 1701 may be a photoresist, a hard mask, or the like and may be patterned by photolithography, e-beam lithography, the like, or any other suitable process. The etchant 1703 may be a dry etchant and may comprise one or more of oxygen ($O_2$), nitrogen ($N_2$), hydrogen ($H_2$), argon (Ar), and/or a fluorine species (e.g., $CF_4$, $CHF_3$, $C_4F_8$, etc.). The etch process may proceed in a plurality of steps in order to keep the trenches 112 narrow and provide the trenches 112 with a high aspect ratio. After etching, the mask 1701 may be stripped.

Figure 18:
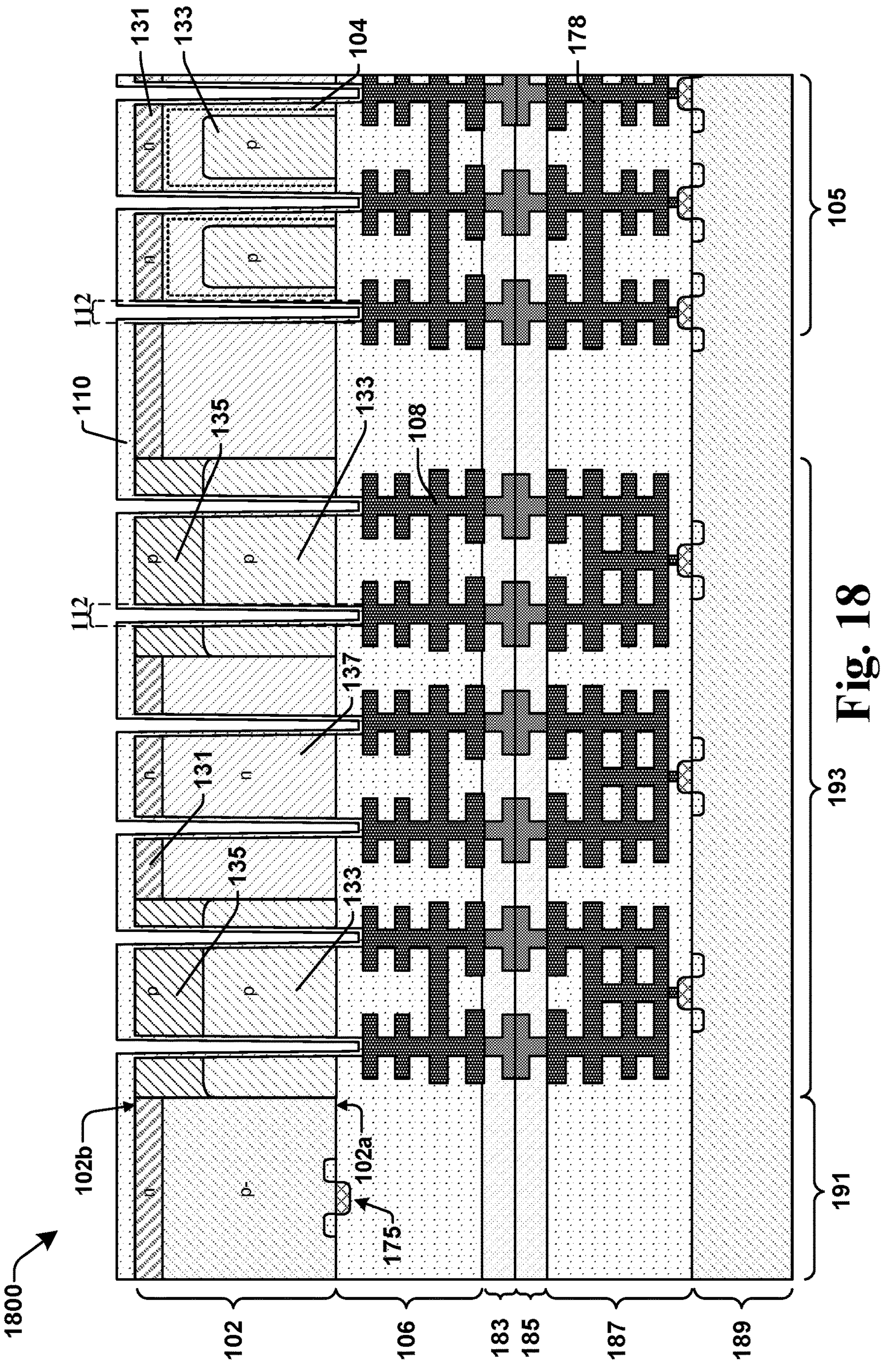

As shown by the cross-sectional view 1800 of FIG. 18, a dielectric structure 110 may be deposited so as to line the trenches 112. The dielectric structure 110 may include one or more layers formed by one or more vapor deposition processes. In some embodiments, the vapor deposition processes comprise ALD. In some embodiments, at least a bottom layer of the dielectric structure 110 comprises a high-K dielectric deposited with a conformal deposition process such as ALD. Examples of high-K dielectrics that may be suitable include hafnium oxide (HfO), aluminum oxide (AlO), zirconium oxide (ZrO), titanium oxide (TiO), strontium oxide (SrO), barium oxide (BaO), barium titanate ($BaTiO_3$), tantalum oxide ($Ta_2O_3$), lanthanum oxide ($La_2O_3$), yttrium oxide ($Y_2O_3$), and the like. Additional layers may be deposited with non-conformal deposition processes so that the dielectric structure 110 is thicker on the back side 102*b* than within the trenches 112. In some embodiments, the total thickness of the dielectric structure 110 within the trenches 112 is in the range from about 10 nm to about 100 nm. In some embodiments, the total thickness of the dielectric structure 110 on the back side 102*b* is in the range from about 50 nm to about 500 nm.

Figure 19:
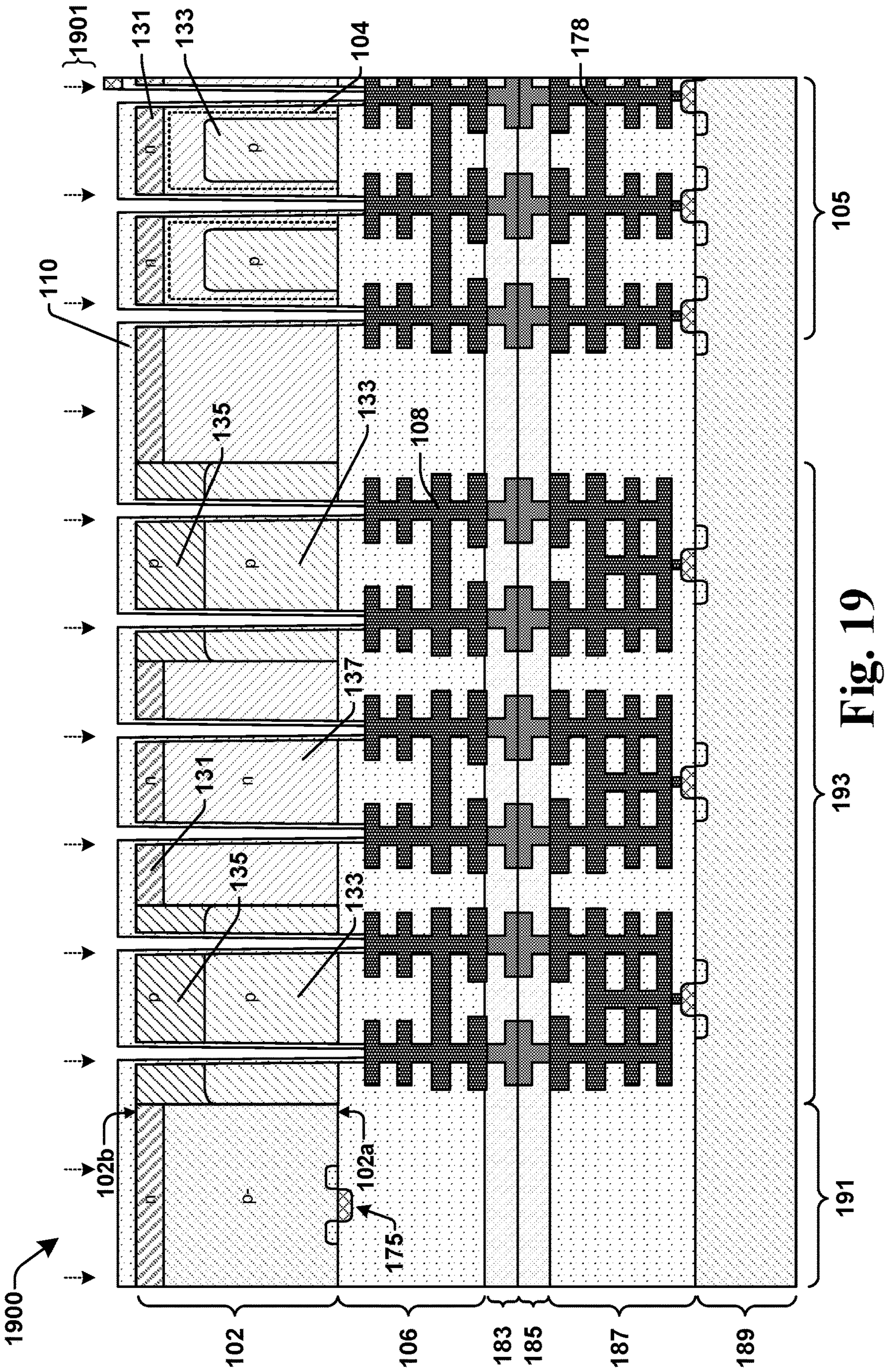

As shown by the cross-sectional view 1900 of FIG. 19, an etchant 1901 may be applied to etch through any dielectric at the bottoms of the trenches 112 and expose the interconnects 108. The etch process breaks through the dielectric structure 110 at the bottoms of the trenches 112. In some embodiments, this etch process is used to extend the trenches 112 into the ILD structure 106. In other words, the etch process illustrated by the cross-sectional view 1700 of FIG. 17, which may have selectivity for the semiconductor of the semiconductor substrate 102, may stop at or near the front side 102*a*. The etch process shown by the cross-sectional view 1900 of FIG. 19 may be more effective for etching the dielectric of the ILD structure 106.

Figure 20:
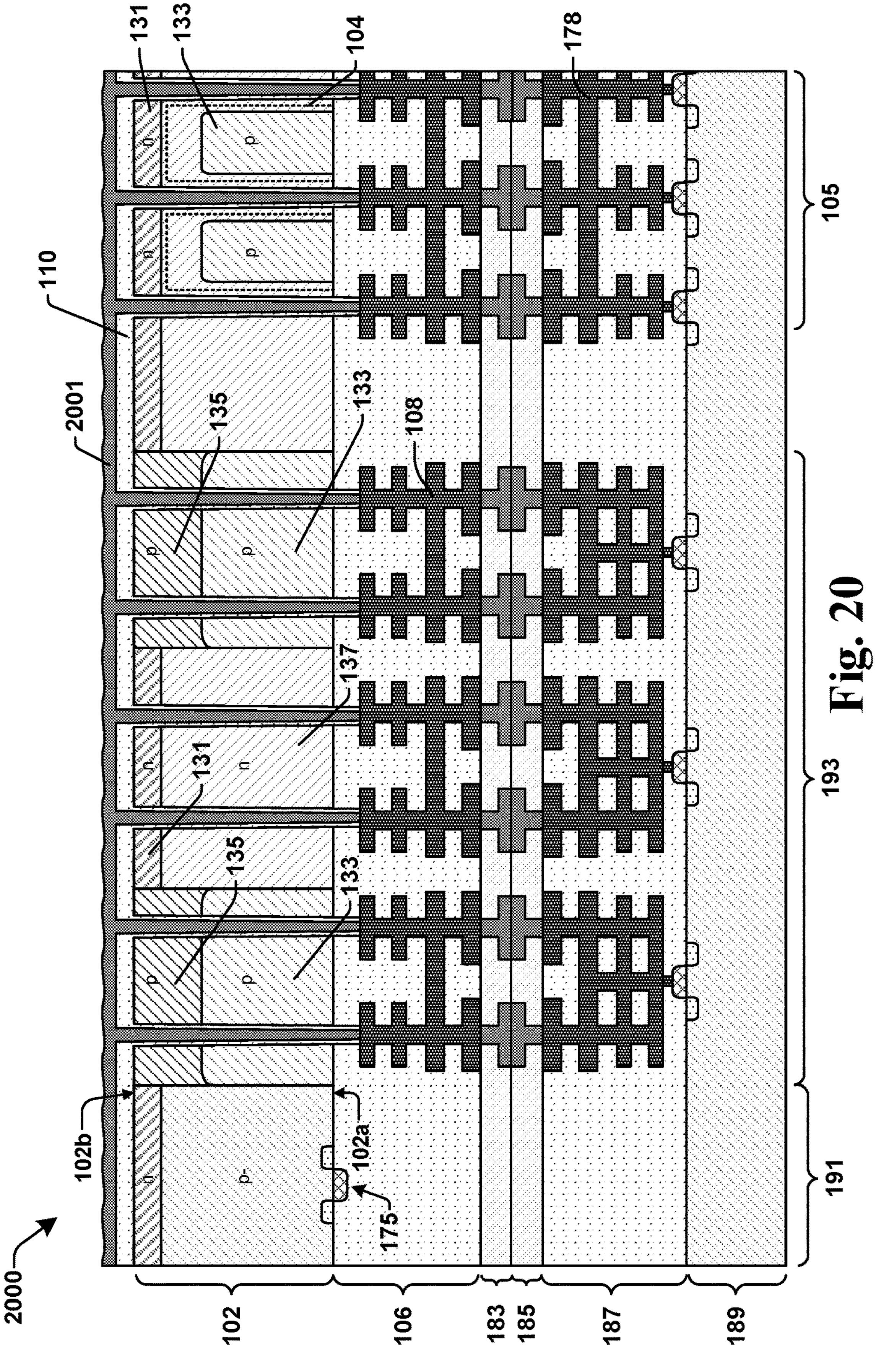

As shown by the cross-sectional view 2000 of FIG. 20, a conductive material 2001 is deposited so as to fill the trenches 112 between sidewalls of the dielectric structure 110. The conductive material may comprise tungsten, aluminum, the like, or some other suitable metal or other conductive material. The conductive material may be deposited by a vapor deposition process, a plating process, the like, or any other suitable method.

Figure 21:
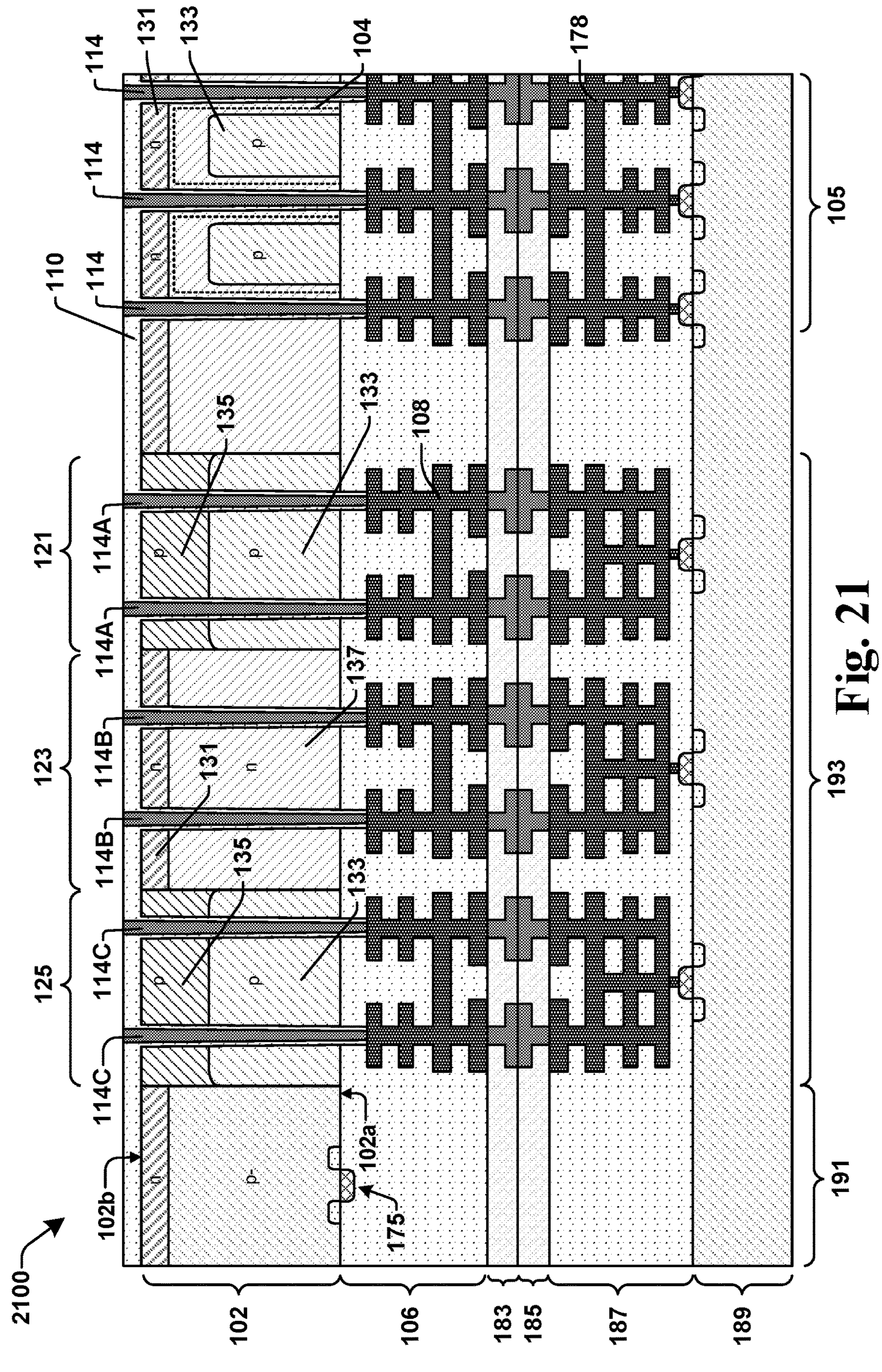

As shown by the cross-sectional view 2100 of FIG. 21, a planarization process may be carried out to remove conductive material 2001 that is outside the trenches 112. The remaining conductive material 2001 forms the conductive cores 114, the conductive cores 114A, the conductive cores 114B, and the conductive cores 114C. The planarization process may be CMP, the like, or any other suitable planarization process.

Figure 22:
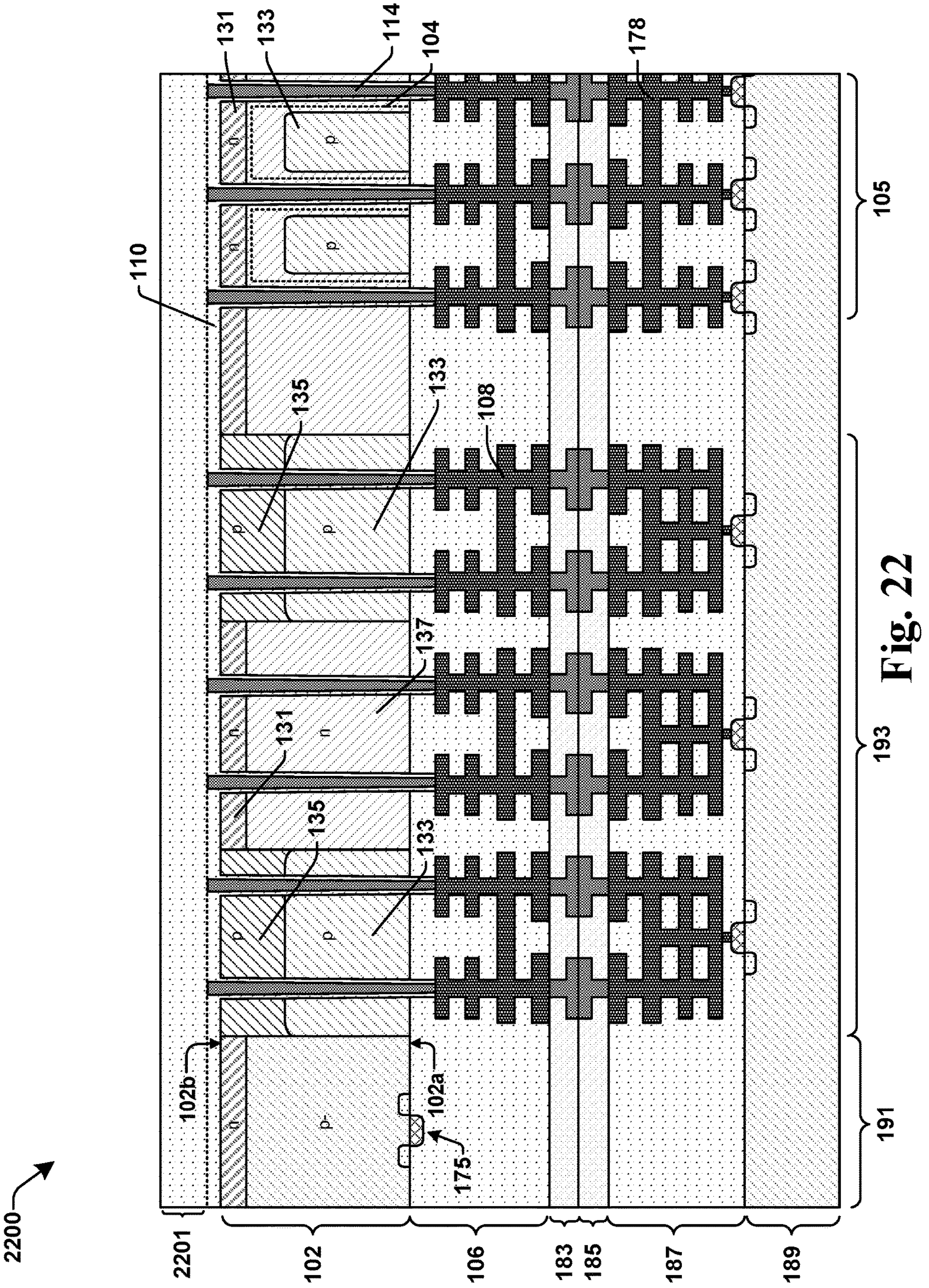

As shown by the cross-sectional view 2200 of FIG. 22, an additional layer 2201 of the dielectric structure 110 may be deposited. The additional layer 2201 may include one or more layers of dielectrics such as silicon oxide ($SiO_2$), tantalum oxide ($Ta_2O_3$), the like, or any other suitable dielectric(s). The additional layer 2201 may be formed by a vapor deposition process or the like.

Figure 23:
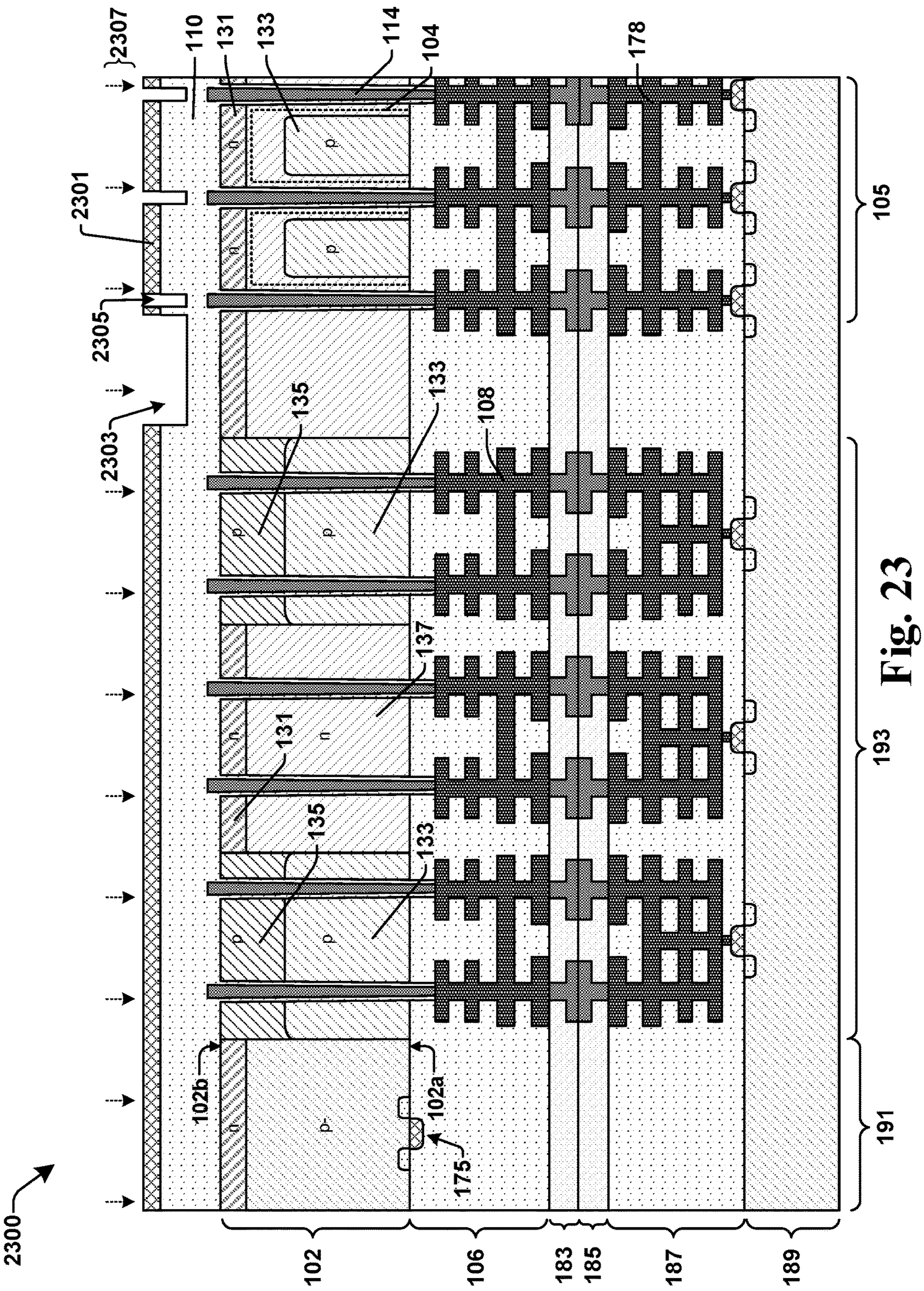

As shown by the cross-sectional view 2300 of FIG. 23, a mask 2301 may be formed and an etchant 2307 applied to form trenches 2305 and trenches 2303. The trenches 2305 may be directly over the trenches 112. The trenches 2303 may extend outside the pixel region 105. The trenches 2305 and the trenches 2303 may be connected. After etching, the mask 2301 may be stripped.

Figure 24:
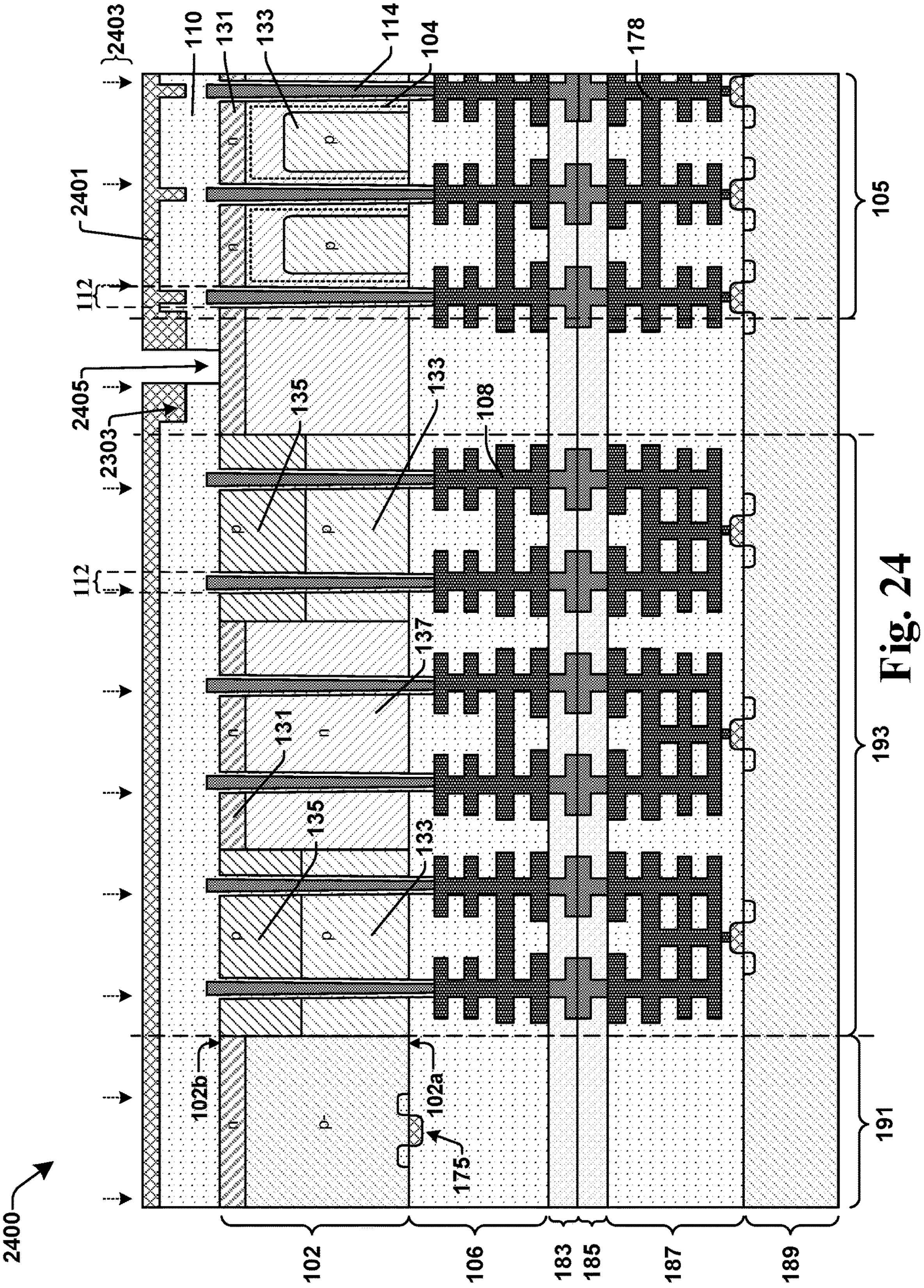

As shown by the cross-sectional view 2400 of FIG. 24, a mask 2401 may be formed and an etchant 2403 applied to form a trench 2405 within the trenches 2303. The semiconductor substrate 102 is exposed through the trench 2405. The trench 2405 may be extended into the semiconductor substrate 102. The trench 2405 may be one or more holes rather than trenches After etching, the mask 2401 may be stripped. The order of the processes shown in FIGS. 23 and 24 may be reversed.

Figure 25:
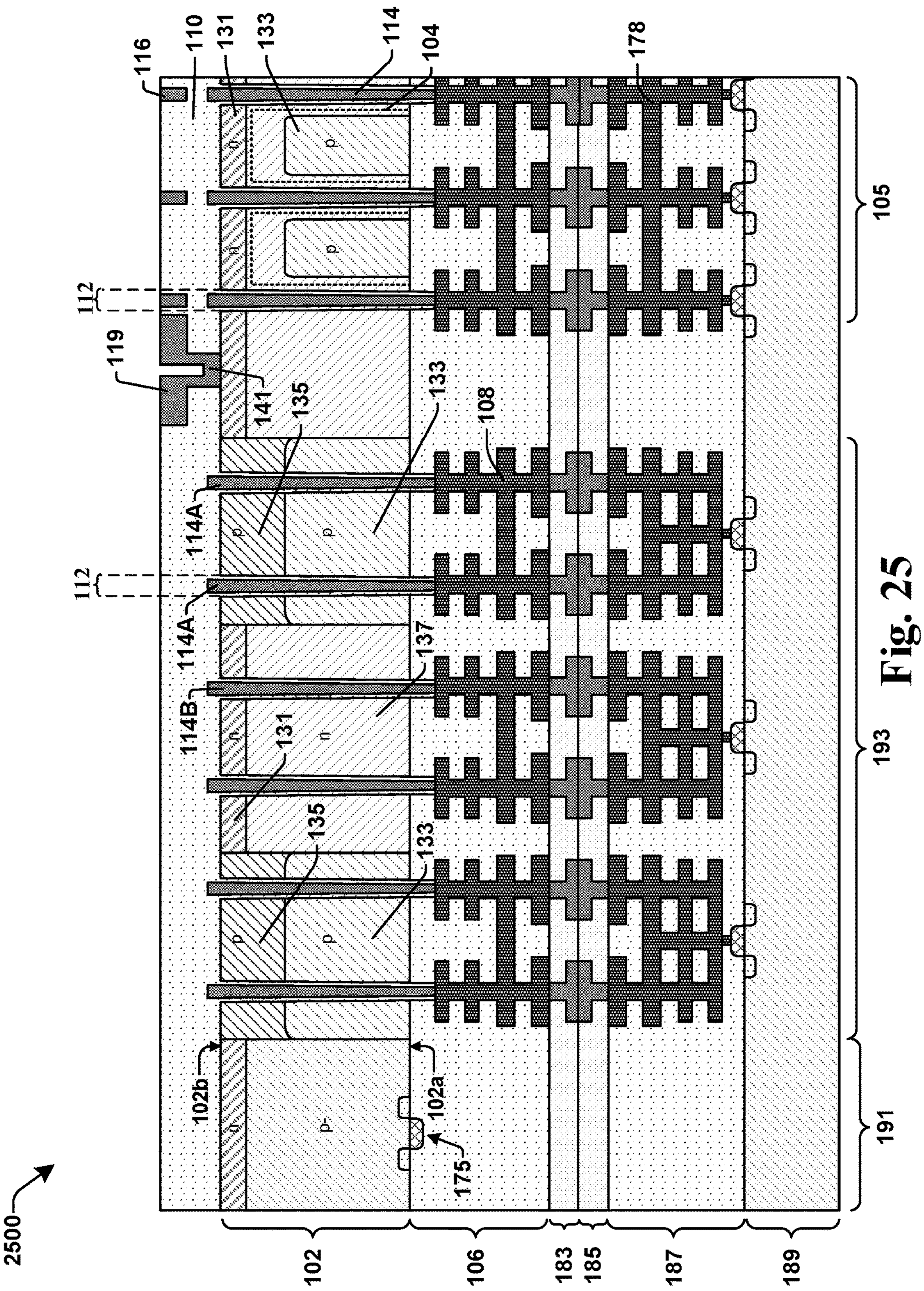

As shown by the cross-sectional view 2500 of FIG. 25, a metal may be deposited so as to fill the trenches 2303, the trenches 2305, and the trench 2405. The metal may be deposited by vapor deposition, plating, the like, or any other suitable process. Excess metal may be removed by CMP or the like. The metal that deposits in the trenches 2305 forms the back side metal grid 116. The metal that deposits in the trenches 2303 forms the conductive shield 119. The metal that deposits in the trench 2405 provides the portion 141 that grounds the back side metal grid 116 and the conductive shield 119 to the semiconductor substrate 102.

Figure 26:
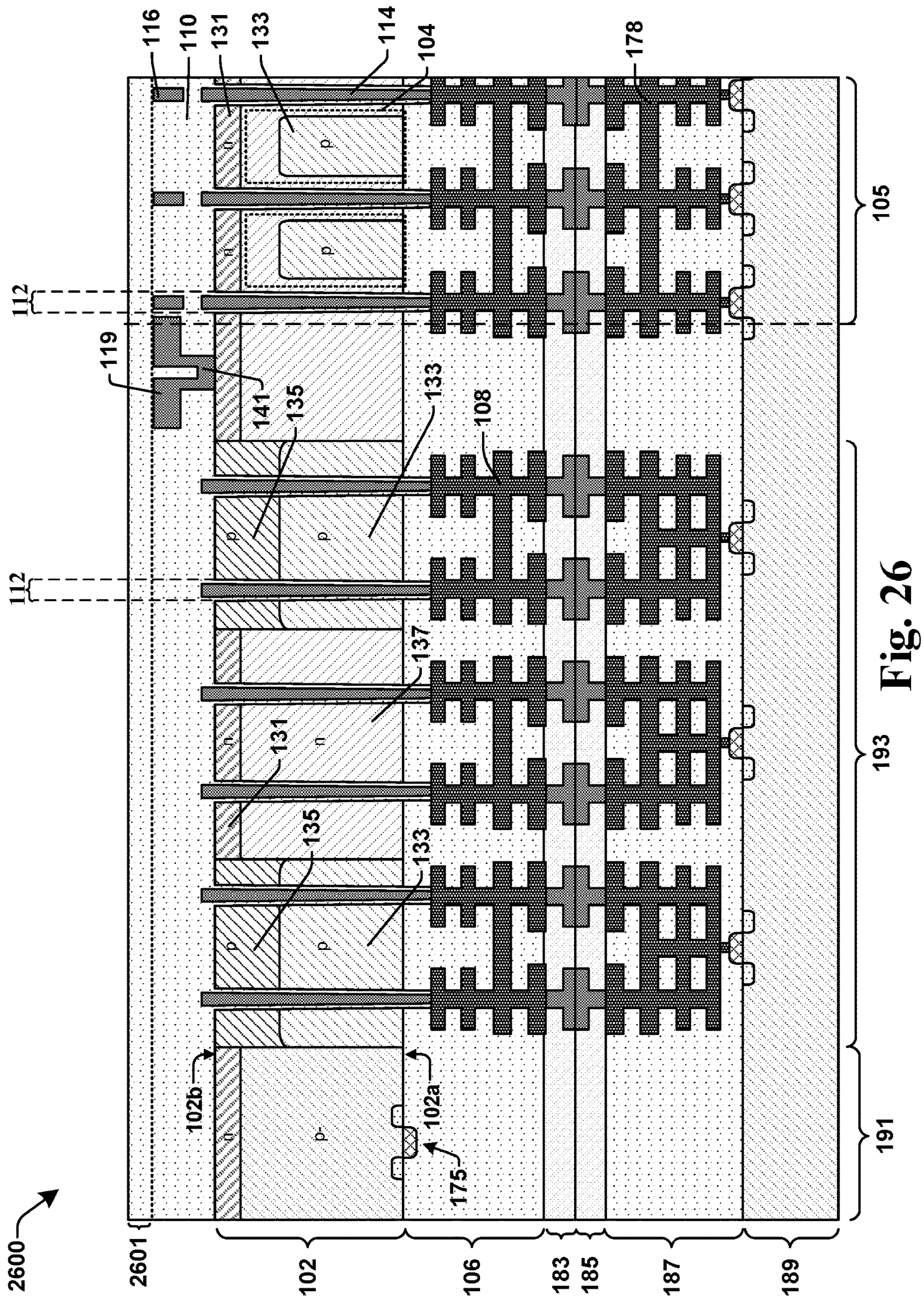

As shown by the cross-sectional view 2600 of FIG. 26, an additional layer 2601 of the dielectric structure 110 may be deposited. The additional layer 2601 may include one or more layers of dielectrics such as silicon oxide ($SiO_2$), tantalum oxide ($Ta_2O_3$), the like, or any other suitable dielectric(s). The additional layer 2601 may be formed by a vapor deposition process or the like. Further processing such as formation of color filters 118 and micro-lenses 120 may be carried out to produce an image sensing IC such as the image sensing IC 100A of FIG. 1.

FIGS. 27-35 illustrate a variation of the foregoing process. This variation may produce an image sensing IC such as the image sensing IC 100D of FIG. 4. The variation may begin from the structure illustrated by the cross-sectional view 1100 of FIG. 11.

Figure 27:
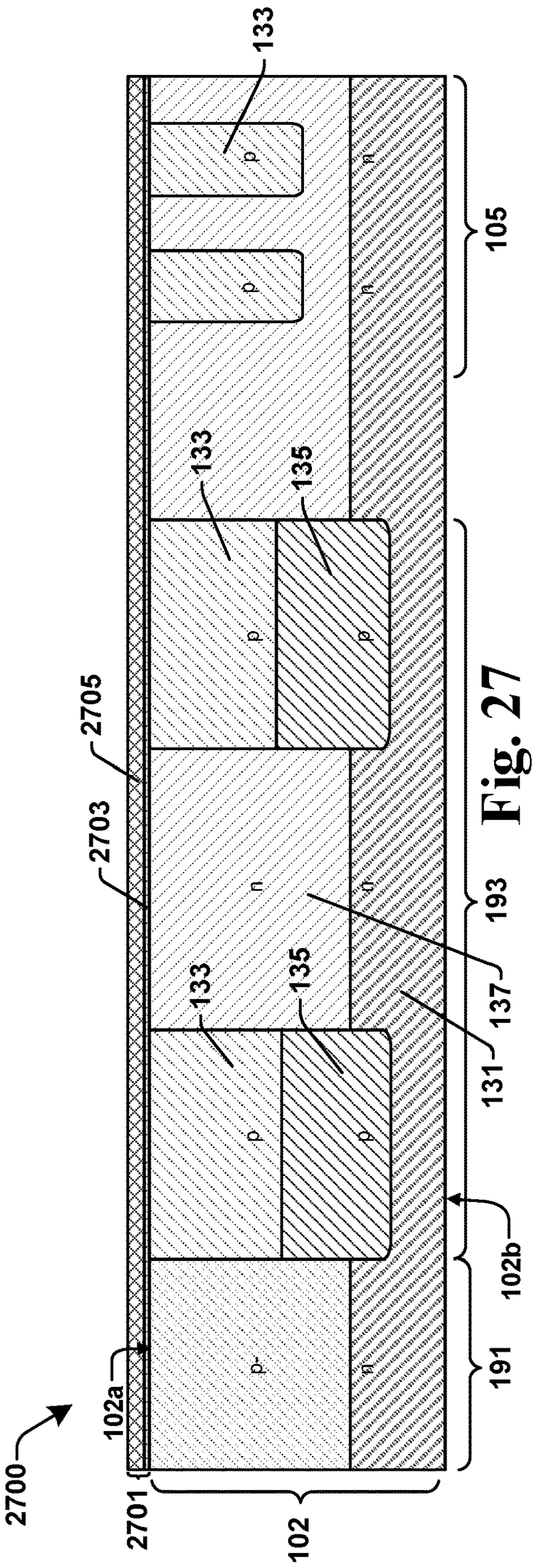
FIGS. 27-35 are a series of cross-sectional views illustrating some embodiments of a method that can be used to form an image sensing IC device such as the image sensing IC device of FIG. 4.

As shown by the cross-sectional view 2700 of FIG. 27, a gate stack 2701 may be deposited over the structure illustrated by the cross-sectional view 1100 of FIG. 11. The gates stack 2701 includes a gate dielectric layer 2703 and a gate electrode layer 2705. The gate dielectric layer 2703 may comprise an oxide (e.g., silicon oxide), a nitride (e.g., silicon oxynitride), a high k dielectric, or the like. The gate electrode layer 2705 may comprise polysilicon, a metal, or the like. These layers may be deposited by vapor deposition processes, the like, or any other suitable processes.

Figure 28:
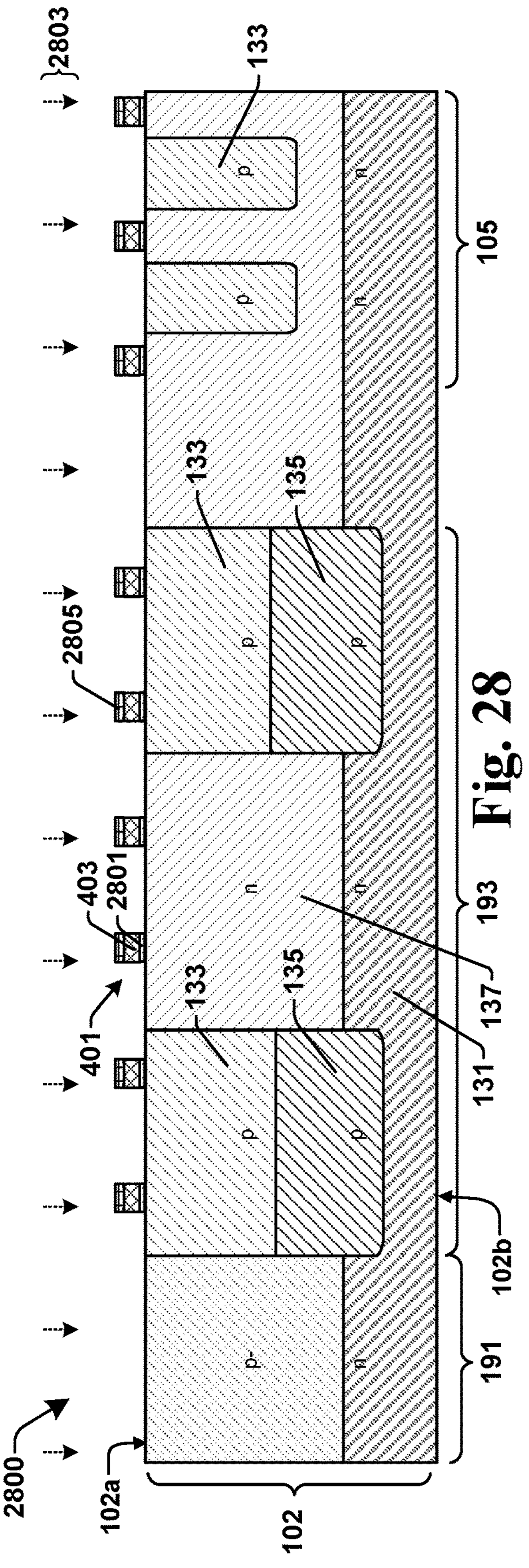

As shown by the cross-sectional view 2800 of FIG. 28, a mask 2805 may be formed and an etchant 2803 may be applied to define the gate structures 401 from the gate stack 2701. The patterning processes defines gate electrodes 403 from the gate electrode layer 2705 and gate dielectric 2801 from the gate dielectric layer 2703. Some of the gate structures 401 are formed in the pixel region 105 and some of the gate structures 401 are formed in the guard ring area 193.

Figure 29:
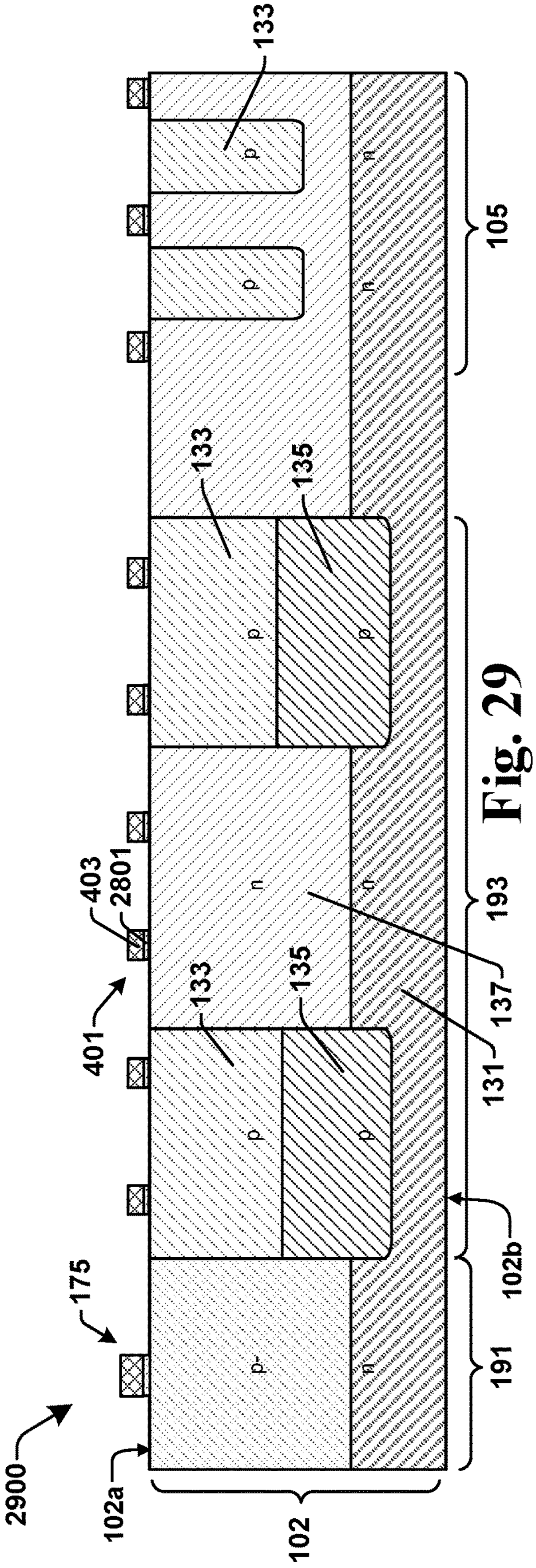

As shown by the cross-sectional view 2900 of FIG. 29, a process like the one illustrated by the cross-sectional view 1200 of FIG. 12 may be carried out to form the transistor 175 in the peripheral region 191. The transistor 175 may have a different gate dielectric thickness or composition from the gate structures 401.

Figure 30:
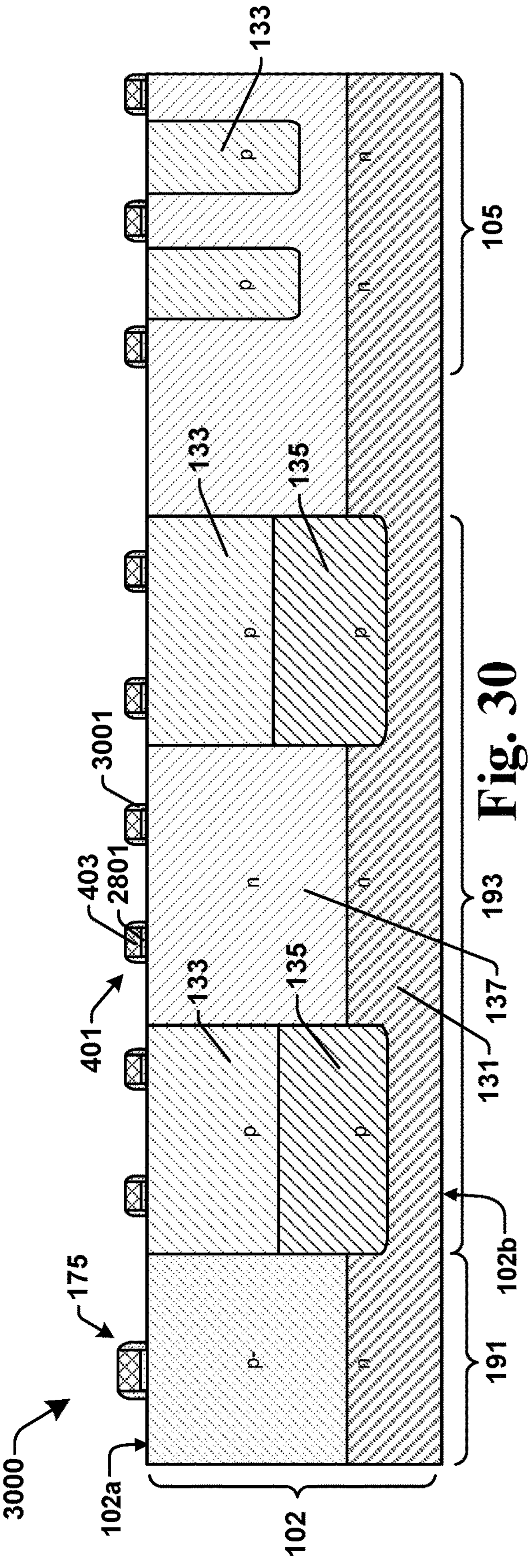

As shown by the cross-sectional view 3000 of FIG. 30, spacers 3001 may be formed on the sides of the gate structures. The spacer formation process may include deposition of the spacer material and etching. The spacer material may include one or more layers of nitrides, oxides, oxynitrides, oxy-carbides, or the like.

Figure 31:
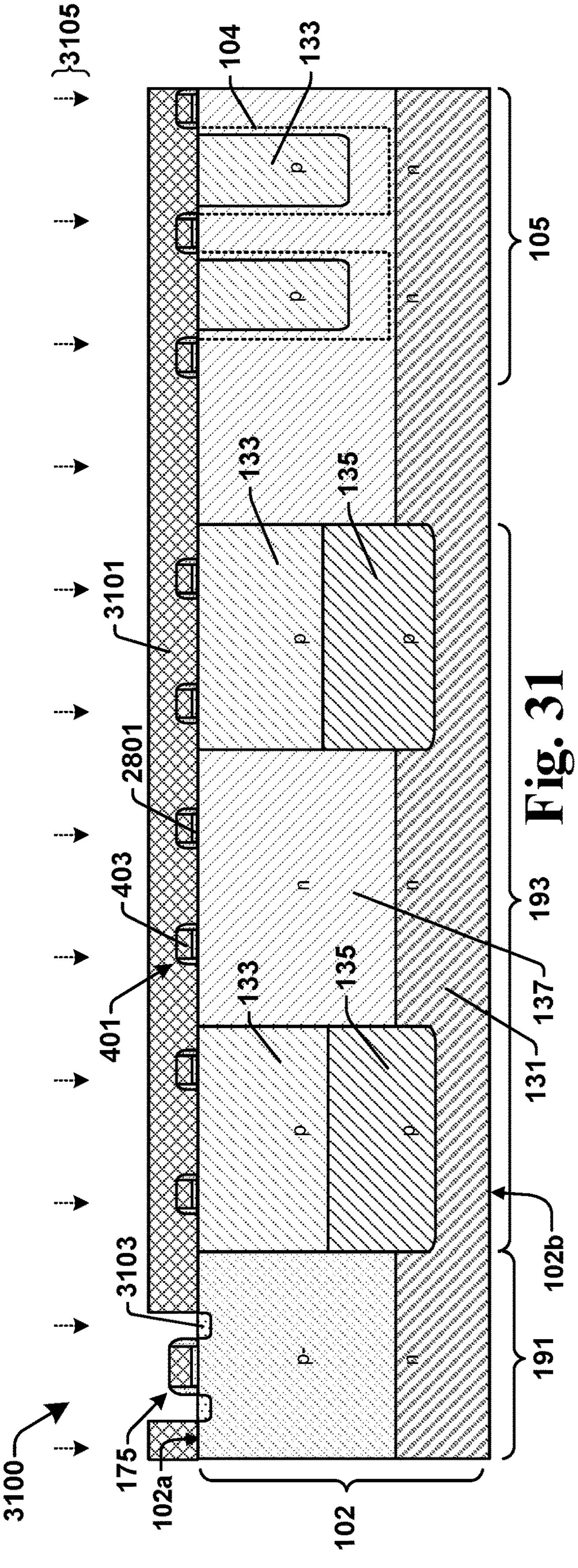
Figure 32:
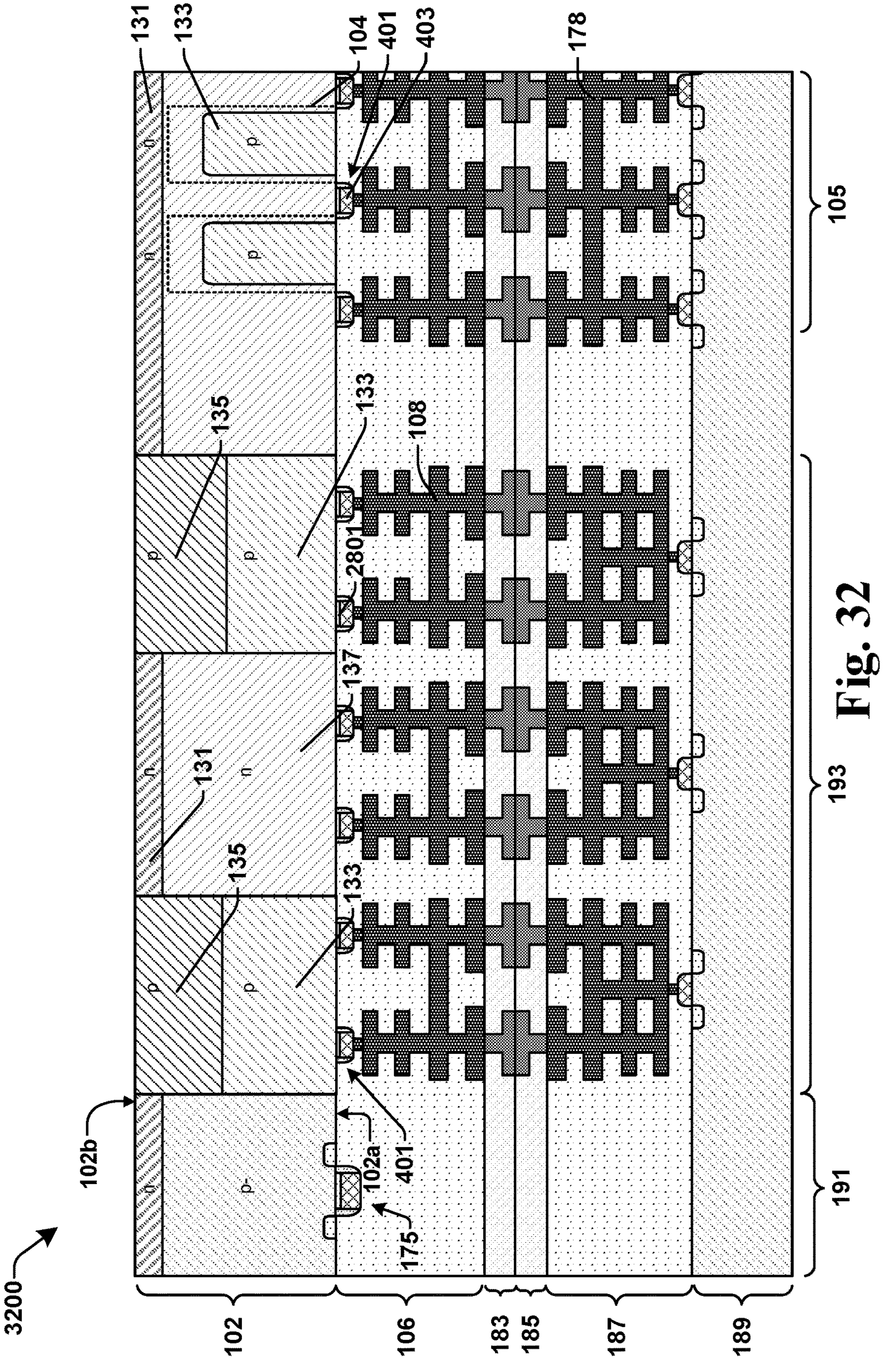

As shown by the cross-sectional view 3100 of FIG. 31, a mask 3101 may be formed and dopants 3105 implanted to form source/drain regions 3103 adjacent the transistor 175. The mask 3101 may be provided to prevent the dopants 3105 from being implanted around the gate structures 401 that are used to couple the conductive cores 114, 114A, 114B, and 114C to the interconnects 108 (see FIG. 4). Because these gates structures are used as connectors rather than as transistors, source/drain regions are not needed around these gates and could interfere with other nearby components. Nevertheless, the dopants 3105 may be implanted in some area of the pixel region 105 such as adjacent gate structures 401 that provide transfer gates (not shown) or to provide floating diffusion regions (not shown). This dopant implantation may complete the formation of the light sensing elements 104. After doping, the mask 3101 may be stripped. Additional processing as described in connection with the cross-sectional views 1300 to 1600 of FIGS. 13 to 16 may then be carried out to produce the structure shown by the cross-sectional view 3200 of FIG. 32.

Figure 33:
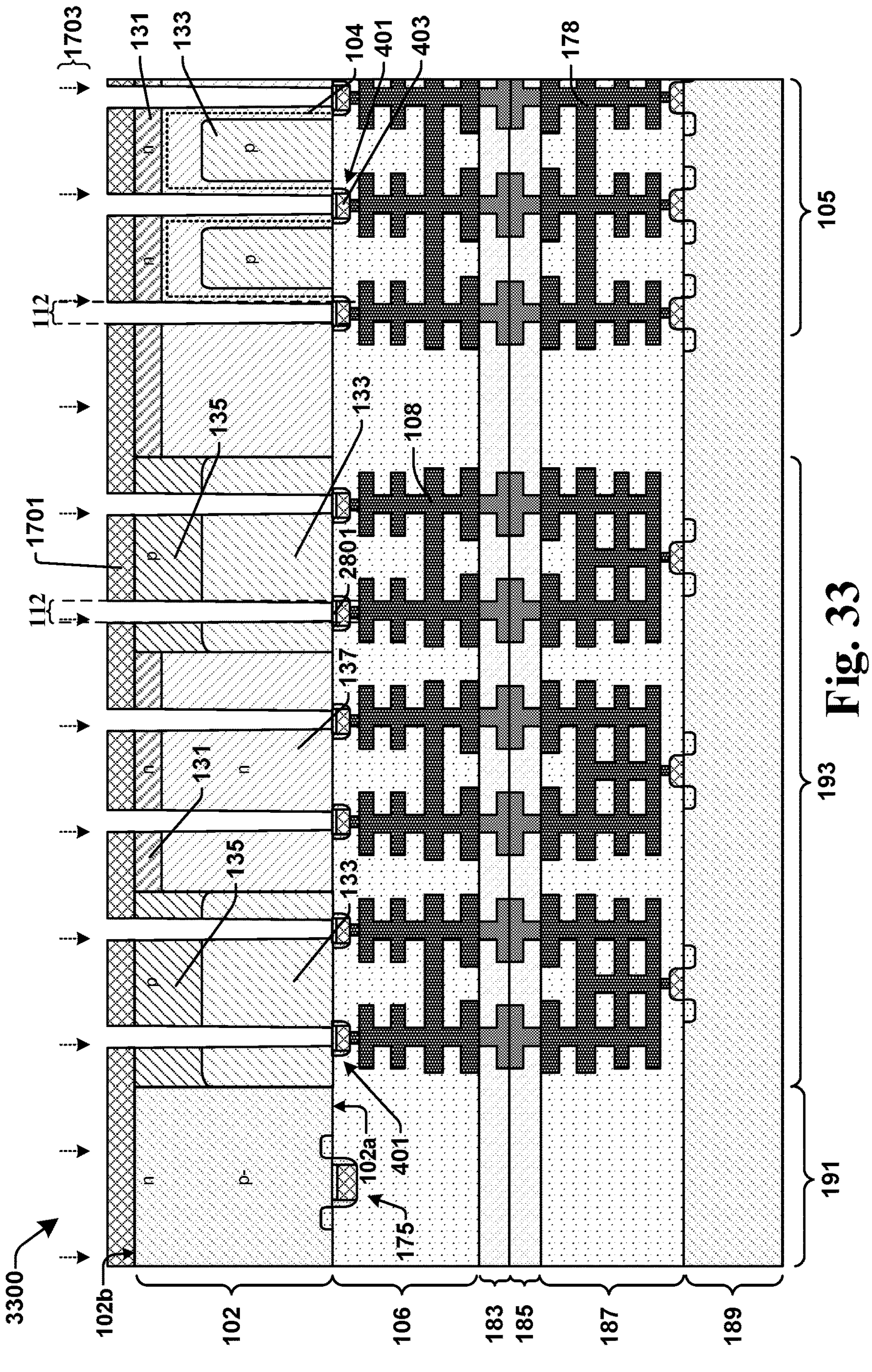

As shown by the cross-sectional view 3300 of FIG. 33, the mask 1701 may then be formed and the etchant 1703 applied to form the trenches 112. In some embodiments, this etch process is selective for etching silicon over oxide and stops on the gate dielectric 2801. The gate dielectric 2801 may be used as an etch stop layer. Stopping the etch process on the gate dielectric 2801 may be particularly desirable when both the gate electrodes 403 and the semiconductor substrate 102 are semiconductors. In some embodiments, the etch process stops on the gate electrodes 403.

Figure 34:
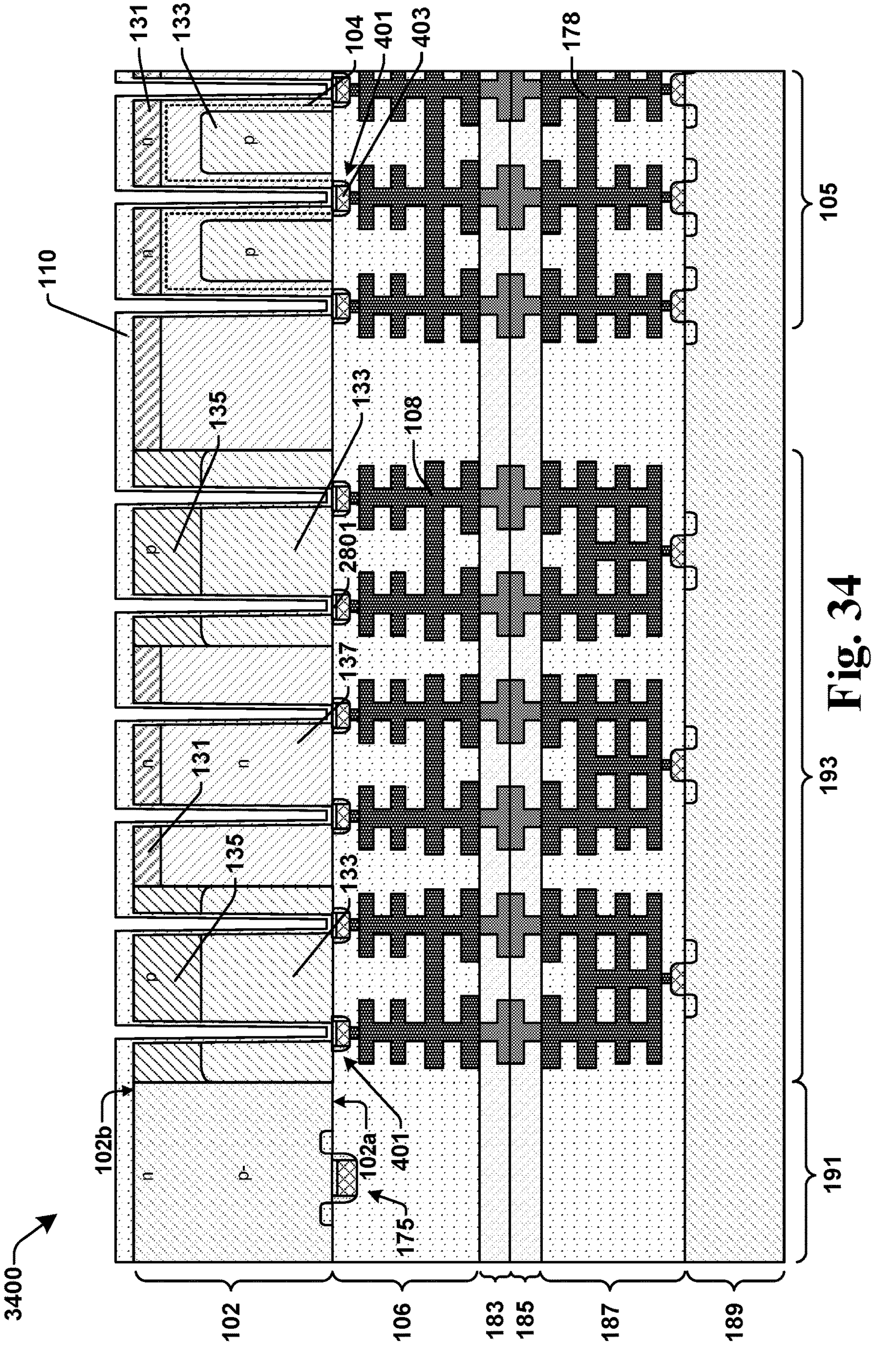

As shown by the cross-sectional view 3400 of FIG. 34, the dielectric structure 110 may be formed as described in connection with the cross-sectional view 1800 of FIG. 18. As shown by the cross-sectional view 3500 of FIG. 35, an etch process may be carried out to break through the dielectric at the bottoms of the trenches 112 as described in connection with the cross-sectional view 1900 of FIG. 19. Processing may then continue as described in connection with the cross-sectional views 2000 to 2600 of FIGS. 20 to 26 to provide an image sensing IC such as the image sensing IC 100D of FIG. 4.

FIGS. 36-39 illustrate a variation of the foregoing process. This variation may produce an image sensing IC such as the image sensing IC 100E of FIG. 5. The variation may begin from the structure shown by the cross-sectional view 1100 of FIG. 11.

Figure 36:
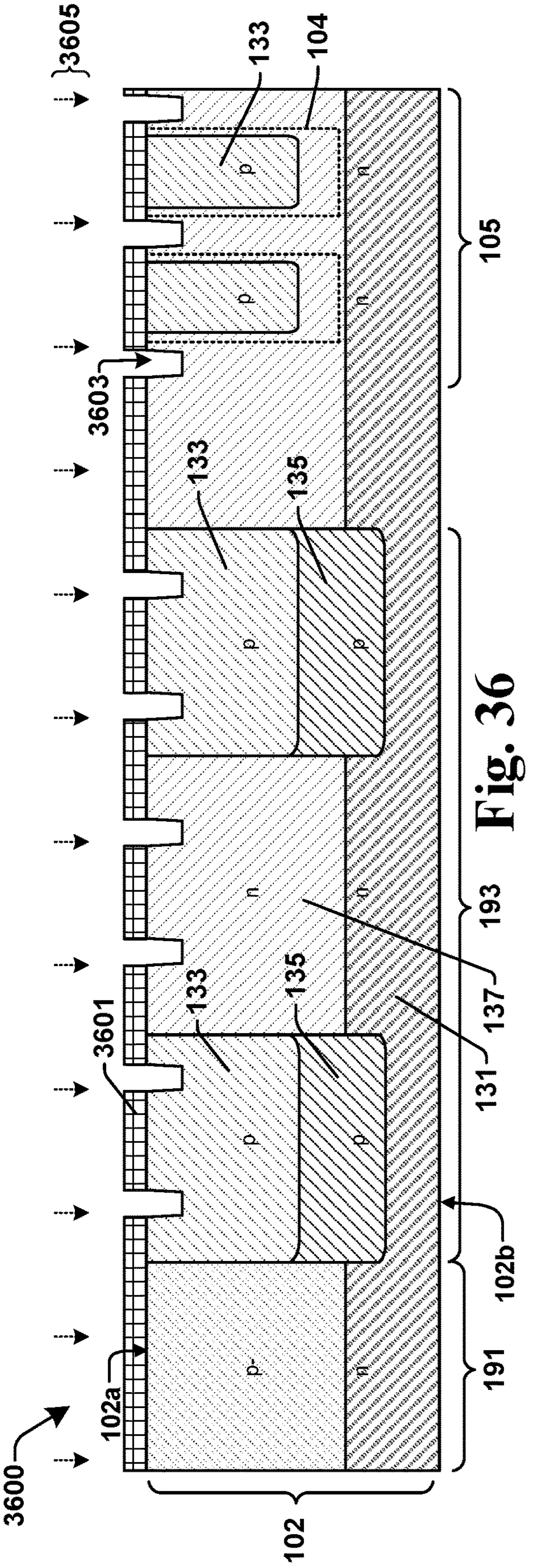
FIGS. 36-39 are a series of cross-sectional views illustrating some embodiments of a method that can be used to form an image sensing IC device such as the image sensing IC device of FIG. 5.

As shown by the cross-sectional view 3600 of FIG. 36, a mask 3601 may be formed over the structure illustrated by the cross-sectional view 1100 of FIG. 11 and an etchant 3605 applied to form trenches 3603 in the front side 102*a*. As shown by the cross-sectional view 3700 of FIG. 37 the gate stack 3701 may then be formed. The gate stack 3701 forms in and around the trenches 3603 and includes a gate dielectric layer 3703 and a gate electrode layer 3705. An additional step may be taken in comparison to the process described in connection with the cross-sectional view 2700 of FIG. 27 to planarize the gate electrode layer 3705.

Figure 38:
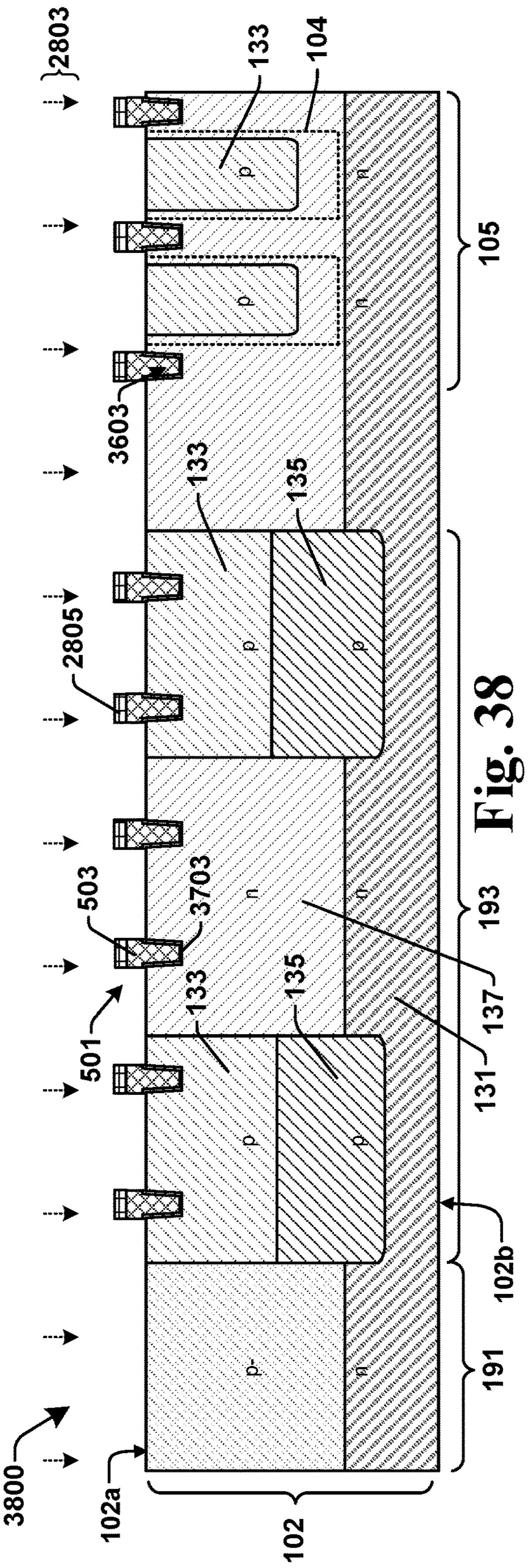

As shown by the cross-sectional view 3800 of FIG. 38, the gate stack 3701 may be patterned to form the gate structures 501. The process may be as described in relation to the cross-sectional view 2800 of FIG. 28. The resulting gate electrodes 503 may include a portion that is buried in the semiconductor substrate 102 and a portion that is above the front side 102*a*.

Processing may then continue as described in connection with the cross-sectional views 2900-3300 of FIGS. 29-33. As shown by the cross-sectional view 3900 of FIG. 39, when the etch process is carried out to form the trenches 112, the etching may stop on the gate dielectric layer 3703. Processing may continue as described in connection with the cross-sectional views 3400-3600 of FIGS. 34-36 and the cross-sectional views 2000 to 2600 of FIGS. 20 to 26 to provide an image sensing IC such as the image sensing IC 100E of FIG. 5.

Figure 40:
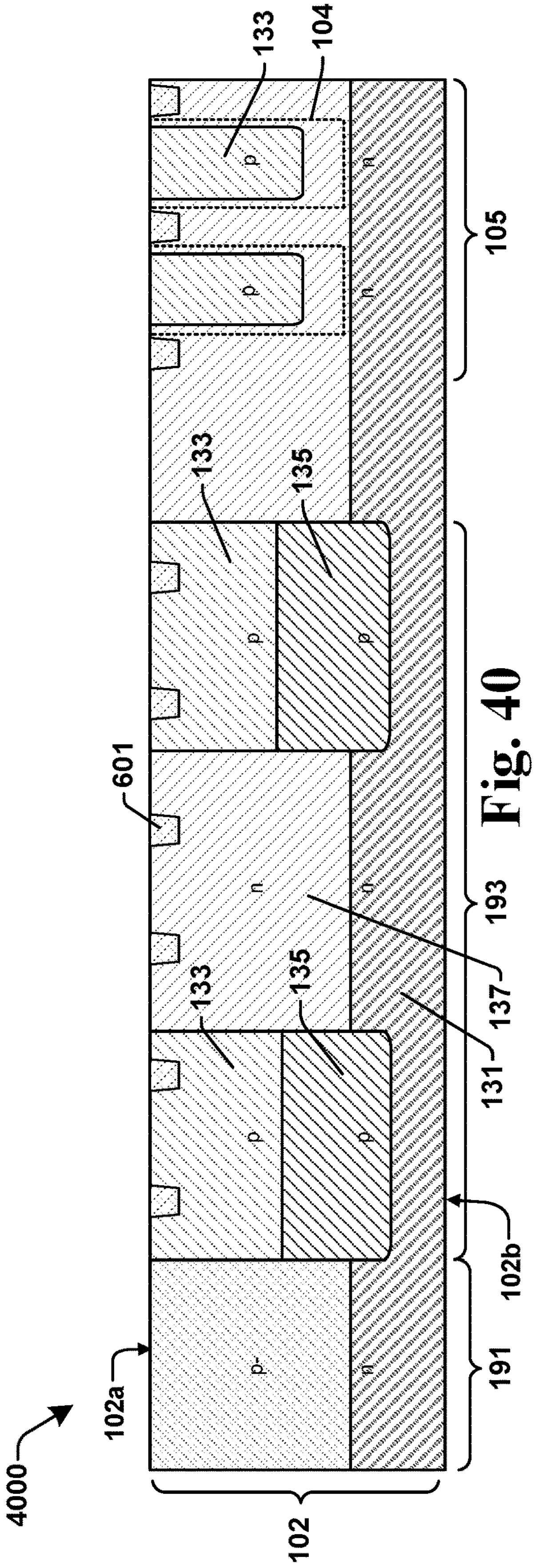
FIGS. 40-42 are a series of cross-sectional views illustrating some embodiments of a method that can be used to form an image sensing IC device such as the image sensing IC device of FIG. 6.
Figure 41:
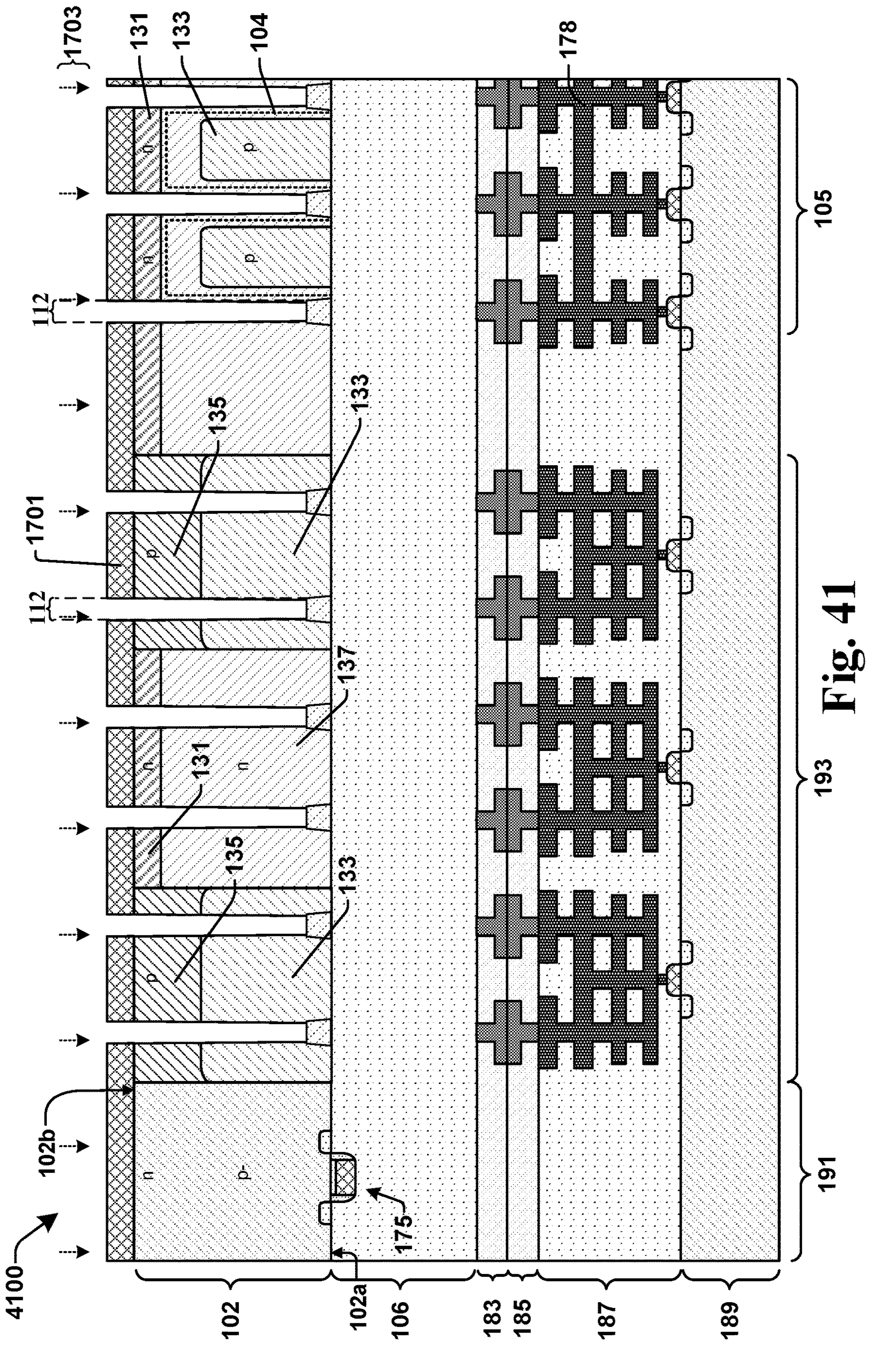
Figure 42:
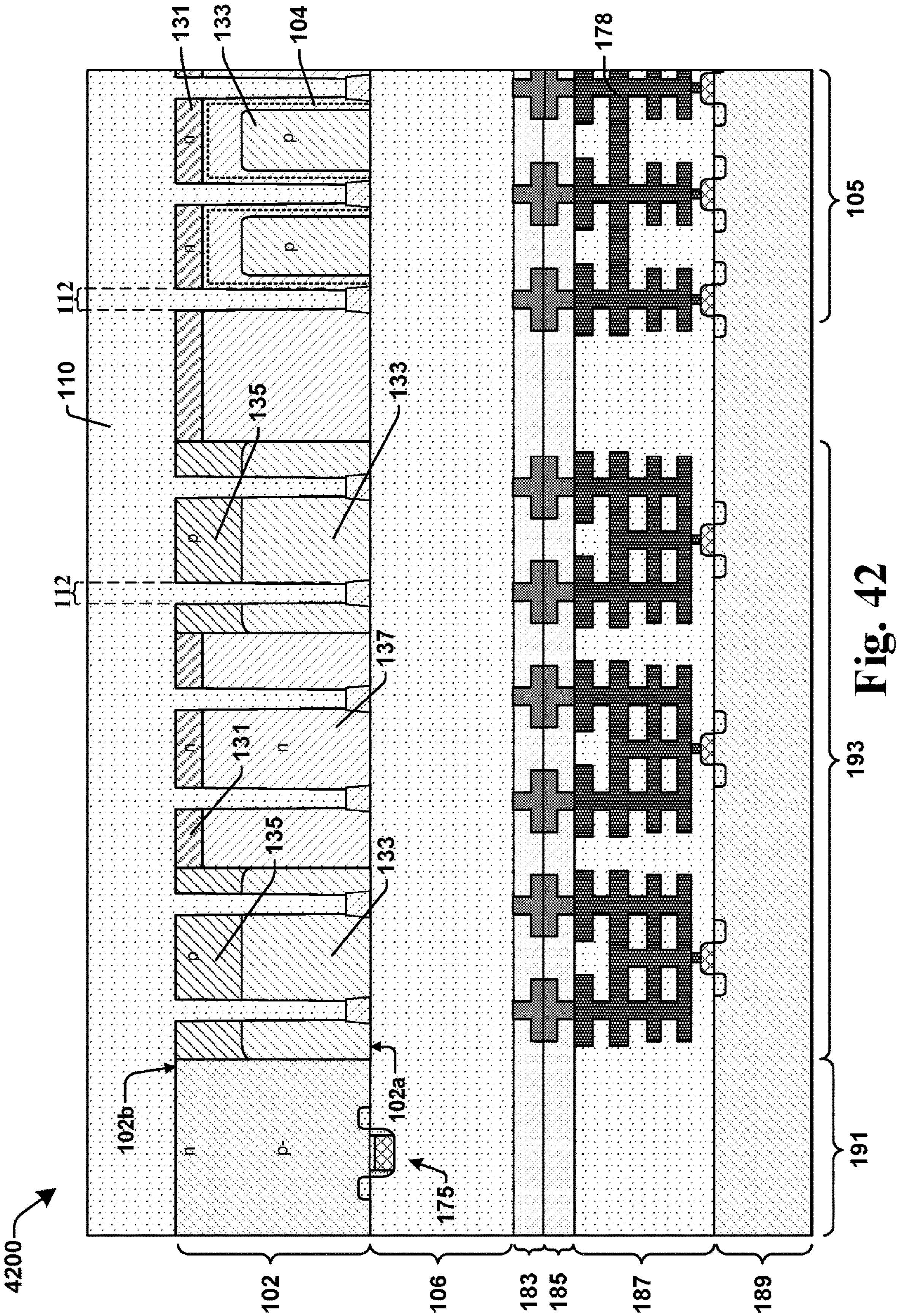

FIGS. 40-42 illustrate a variation of the process described in connection with the cross-sectional views 900-2600 of FIGS. 9-26. This variation may produce an image sensing IC such as the image sensing IC 100F of FIG. 6.

The variation may begin with the structure shown by the cross-sectional view 1100 of FIG. 11. As shown by the cross-sectional view 4000 of FIG. 40, STI structures 601 are formed in the fronts side 102*a*. Forming the STI structures 601 may include etching trenches, depositing dielectric so as to fill the trenches, and planarization to remove excess dielectric. The dielectric may be, for example, an oxide (e.g., silicon oxide), a nitride (e.g., silicon nitride, silicon oxynitride, etc.), and/or the like.

Processing may then continue as described in connection with the cross-sectional views 1200-1700 of FIG. 12-17 except that the interconnects 108 for coupling with the conductive cores 114 (see FIG. 1) are not formed. Other interconnects 108 (not shown) may still be formed. As shown by the cross-sectional view 4100 of FIG. 41, when the etch process is carried out to form the trenches 112, the etch stops on the STI structures 601.

As shown by the cross-sectional view 4200 of FIG. 42, when the deposition process is carried out to form the dielectric structure 110 it is carried out in such a way that the dielectric structure 110 completely fills the trenches 112. Processing may continue as described in connection with the cross-sectional views 2200-2600 of FIGS. 22-26 to provide an image sensing IC such as the image sensing IC 100F of FIG. 6.

Figure 43:
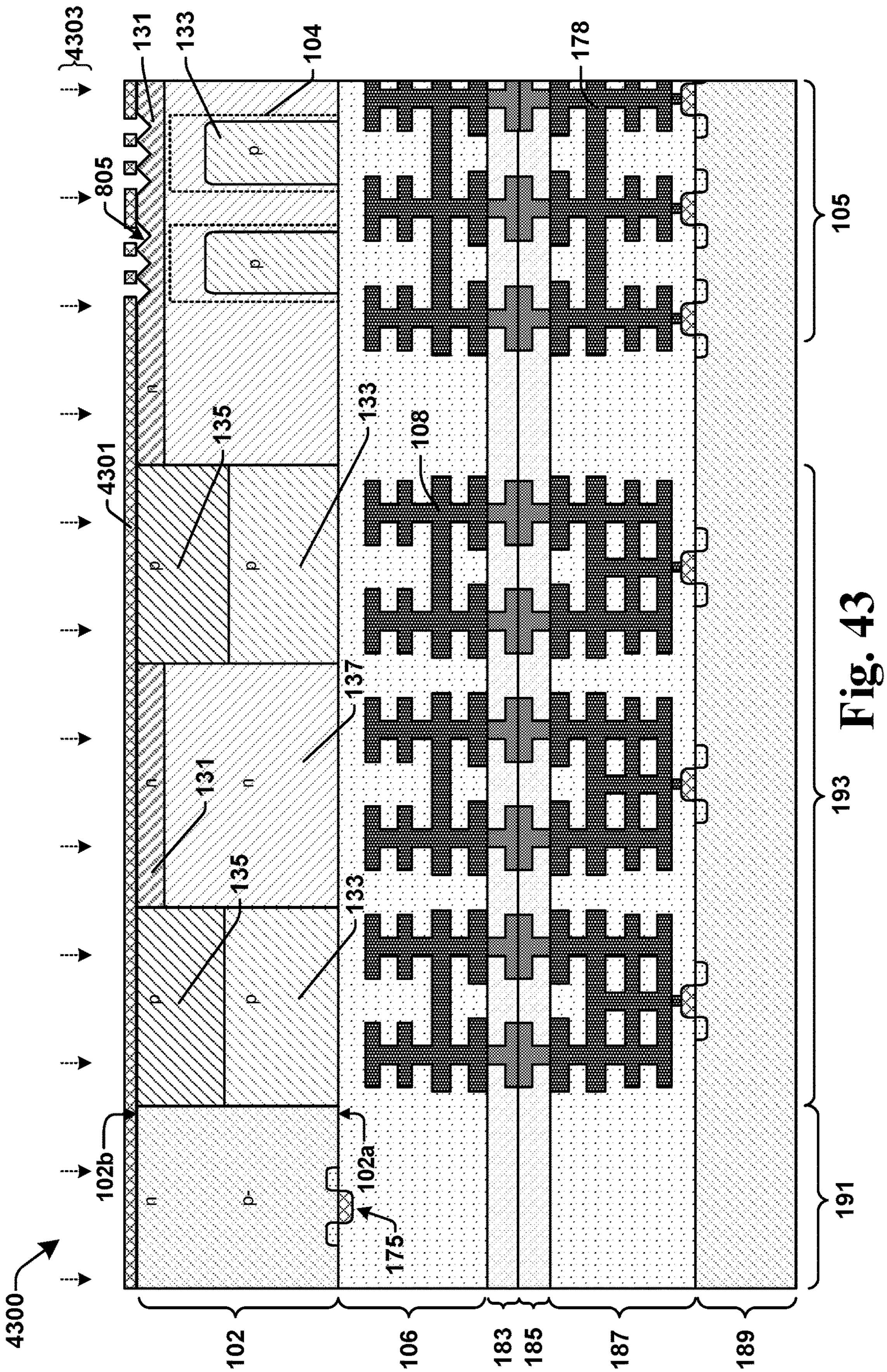
FIGS. 43-45 are a series of cross-sectional views illustrating some embodiments of a method that can be used to form an image sensing IC device such as the image sensing IC device of FIG. 8.
Figure 44:
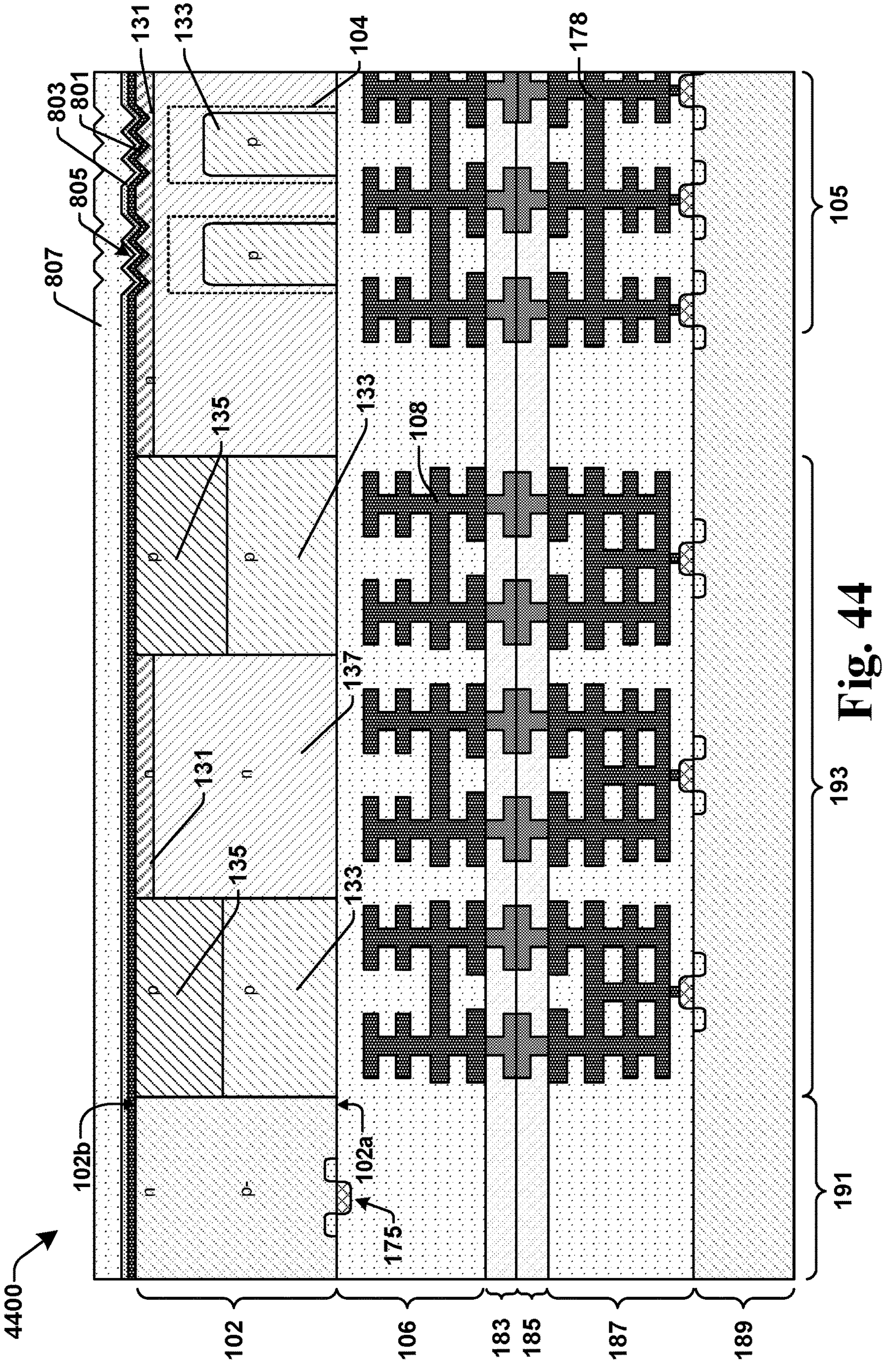
Figure 45:
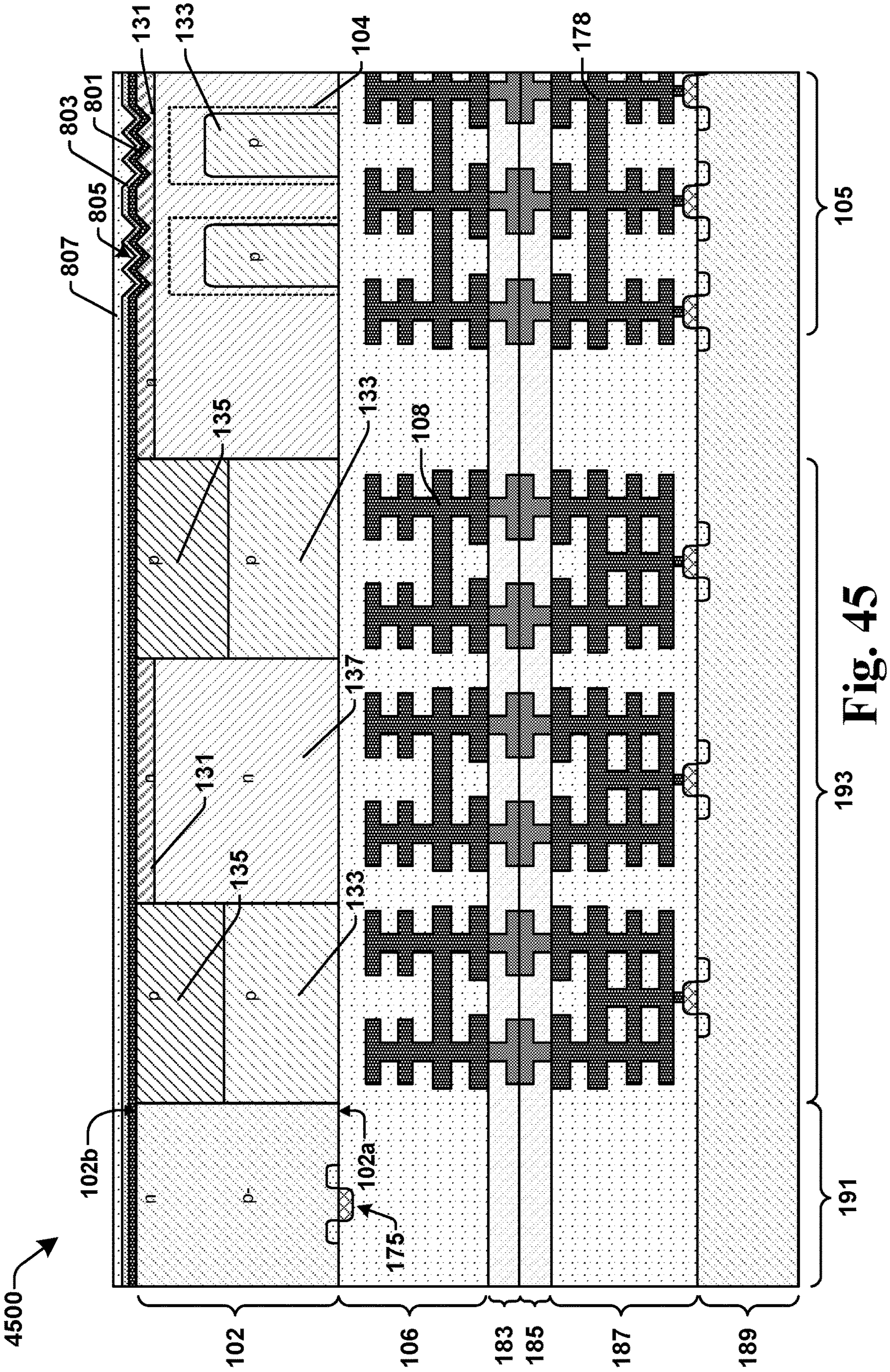

FIGS. 43-45 illustrate a variation of the process described in connection with the cross-sectional views 900-2600 of FIGS. 9-26. This variation may produce an image sensing IC such as the image sensing IC 100H of FIG. 8. The variation may begin with a structure such as the one shown in the cross-sectional view 1600 of FIG. 16. As shown by the cross-sectional view 4300 of FIG. 43, a mask 4301 is formed and used to pattern the back side 102*b* of the semiconductor substrate 102 using one or more etchants 4303. The one or more etchants 4303 remove parts of the semiconductor substrate 102 to form recesses 805. The recesses 805 are formed directly over the light sensing elements 104. In some embodiments, the etch process comprises a dry etch process. The dry etch process may be, for example, a coupled plasma etch process such as an inductively coupled plasma (ICP) etch process or a capacitively coupled plasma (CCP) etch process. In some embodiments, the patterning process comprises a wet etch.

As shown by the cross-sectional view 4400 of FIG. 44, a first absorption enhancement layer 801, a second absorption enhancement layer 803, and a dielectric layer 807 may be formed over the structure shown by the cross-sectional view 4300 of FIG. 43 after removing the mask 4301. These layers may be formed by vapor deposition, the like, or any other suitable processes. The first absorption enhancement layer 801 lines the back side 102*b*. In some embodiments, the first absorption enhancement layer 801 comprises a high-k dielectric layer such as hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), or the like. The second absorption enhancement layer 803 is optional. If included the second absorption enhancement layer 803 may be an oxide (e.g., silicon oxide), a nitride (e.g., silicon nitride, silicon oxynitride, etc.), a carbide (e.g., silicon carbide, silicon oxy-carbide, etc.), or the like. The dielectric layer 807 may fill the plurality of recesses 805. The dielectric layer 807 may be a dielectric such as one of those included in the dielectric structure 110 (see FIG. 8).

As shown by the cross-sectional view 4500 of FIG. 45, a process may be carried out to planarize the dielectric layer 807. The planarization process may include CMP, an etch process, or the like. Processing may continue as described in connection with the cross-sectional views 1700-2600 of FIGS. 17-26 to provide an image sensing IC such as the image sensing IC 100H of FIG. 8.

Figure 46:
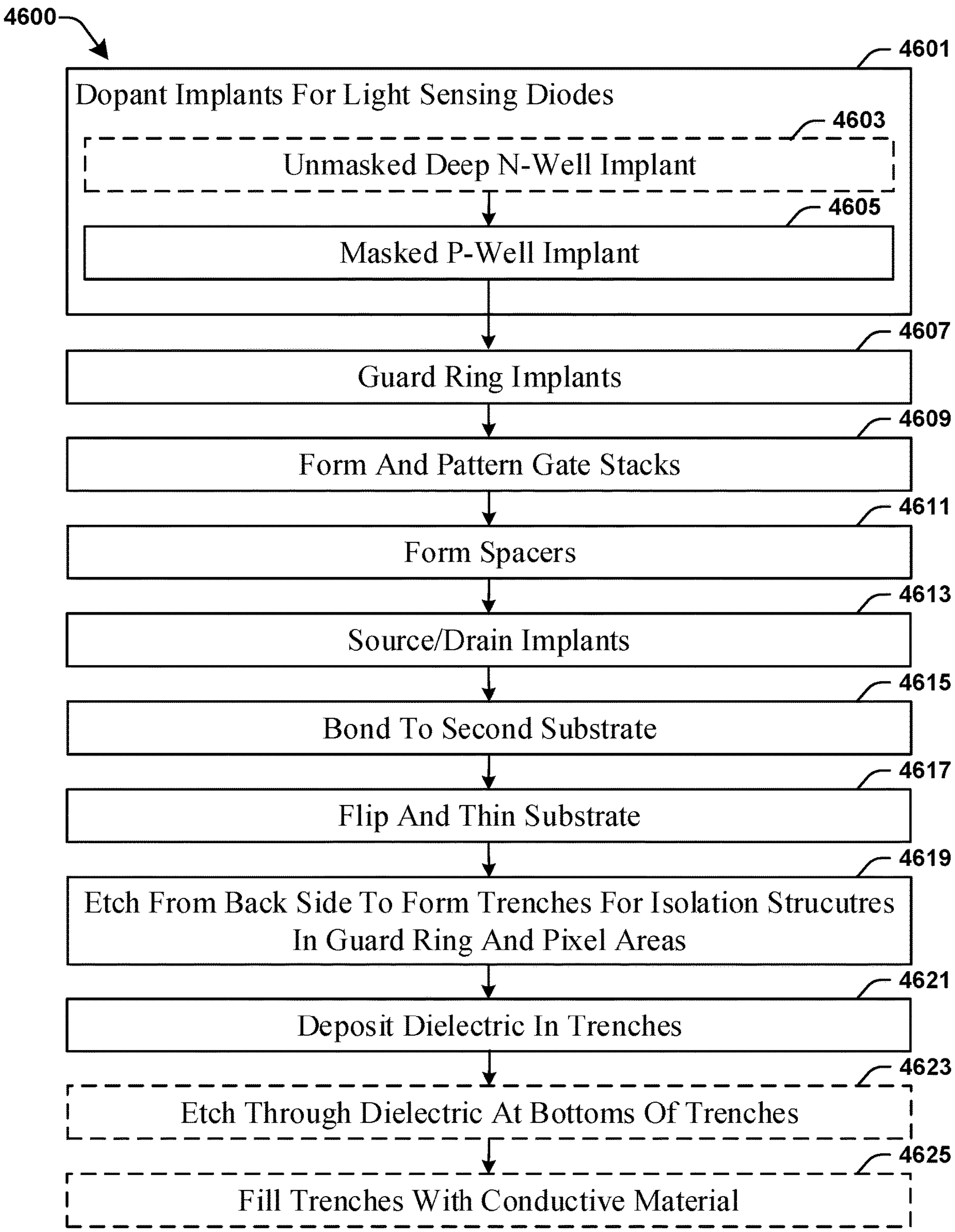
FIG. 46 provides a flow chart illustrating some embodiments of a method of forming an image sensing IC device according to the present disclosure.

FIG. 46 presents a flow chart for a process 4600 that may be used to form an image sending IC according to the present disclosure. While the process 4600 of FIG. 46 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 4600 may begin with act 4601, doping that forms light sensing PN diodes. The cross-sectional views 900-1100 of FIGS. 9-11 provide an example. In some embodiments, this includes act 4603, which is a blanket deep well implant of the type illustrated by the cross-sectional view 900 of FIG. 9. Act 4601 includes act 4605, a masked P-well implant. In some embodiments, the masked P-well implant forms the P-well in parts of a guard ring area as well as in the pixel region. The cross-sectional view 1100 of FIG. 11 provides an example. It will be appreciated that act 4601 may include dopant implantations in addition to the ones that are recited.

Act 4607 is implanting dopants to form a PNP or NPN guard ring structure. The cross-sectional views 900-1100 of FIGS. 9-11 provide an example of this process as well. As shown by these figures, the processes of act 4601 and the process of act 4607 may overlap so as to reduce the number of processing steps. It will be appreciated that dopant types and voltage polarities may be reversed to provide examples in addition to the examples that are illustrated.

Figure 37:
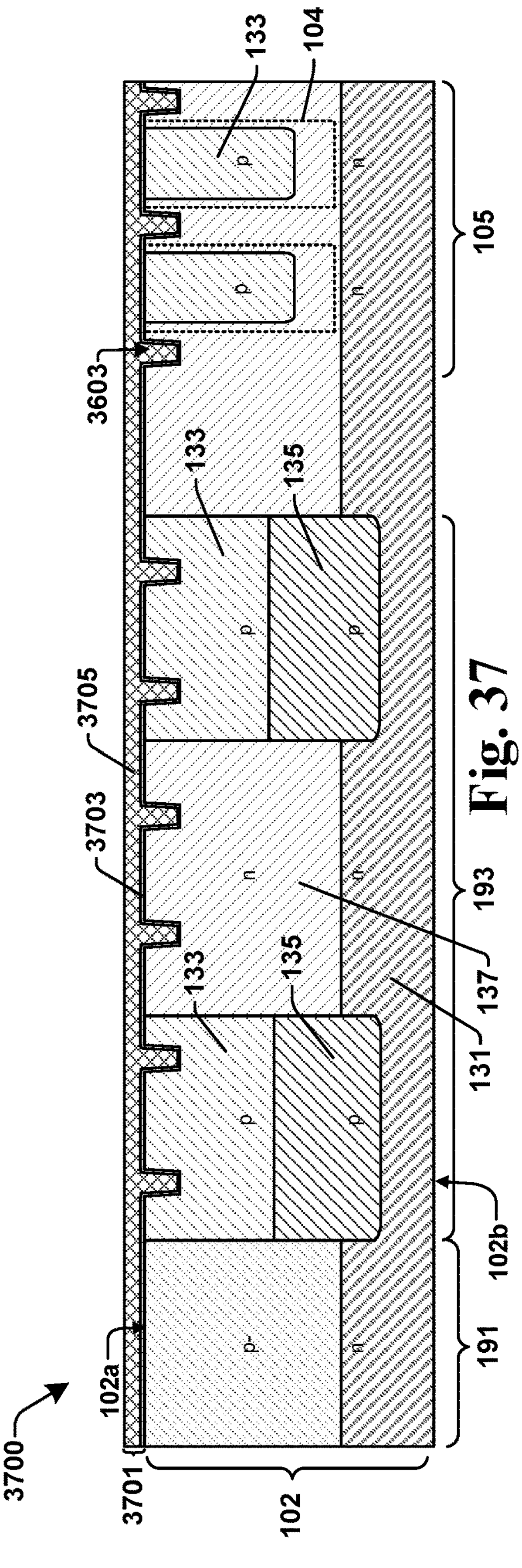

Act 4609 is forming and patterning gate stacks. The cross-sectional views 2700 and 2800 of FIGS. 27 and 28 provide one example. The cross-sectional views 3600 to 3800 of FIGS. 36-38 provide another example.

Act 4611 is forming spacers around the gate structures. The cross-sectional view 3000 of FIG. 30 provides an example. Act 4613 is doping to form source/drain regions aligned to the spacers. Gate structures for connecting directly with the conductive cores of back side deep trench isolation structures may be masked during this implant process. The cross-sectional view 3100 of FIG. 31 provides an example.

Act 4615 is bonding the semiconductor substrate to a carrier or handle substrate. The cross-sectional views 1400-1500 of FIGS. 14-15 provide an example. Act 4617 is flipping and thinning the semiconductor substrate. The cross-sectional view 1600 of FIG. 16 provides an example.

Figure 39:
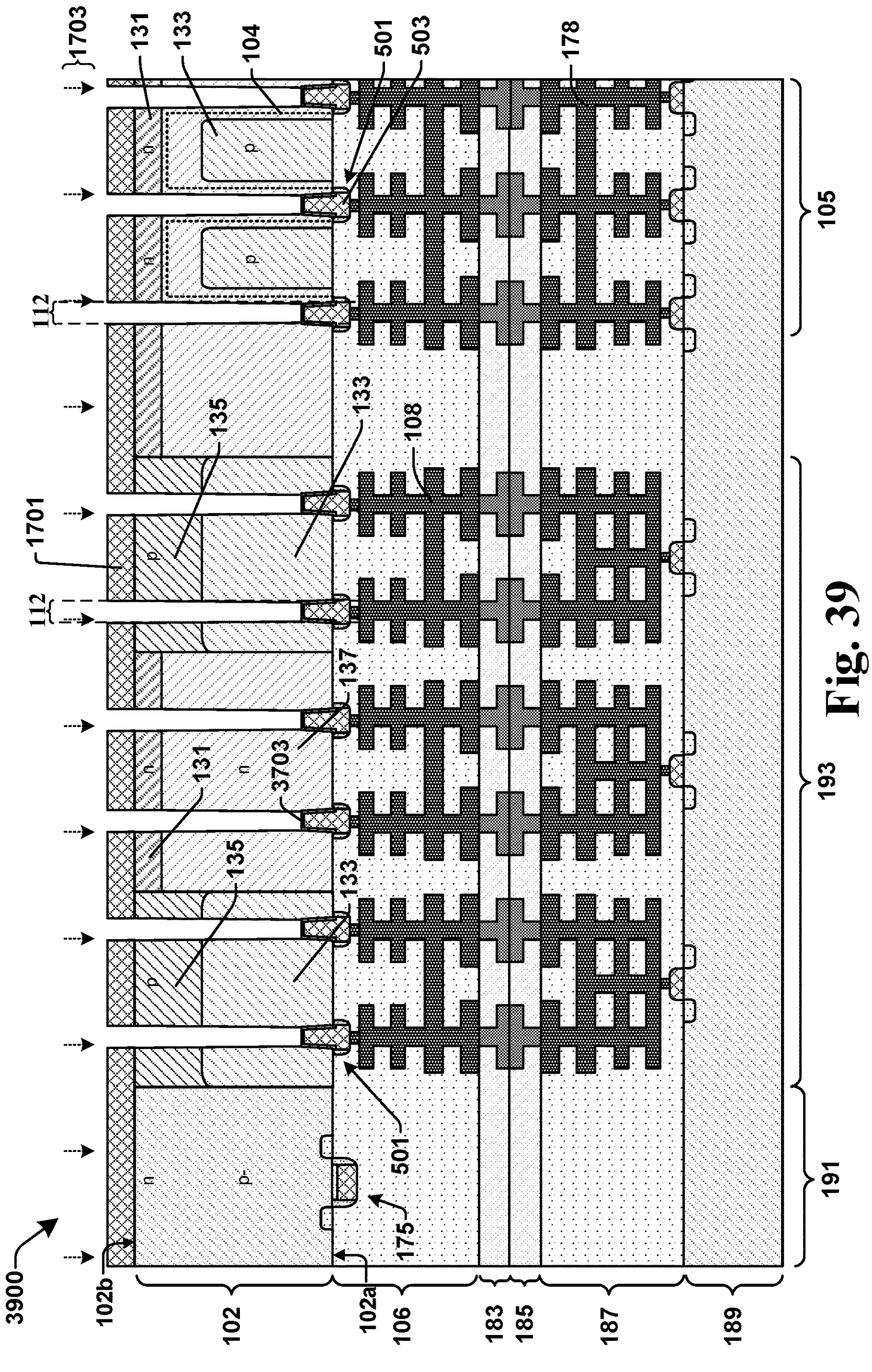

Act 4619 is etching to form trenches for back side deep trench isolation structures in the pixel region and the guard ring area. The cross-sectional view 1700 of FIG. 17 provides an example where these trenches stop on a metal structure in a front side interlevel dielectric. The metal structure may be, for example, a first (M1) metallization layer wire. The cross-sectional view 3300 of FIG. 33 and the cross-sectional view 3900 of FIG. 39 provide examples where the trenches stop of gate oxide layers. The cross-sectional view 4200 of FIG. 42 provides an example where the trenches stop on front side STI structures. The trenches may also stop within the semiconductor substrate so as to provide only partial isolation.

Act 4621 is depositing dielectric in the trenches. The cross-sectional view 1800 of FIG. 18 and the cross-sectional view 3400 of FIG. 34 provide examples where the dielectric lines the trenches. The cross-sectional view 4200 of FIG. 42 provides an example where the dielectric fills the trenches.

Figure 35:
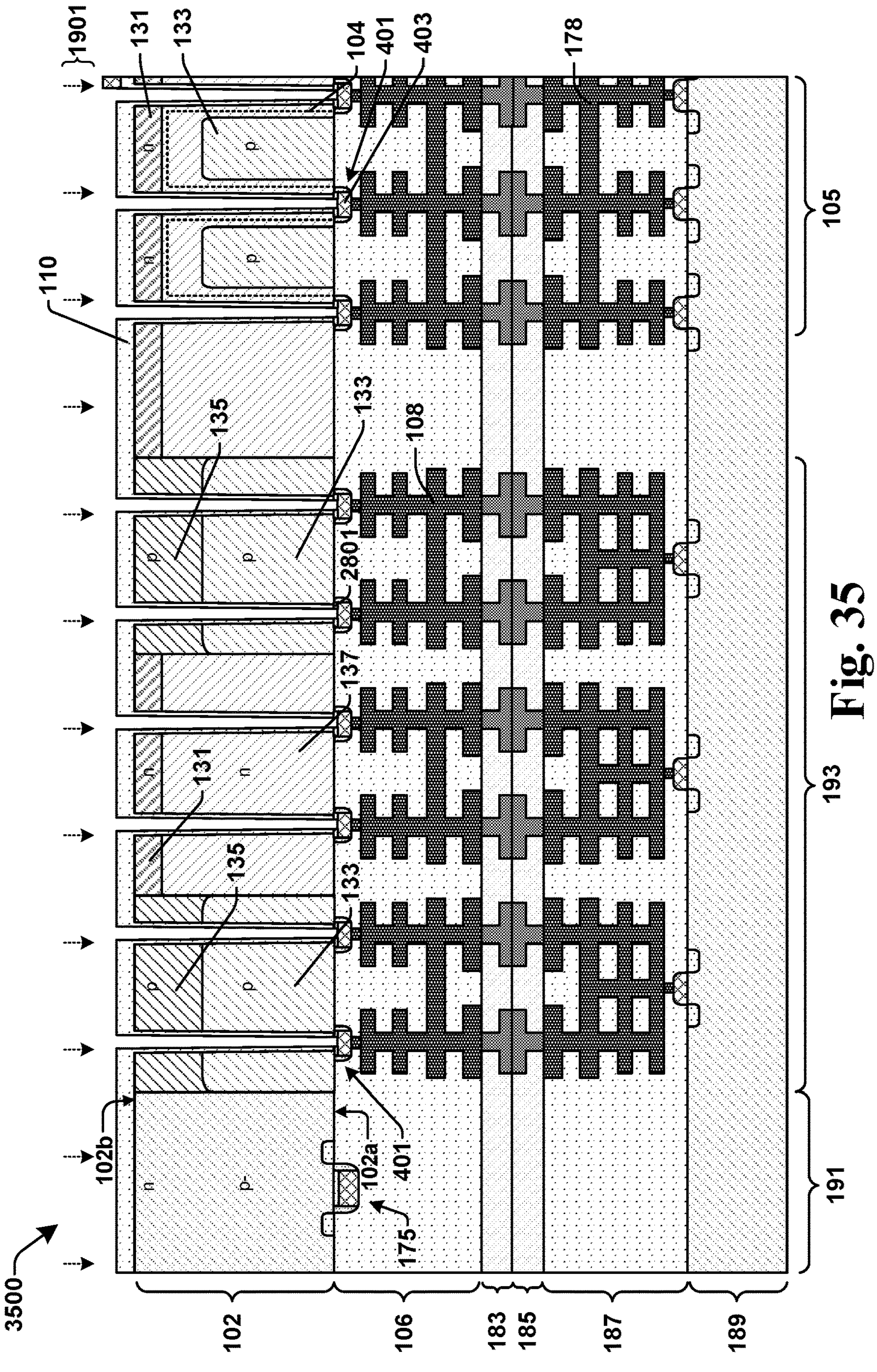

Acts 4623 and 4625 are optional steps used for back side deep trench isolation structures with conductive cores. Act 4623 is etching to break through any dielectric at the bottoms of the trenches. The cross-sectional view 1900 of FIG. 19 and the cross-sectional view 3500 of FIG. 35 provide examples. Act 4625 is filling the trenches with conductive material. The cross-sectional view 2000-2100 of FIGS. 20-21 provide an example.

Some aspects of the present disclosure relate to an image sensing integrated circuit device that include a substrate having a pixel region, a peripheral region, and a guard ring area. The guard ring area is between the pixel region and the peripheral region. Light sensing elements form an array in the pixel region. A first back side deep trench isolation structure extends between the light sensing elements. A second back side deep trench isolation structure is in the guard ring area. The second back side deep trench isolation structure is separate from the first back side deep trench isolation structure.

Some aspects of the present disclosure relate to an image sensing integrated circuit device that include a substrate having a pixel region, a peripheral region, and a guard ring area. The guard ring area is between the pixel region and the peripheral region. A light sensing element is arranged in the pixel region. First sidewalls of the substrate form one or more first trenches extending from the back side to within the substrate on opposing sides of the light sensing element. Second sidewalls of the substrate form one or more second trenches extending from the back side to within the substrate in the guard ring area. The one or more second trenches laterally separate the pixel region from the peripheral region.

Some aspects of the present disclosure relate to a method that includes forming a light sensing element in a pixel region of a substrate, forming a transistor in a peripheral region of the substrate, forming one or more interconnects within an ILD structure on a front side the substrate, and forming trenches in the back side of the substrate. The trenches include first trenches in the pixel region and second trenches in a guard ring area arranged between the pixel region and the peripheral region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a light sensing element in a pixel region of a substrate;

forming a transistor in a peripheral region of the substrate;

forming one or more interconnects within an ILD structure along a first side of the substrate;

thinning the substrate from a second side, wherein the second side is opposite the first side;

forming trenches in the second side of the substrate, wherein the trenches comprise first trenches in the pixel region and second trenches in a guard ring area disposed between the pixel region and the peripheral region; and forming dielectric liners and conductive cores in the first trenches and in the second trenches, wherein a conductive core of one of the second trenches is electrically coupled to one of the interconnects.

2. The method of claim 1, wherein the second trenches comprise second trenches that form a first loop around the pixel region and second trenches that form a second loop around the first loop.

3. The method of claim 1, wherein forming the light sensing element in the pixel region of the substrate comprises a blanket dopant implantation process that forms a deep N-well across the substrate, and thinning the substrate brings the second side to the deep N-well.

4. The method of claim 1, further comprising forming a PNP guard ring structure in the guard ring area, wherein the PNP guard ring structure comprises an inner ring with P-type doping, a middle ring with N-type doping, and an outer ring with P-type doping.

5. The method of claim 4, wherein:

the second trenches comprise a plurality of second trenches in the inner ring each of which divides the pixel region from the peripheral region.

6. A method, comprising:

providing a semiconductor substrate having a first region, a second region, and a guard ring region, wherein the guard ring region is an area of the semiconductor substrate between the first region and the second region;

doping from a first side of the semiconductor substrate to form a deep n-well, wherein the deep n-well forms in the first region, the guard ring region, and the second region;

masking and doping to form an array of photodiodes, wherein the array of photodiodes is in the first region;

thinning the semiconductor substrate from a second side, wherein the second side is opposite the first side, and thinning brings the second side to the deep n-well;

masking and etching to simultaneously form trenches that extend through the deep n-well, wherein the trenches include first trenches which extend between the photodiodes, and one or more second trenches which are in the guard ring region;

lining the trenches with dielectric; and filling the trenches with conductive material so as to provide them with conductive cores, wherein the second trenches comprise a first guard ring trench the conductive core of which is coupled to a first terminal.

7. The method of claim 6, wherein the guard ring region comprises an n-well or a p-well that encircles the first region, and the one or more second trenches encircle the n-well or p-well that encircles the first region.

8. The method of claim 6, wherein the guard ring region comprises a p-well that encircles the first region and the one or more second trenches comprise a guard ring trench that is within the p-well.

9. The method of claim 8, wherein forming the p-well comprises:

forming a first mask;

doping through the first mask to form a shallow p-well in the guard ring region and additional p-wells in the first region;

forming a second mask that covers the first region; and doping through the second mask to form a deep p-well in the guard ring region.

10. The method of claim 6, further comprising forming a metal interconnect structure on the first side, wherein the conductive core of the first guard ring trench is electrically coupled to the first terminal through an interconnect within the metal interconnect structure.

11. The method of claim 10, wherein the metal interconnect structure comprises wires in metallization layers interconnected by vias in via layers that are interleaved with the metallization layers, and the guard ring trench extends past the first side to one of the wires in one of the metallization layers so that the conductive core is formed in contact with the wire.

12. The method of claim 6, wherein the guard ring region comprises a PNP guard ring structure that provides electrical isolation between the first region and the second region, and the one or more second trenches extend into the PNP guard ring structure.

13. A method, comprising:

providing a semiconductor substrate having a first region, a second region, and a guard ring region, wherein the guard ring region is an area of the semiconductor substrate between the first region and the second region;

masking and doping from a first side of the semiconductor substrate to form an array of photodiodes, wherein the array of photodiodes is in the first region;

masking and doping to form a PNP guard ring structure in the guard ring region;

forming a metal interconnect structure on the first side;

thinning the semiconductor substrate from a second side, wherein the second side is opposite the first side;

masking and etching to form trenches that extend most or all of the way through the semiconductor substrate, wherein the trenches include first trenches which extend between the photodiodes, and one or more second trenches which are in the guard ring region and extend into the PNP guard ring structure; and forming dielectric liners and conductive cores in the first trenches and in the second trenches, wherein a conductive core of one of the second trenches is electrically coupled to an interconnect within the metal interconnect structure.

14. The method of claim 13, wherein the PNP guard ring structure comprises a first p-doped zone, an n-doped zone, and a second p-doped zone, and the one or more second trenches comprise a first guard ring trench disposed in the first p-doped zone, a second guard ring trench disposed in the n-doped zone, and a third guard ring trench disposed in the second p-doped zone.

15. The method of claim 14, wherein the first p-doped zone, an n-doped zone, and a second p-doped zone are concentric rings around the first region.

16. The method of claim 14, wherein the metal interconnect structure comprises a first metal interconnect and a second metal interconnect which are electrically isolated from one another; and the conductive cores of the first guard ring trench and the second guard ring trench are respectively coupled to the first and second metal interconnects.

17. The method of claim 14, further comprising coupling the conductive cores of the first and second guard ring trenches respectively to first and second voltage sources, which are distinct.

18. The method of claim 13, wherein the PNP guard ring structure comprises a first p-doped zone, an n-doped zone, and a second p-doped zone, and the one or more second trenches comprise a plurality of concentric first guard ring trenches disposed in the first p-doped zone, a plurality of concentric second guard ring trenches disposed in the n-doped zone, and a plurality of concentric third guard ring trenches disposed in the second p-doped zone.

19. The method of claim 1, wherein the interconnects comprise a first metal interconnect and a second metal interconnect which are electrically isolated from one another; and the conductive cores of the second trenches comprise first and second conductive cores that are electrically coupled respectively to the first and second metal interconnects.

20. The method of claim 6, wherein the second trenches further comprise a second guard ring trench the conductive core of which is coupled to a second terminal, wherein the first and second terminals are distinct.

* * * * *